United States Patent
Omran et al.

(10) Patent No.: US 10,819,359 B2
(45) Date of Patent: Oct. 27, 2020

(54) INVERTER-BASED SUCCESSIVE APPROXIMATION CAPACITANCE-TO-DIGITAL CONVERTER

(71) Applicant: KING ABDULLAH UNIVERSITY OF SCIENCE AND TECHNOLOGY, Thuwal (SA)

(72) Inventors: Hesham Omran, Thuwal (SA); Abdulaziz Alhoshany, Thuwal (SA); Khaled Salama, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 222 days.

(21) Appl. No.: 15/760,456

(22) PCT Filed: Sep. 19, 2016

(86) PCT No.: PCT/IB2016/055590
§ 371 (c)(1),
(2) Date: Mar. 15, 2018

(87) PCT Pub. No.: WO2017/046782
PCT Pub. Date: Mar. 23, 2017

(65) Prior Publication Data
US 2018/0254779 A1 Sep. 6, 2018

Related U.S. Application Data

(60) Provisional application No. 62/219,844, filed on Sep. 17, 2015.

(51) Int. Cl.
*H03M 1/00* (2006.01)
*G01D 5/24* (2006.01)
(Continued)

(52) U.S. Cl.
CPC .............. *H03M 1/002* (2013.01); *G01D 5/24* (2013.01); *H03M 1/1009* (2013.01); *H03M 1/38* (2013.01);
(Continued)

(58) Field of Classification Search
CPC .... H03M 1/002; H03M 1/1009; H03M 1/466; H03M 1/38; H03M 1/403; H03M 1/42; G01D 5/24; G01B 27/2605
See application file for complete search history.

(56) References Cited

PUBLICATIONS

Ghaed, M., et al.; "Circuits for a Cubic-Millimeter Energy-Autonomous Wireless Intraocular Pressure Monitor"; transactions on Circuits and Systems I: Regular Papers, IEEE , vol. 60, No. 12; Dec. 2013; pp. 3152-3162.
(Continued)

*Primary Examiner* — Amy He
(74) *Attorney, Agent, or Firm* — Patent Portfolio Builders PLLC

(57) ABSTRACT

An energy-efficient capacitance-to-digital converter (CDC) is provided that utilizes a capacitance-domain successive approximation (SAR) technique. Unlike SAR analog-to-digital converters (ADCs), analysis shows that for SAR CDCs, the comparator offset voltage will result in signal-dependent and parasitic-dependent conversion errors, which necessitates an op-amp-based implementation. The inverter-based SAR CDC contemplated herein provides robust, energy-efficient, and fast operation. The inverter-based SAR CDC may include a hybrid coarse-fine programmable capacitor array. The design of example embodiments is insensitive to analog references, and thus achieves very low temperature sensitivity without the need for calibration. Moreover, this design achieves improved energy efficiency.

20 Claims, 57 Drawing Sheets

(51) Int. Cl.
*H03M 1/10* (2006.01)
*H03M 1/38* (2006.01)
*H03M 1/42* (2006.01)
*G01R 27/26* (2006.01)
*H03M 1/46* (2006.01)

(52) U.S. Cl.
CPC .......... *H03M 1/42* (2013.01); *G01R 27/2605* (2013.01); *H03M 1/466* (2013.01)

(56) References Cited

PUBLICATIONS

International Search Report and Written Opinion for Application No. PCT/IB2016/055590 dated Dec. 15, 2016.
Jung, W, et al.: "A 0.7pF-to-10nF Fully Digital Capacitance-to-Digital Converter Using Iterative Delay-Chain Discharge"; Solid-State Circuits Conference (ISSCC), 2015 IEEE International; Feb. 2015; pp. 1-3.
Oh, S. et al., "15Ab Incremental Sigma-Delta Capacitance-to-Digital Converter With Zoom-In 9b Asynchronous SAR"; 2014 Symposium on VLSI Circuits Digest of Technical Papers; Jun. 2014; 2 pages.
Omran, H., et al.; "7.9 pJ/Step Energy-Efficient Multi-Slope 13-bit Capacitance-to-Digital Converter"; IEEE Transactions on Circuits and Systems II: Express Briefs, vol. 61, No. 8; Aug. 2014; pp. 589-593.
Omran, H., et al.; A Robust Parasitic-Insensitive Successive Approximation Capacitance-To-Digital Converter, Proceedings of the Custom Integrated Circuits Conference, IEEE; Sep. 15, 2014; 4 pages.
Omran, H., et al.; "An Integrated Energy-Efficient Capacitive Sensor Digital Interface Circuit, Sensors and Actuators A"; Physical, vol. 216; Sep. 1, 2014; pp. 43-51.
Tan, Z., et al.: "A 1.2-V 8.3-nJ CMOS Humidity Sensor for RFID Applications"; IEEE Journal of Solid-State Circuits, vol. 48, No. 10; Oct. 2013; pp. 2469-2477.
Tanaka, K., et al.; "A 0.026mm2 Capacitance-To-Digital Converter for Biotelemetry Applications Using a charge Redistribution Technique"; 2007 IEEE Asian Solid-State Circuits Conference;Nov. 1, 2007; pp. 244-247.
IEEE; "A 31 fJ/Step 12—bit Inverter-Based SAR Capacitance-to-Digital Converter"; IEEE Journal of Solid State aircuits; 29 pages.
Communication pursuant to Article 94(3) EPC in corresponding/related EP Application No. 16770371.9, dated Feb. 20, 2020 (Documents D1-D5 were cited in the IDS filed Jun. 21, 2018).
Jiang, H. et al., "A Combined Low Power SAR Capacitance-to-Digital Analog-to-Digital Converter for Multisensory System," Analog Integrated Circuits and Signal Processing, Feb. 28, 2013, vol. 75, No. 2, pp. 311-322, Springer New York LLC, US.

INVERTER-BASED SUCCESSIVE APPROXIMATION CAPACITANCE-TO-DIGITAL CONVERTER

CROSS-REFERENCE TO RELATED APPLICATIONS

The present application is a national phase entry of International Application No. PCT/IB2016/055590, filed Sep. 19, 2016, which claims priority to U.S. Provisional Patent Application No. 62/219,844, filed Sep. 17, 2015. Both of these applications are incorporated herein by reference in their entireties.

TECHNOLOGICAL FIELD

Example embodiments of the present invention relate generally to capacitance-sensing readout circuits and, more particularly, to inverter-based successive approximation register capacitance-to-digital converters.

BACKGROUND

Energy efficiency is a key requirement for wireless sensor nodes and implantable biomedical sensors. The process of battery replacement can be cost and time intensive or require an invasive medical procedure. Therefore, it is desirable for the sensor node energy consumption to be minimized to avoid battery replacement through the targeted lifetime of the device, or preferably to enable the device to survive on harvested energy. Capacitive sensors do not consume DC current; thus, they can be an attractive option from an energy efficiency perspective for the aforementioned applications. In addition, capacitive sensors can be employed in a wide range of sensing applications, such as pressure sensing, displacement sensing, flow sensing, tactile sensing, biological sensing, humidity sensing, and chemical sensing of volatile organic compounds (VOCs), which can be used as biomarkers for lung cancer detection. However, in order to maintain the energy efficiency of the system, an energy efficient capacitance-to-digital converter (CDC) is required to convert the sensor capacitance to a digital output that can be stored in a memory or sent over a digital wireless link.

Typically, the wireless transceiver is the most power-hungry block in a sensor node. Thus, it may be thought that it is the main source of energy consumption as well. However, the wireless transceiver is only operated for brief and intermittent periods of time to transmit aggregate data or receive commands. On the other hand, the sensor element and its readout circuit are more frequently operated for longer periods of time to acquire and digitize measurements. Thus, although the peak power consumption of the transceiver is higher, the average power consumption, and consequently the energy consumption, of the sensor readout circuit can be significantly larger. For instance, an implantable intraocular pressure monitoring system for glaucoma patients is described in M. Ghaed et al., "Circuits for a Cubic-Millimeter Energy-Autonomous Wireless Intraocular Pressure Monitor," Circuits and Systems I: Regular Papers, IEEE Transactions on, vol. 60, no. 12, pp. 3152-3162, December 2013, where the capacitive pressure sensor readout circuit (i.e., the capacitance-to-digital converter (CDC)) consumes 93% of the active energy consumption. As this example illustrates, optimizing the CDC energy efficiency is crucial to optimize the energy consumption of capacitive sensor nodes.

Conventionally, a CDC is implemented by converting the sensor capacitance to an analog voltage and then digitizing the voltage using an analog-to-digital converter (ADC). However, this process requires buffering and signal conditioning stages, which add to the power consumption and complexity of the readout circuit. On the other hand, recent implementations favor direct digitization of the sensor capacitance, where the sensor is integrated in the ADC architecture to perform direct capacitance-to-digital conversion. This direct CDC will typically result in less complexity, smaller area, lower power consumption, and better energy efficiency. As one semi-digital CDC approach, the capacitance may be converted to a time-domain parameter of a digital signal (e.g., using period modulation). However, the time-modulated signal needs to be digitized using a time-to-digital converter (e.g., a fast digital counter and high frequency stable reference clock), which results in increased power consumption. Another approach is to use CDCs, which can provide fine absolute resolution. However, CDCs suffer from limited capacitance range and use power-hungry operational amplifiers (op-amps) running at a relatively fast oversampling clock, which degrades the energy efficiency of the interface.

ADCs that employ the successive approximation register (SAR) technique are well known for having excellent energy efficiency. In addition, the SAR architecture is well-suited to bursty operation, where the sensor node wakes up to perform and send a measurement for a limited time and returns back to sleep mode. However, a simple SAR CDC that connects the sensor capacitance to the SAR ADC capacitive array, as shown in FIG. 1, suffers from several limitations due to the large capacitance connected to node $V_X$. Simply connecting a capacitive sensor to a capacitive digital-to-analog converter (DAC) of a conventional SAR ADC in this manner results in a small voltage swing at node $V_X$ that is sensitive to the comparator offset voltage, resulting in conversion errors, parasitic dependency, and poor resolution.

In order to address these limitations, an op-amp-based SAR CDC architecture was proposed by H. Omran et al. in "A robust parasitic-insensitive successive approximation capacitance-to-digital converter," in Custom Integrated Circuits Conference (CICC), 2014 IEEE Proceedings of the, September 2014. As shown in FIG. 5, in this architecture a charge amplifier stage is used to guarantee that the node $V_X$ is a low impedance virtual ground node, thus, $C_P$ does not affect circuit operation. The voltage difference that needs to be resolved by the comparator is larger, thus it will not be sensitive to the comparator offset voltage. However, this architecture addresses the comparator offset voltage sensitivity by using a traditional operational amplifier, which degrades the energy efficiency of the readout circuit.

BRIEF SUMMARY

Accordingly, a need exists for a CDC that avoids signal-dependent conversion errors, parasitic dependency, and poor resolution while still reducing and, in some instances, minimizing energy consumption. As described in greater detail below, example embodiments contemplated herein demonstrate an energy-efficient CDC that fully relies on the SAR technique while providing both robust operation and improved energy efficiency. In this regard, such example embodiments employ an inverter-based amplifier to overcome offset-induced errors and parasitic dependency with a reduced impact on power consumption. In some embodiments, the CDC is implemented in a 0.18 m CMOS technology and achieves an energy efficiency figure-of-merit (FoM) of 31f J/Step, which comprises the best energy efficiency FoM currently known. As described below, the CDC operations contemplated herein are insensitive to analog references and temperature (in some embodiments resulting in a very low temperature sensitivity of 2.3 ppm/° C. without the need for calibration). In some embodiments, a coarse-fine capacitive digital-to-analog converter (Cap-DAC) is employed to achieve an 11.7—bit effective resolution, while the whole design of such embodiments may occupy a silicon area of only 0.055 mm$^2$.

In a first example embodiment, an apparatus is provided for capacitance-to-digital conversion. The apparatus includes one or more sensor capacitors configured to produce an input capacitance, and one or more CapDACs configured to produce a reference capacitance. The apparatus further includes one or more inverter-based circuits connected to the sensor capacitor and the CapDAC and configured to amplify a difference or a comparison between the input capacitance and the reference capacitance or a scaled or shifted version of the input capacitance and the reference capacitance, and successive approximation register (SAR) logic circuitry configured to, with the CapDAC and the one or more inverter-based circuits, produce a digital signal representative of the input capacitance.

In some embodiments, the apparatus further includes a latch comparator configured to receive an amplified signal from the one or more inverter-based circuits and output a strengthened signal to the SAR logic circuitry.

In some embodiments, at least one of the one or more inverter-based circuits comprises a simple inverter, a current-starved inverter, a cascode inverter, or a fully differential cascode inverter.

In some embodiments, at least one of the one or more inverter-based circuits comprises a single ended input single ended output circuit, a differential input single ended output circuit, or a differential input differential output circuit. In this regard, in some embodiments, the one or more inverter-based circuits comprise a fully differential configuration that is insensitive to common mode noise and common mode errors.

In some embodiments, at least one of the one or more inverter-based circuits is selectively enabled to provide constant energy consumption and energy efficiency independent of the sample rate. Moreover, in some embodiments, auto-calibration is used by measuring one or more reference capacitors to cancel or reduce conversion errors.

In some embodiments, one or more reference voltages is digitally controlled to increase the capacitance range or improve the absolute resolution.

Additionally or alternatively, the CapDAC may comprise a coarse-fine design which allows a wide capacitance range and fine absolute resolution. Additionally or alternatively, at least one unit capacitor of the CapDAC comprises an integrated capacitor. In this regard, the integrated capacitor may comprise a poly-insulator poly (PIP) capacitor, a metal-insulator-metal (MIM) capacitor, a dual MIM (DMIM) capacitor, or a metal-oxide-metal (MOM) capacitor.

In some embodiments, the apparatus further includes a fine conversion stage element configured to perform capacitance-to-digital conversion and generate a residual error between the input capacitance and the reference capacitance. In some such embodiments, the fine conversion stage element comprises a capacitance-to-digital converter. Additionally, the fine conversion stage element may comprise an integrating converter or a sigma-delta converter.

In a second example embodiment, a method is provided for capacitance-to-digital conversion. The method includes producing, by one or more sensor capacitors, an input capacitance, and producing, by one or more CapDACs, a reference capacitance. The method further includes amplifying, by one or more inverter-based circuits connected to the sensor capacitor and the CapDAC, a difference or a comparison between the input capacitance and the reference capacitance or a scaled or shifted version of the input capacitance and the reference capacitance. The method further includes producing, by successive approximation register (SAR) logic circuitry in conjunction with the Cap-DAC and the one or more inverter-based circuits, a digital signal representative of the input capacitance.

In some embodiments, the method further includes receiving, by a latch comparator, an amplified signal from the one or more inverter-based circuits, and outputting a strengthened signal to the SAR logic circuitry.

In some embodiments, at least one of the one or more inverter-based circuits comprises a simple inverter, a current-starved inverter, a cascode inverter, or a fully differential cascode inverter.

In some embodiments, at least one of the one or more inverter-based circuits comprises a single ended input single ended output circuit, a differential input single ended output circuit, or a differential input differential output circuit. In this regard, in some embodiments, the one or more inverter-based circuits comprise a fully differential configuration that is insensitive to common mode noise and common mode errors.

In some embodiments, at least one of the one or more inverter-based circuits is selectively enabled to provide constant energy consumption and energy efficiency independent of the sample rate. Moreover, in some embodiments, auto-calibration is used by measuring one or more reference capacitors to cancel or reduce conversion errors.

In some embodiments, one or more reference voltages is digitally controlled to increase the capacitance range or improve the absolute resolution.

Additionally or alternatively, the CapDAC may comprise a coarse-fine design which allows a wide capacitance range and fine absolute resolution. Additionally or alternatively, at least one unit capacitor of the CapDAC comprises an integrated capacitor. In this regard, the integrated capacitor may comprise a poly-insulator poly (PIP) capacitor, a metal-insulator-metal (MIM) capacitor, a dual MIM (DMIM) capacitor, or a metal-oxide-metal (MOM) capacitor.

In some embodiments, the method further includes performing, by a fine conversion stage element, capacitance-to-digital conversion, and generating a residual error between the input capacitance and the reference capacitance. In some such embodiments, the fine conversion stage element comprises a capacitance-to-digital converter. Additionally, the fine conversion stage element may comprise an integrating converter or a sigma-delta converter.

In a third example embodiment, an apparatus is provided for capacitance-to-digital conversion. The apparatus includes means for producing an input capacitance, and means for producing a reference capacitance. The apparatus further includes means for amplifying a difference or a comparison between the input capacitance and the reference capacitance or a scaled or shifted version of the input capacitance and the reference capacitance. The apparatus further includes means for producing a digital signal representative of the input capacitance.

In some embodiments, the apparatus further includes means for receiving an amplified signal from the one or more inverter-based circuits, and means for outputting a strengthened signal to the SAR logic circuitry.

In some embodiments, at least one of the one or more inverter-based circuits comprises a simple inverter, a current-starved inverter, a cascode inverter, or a fully differential cascode inverter.

In some embodiments, at least one of the one or more inverter-based circuits comprises a single ended input single ended output circuit, a differential input single ended output circuit, or a differential input differential output circuit. In this regard, in some embodiments, the one or more inverter-based circuits comprise a fully differential configuration that is insensitive to common mode noise and common mode errors.

In some embodiments, at least one of the one or more inverter-based circuits is selectively enabled to provide constant energy consumption and energy efficiency independent of the sample rate. Moreover, in some embodiments, auto-calibration is used by measuring one or more reference capacitors to cancel or reduce conversion errors.

In some embodiments, one or more reference voltages is digitally controlled to increase the capacitance range or improve the absolute resolution.

Additionally or alternatively, the CapDAC may comprise a coarse-fine design which allows a wide capacitance range and fine absolute resolution. Additionally or alternatively, at least one unit capacitor of the CapDAC comprises an integrated capacitor. In this regard, the integrated capacitor may comprise a poly-insulator poly (PIP) capacitor, a metal-insulator-metal (MIM) capacitor, a dual MIM (DMIM) capacitor, or a metal-oxide-metal (MOM) capacitor.

In some embodiments, the apparatus further includes means for performing capacitance-to-digital conversion, and means for generating a residual error between the input capacitance and the reference capacitance. In some such embodiments, the fine conversion stage element comprises a capacitance-to-digital converter. Additionally, the fine conversion stage element may comprise an integrating converter or a sigma-delta converter.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Figure 1:
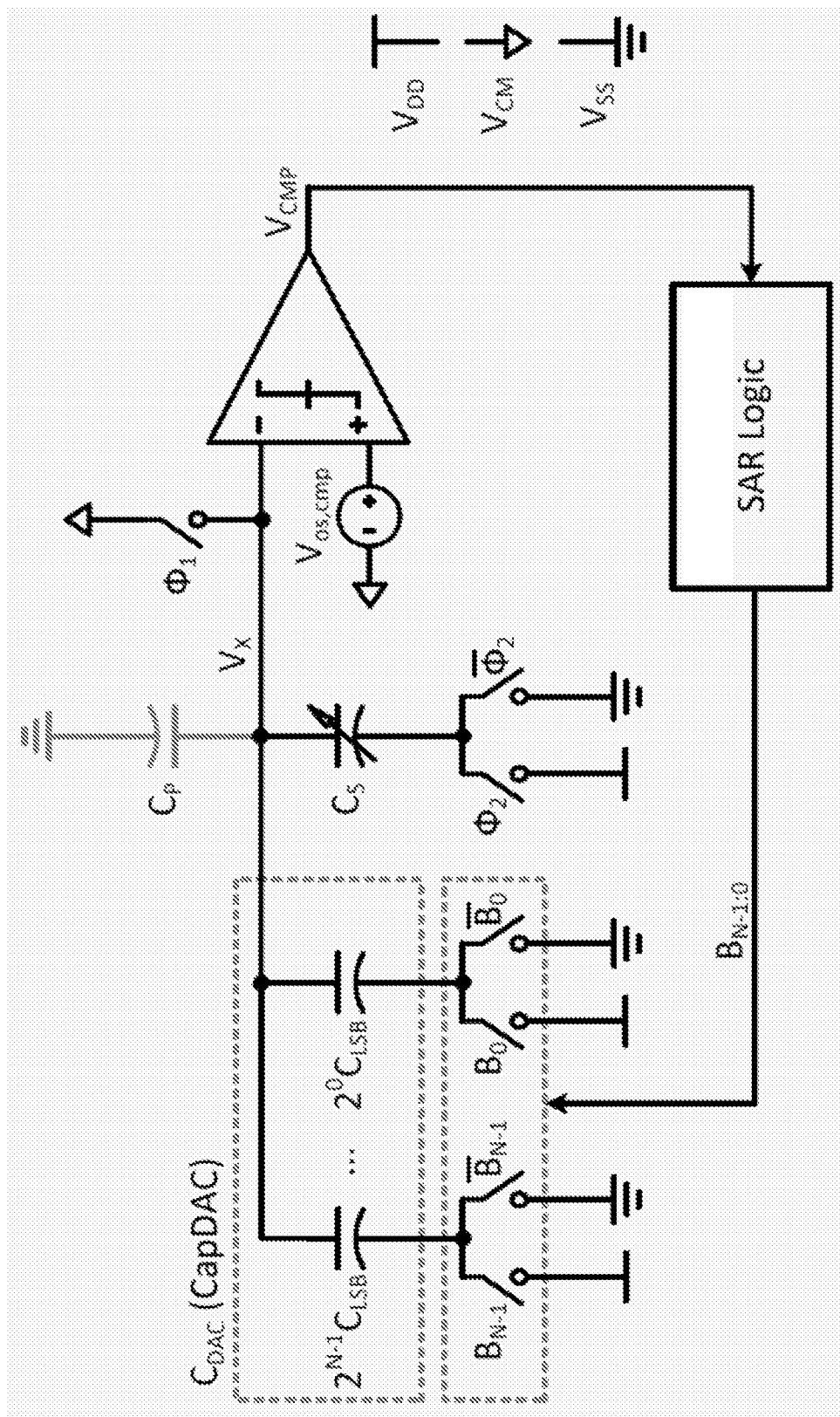
Figure 2:
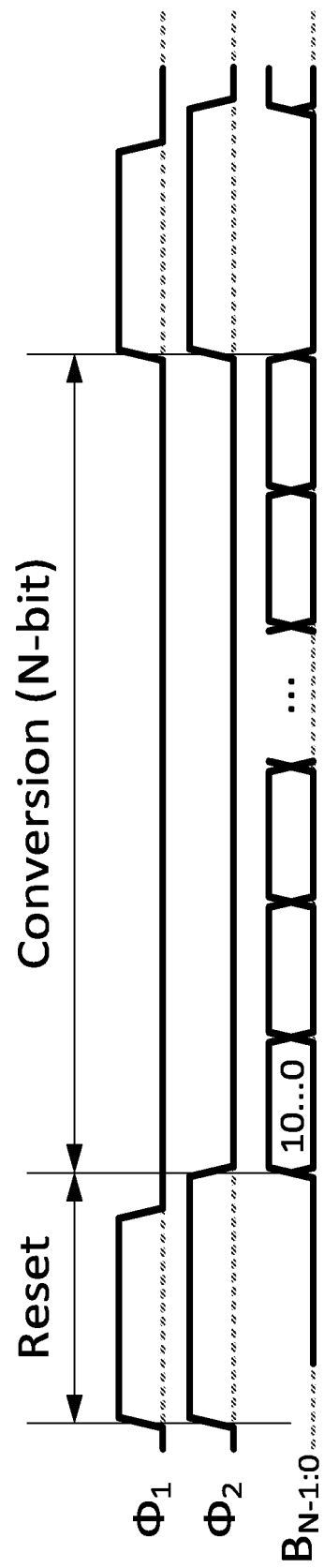
Figure 3:
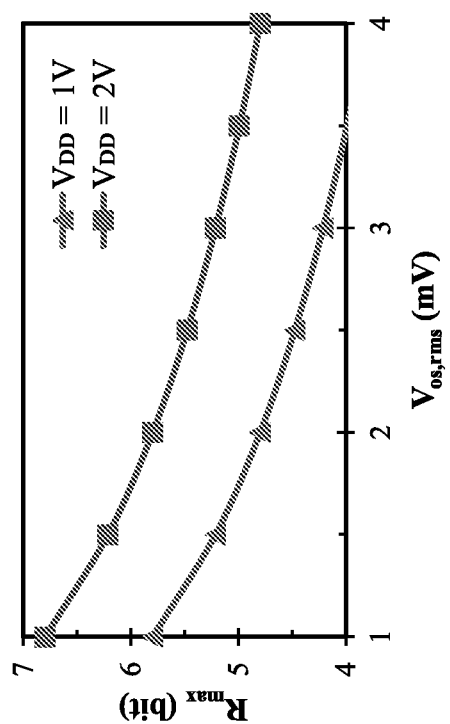
Figure 4:
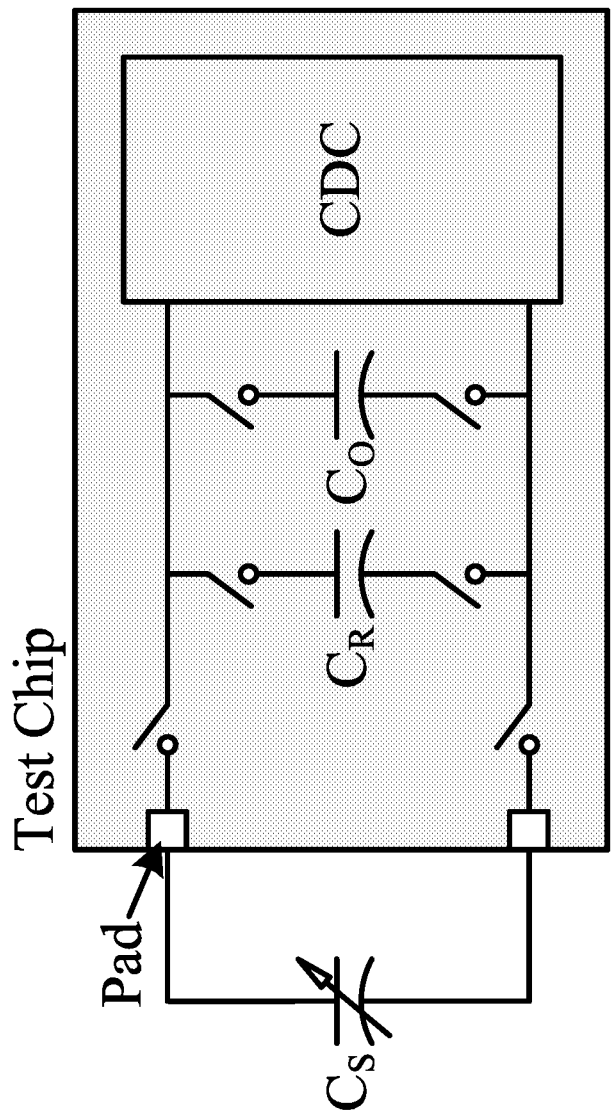
Figure 5:
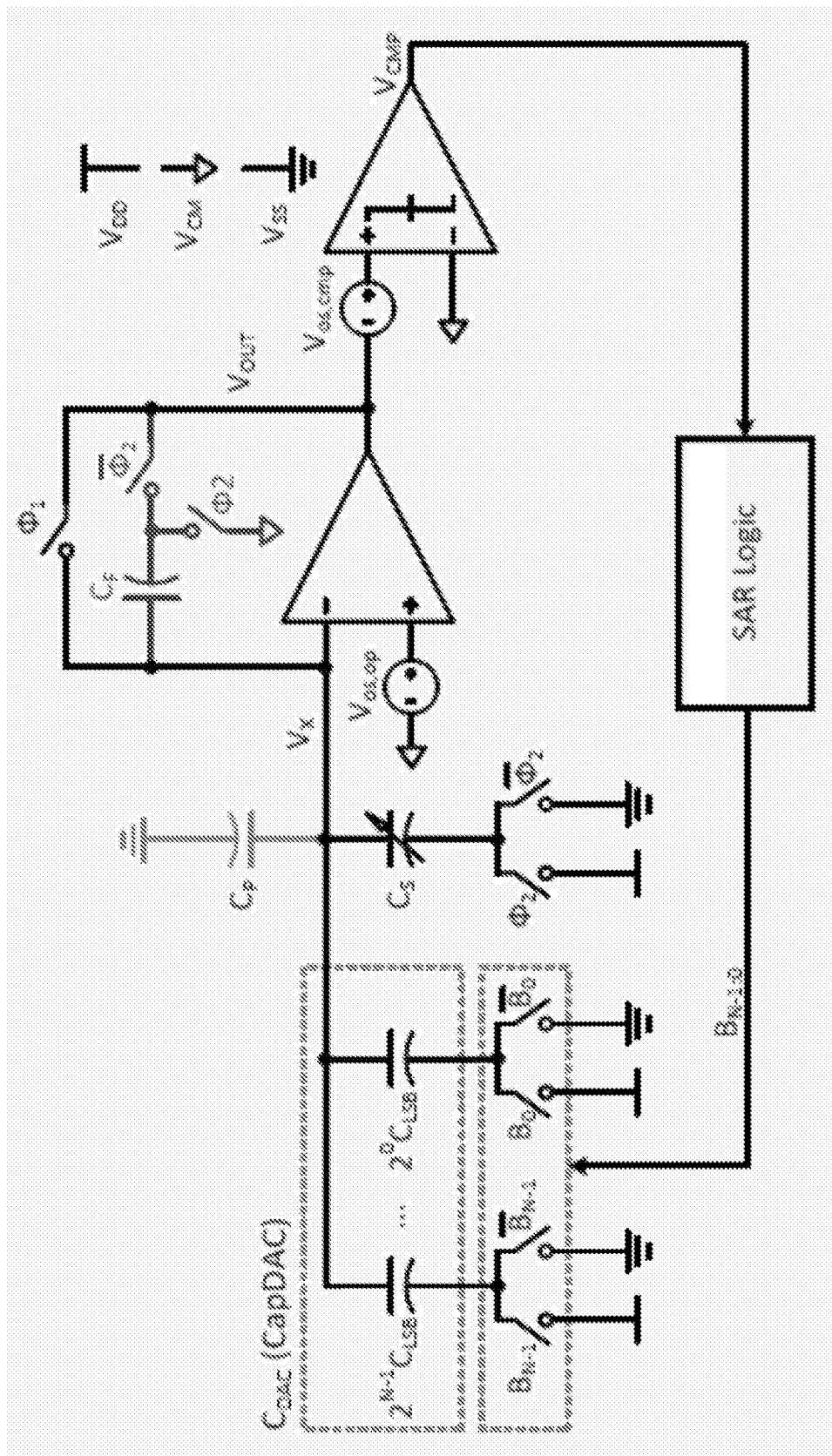
Figure 6:
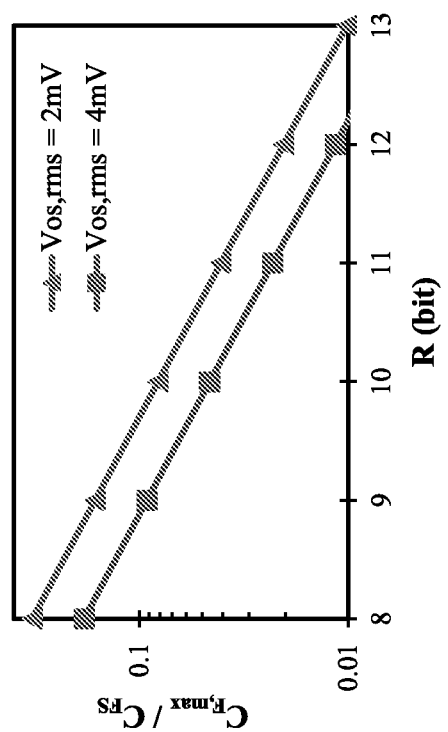
Figure 7:
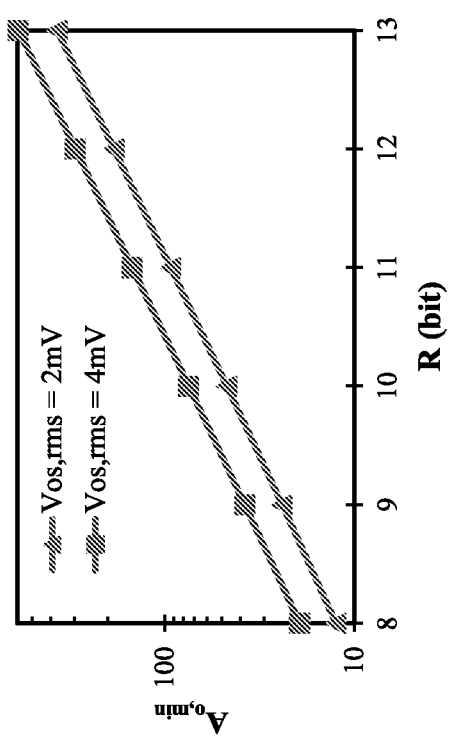
Figure 8:
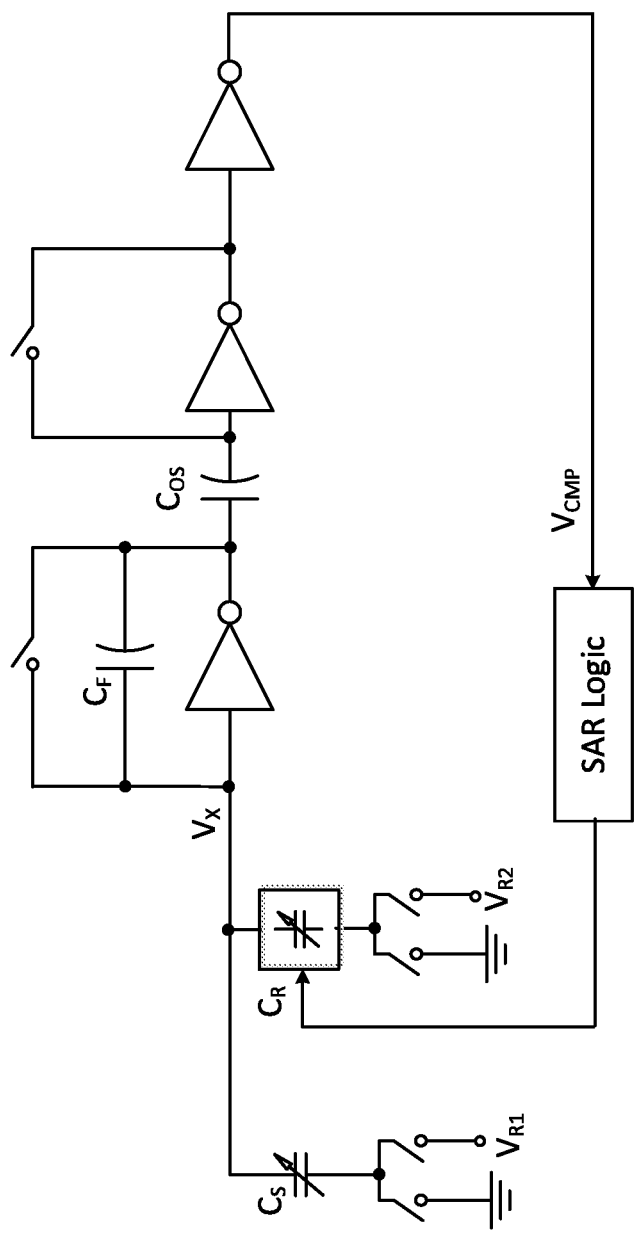
Figure 9:
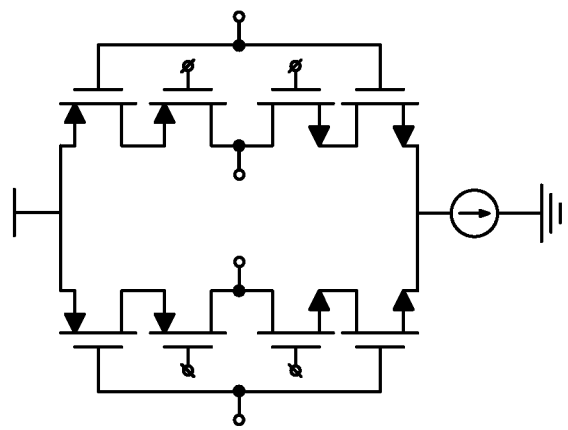
Figure 9:
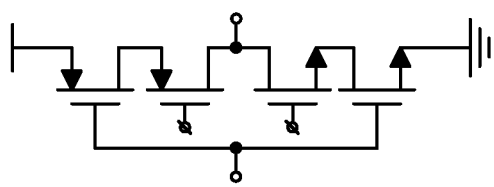
Figure 9:
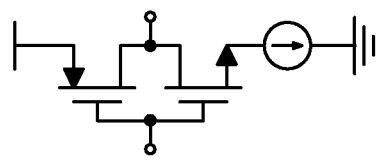
Figure 9:
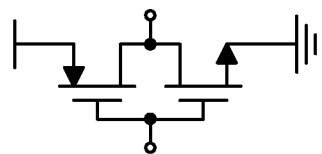
Figure 10:
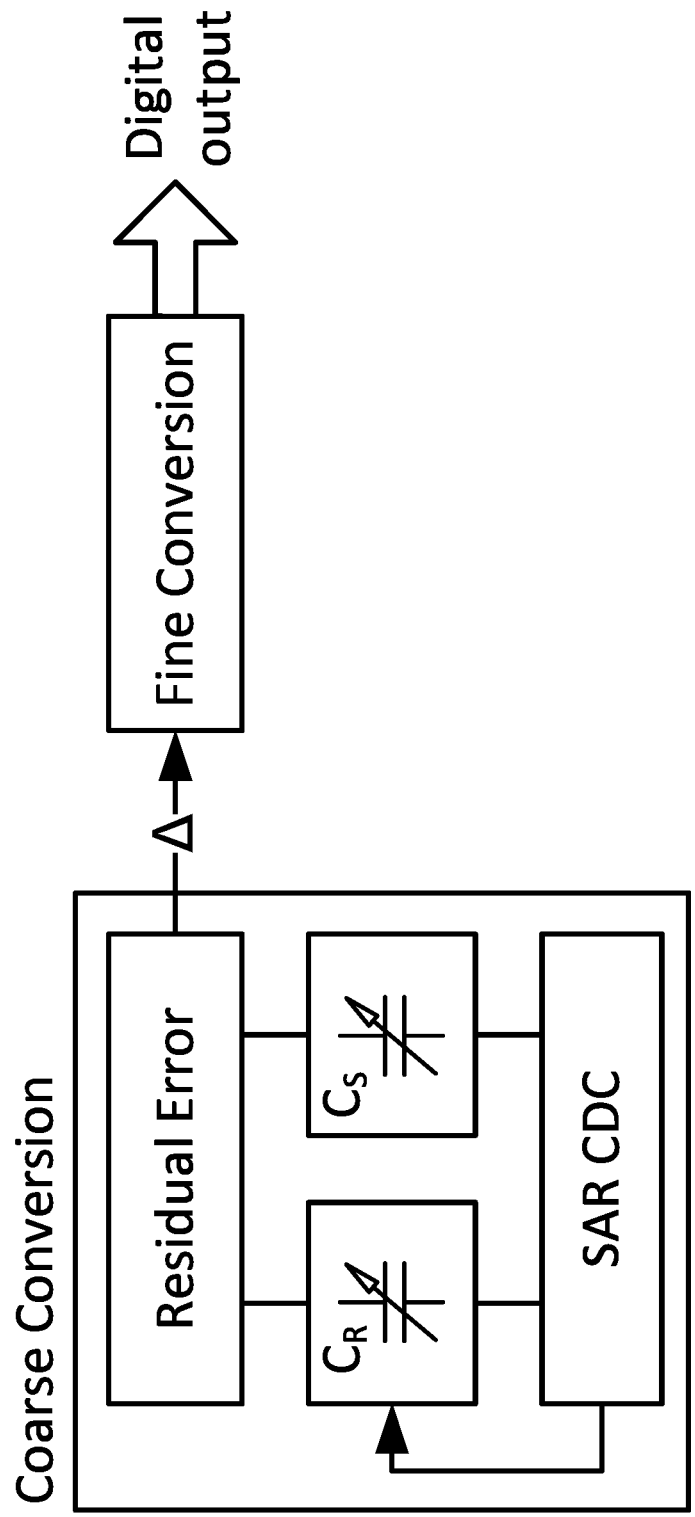
Figure 11:
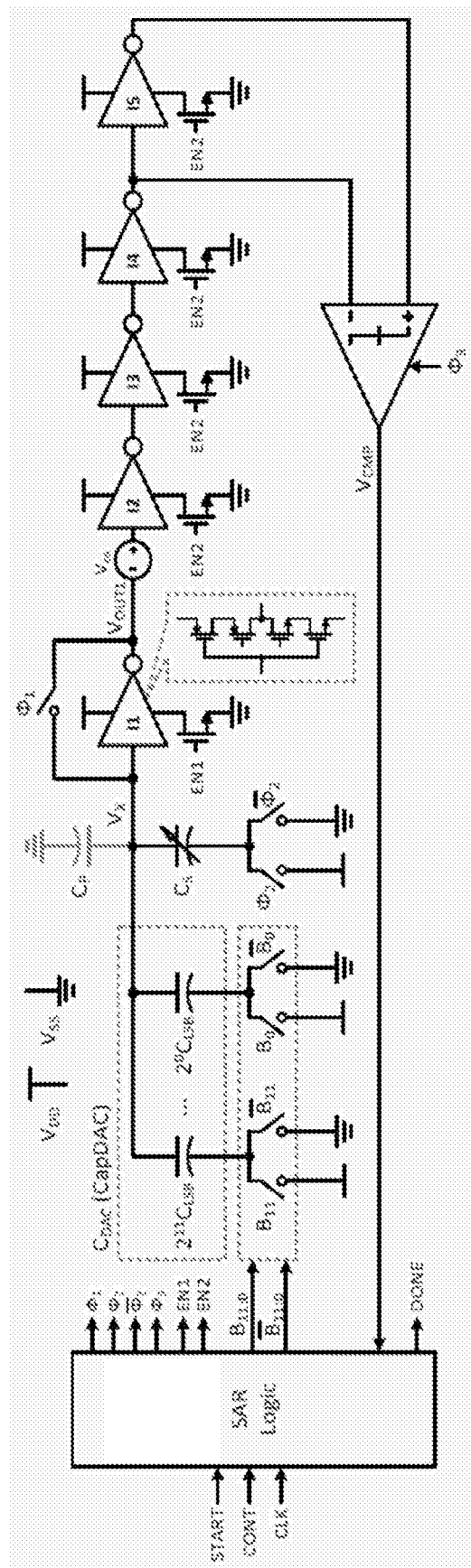
Figure 12:
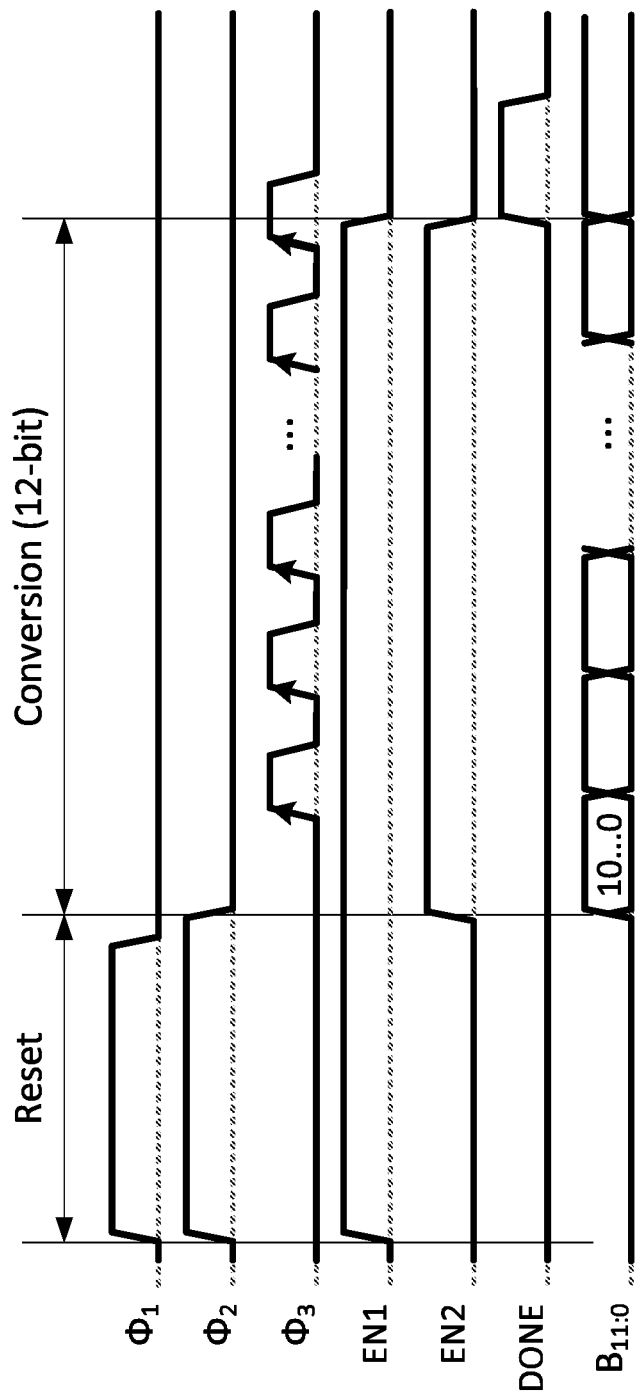
Figure 13:
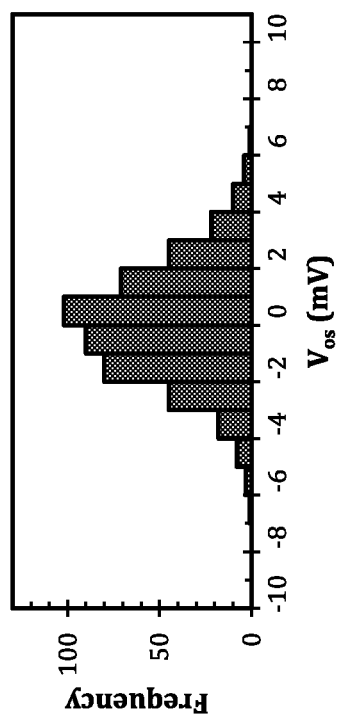
Figure 14:
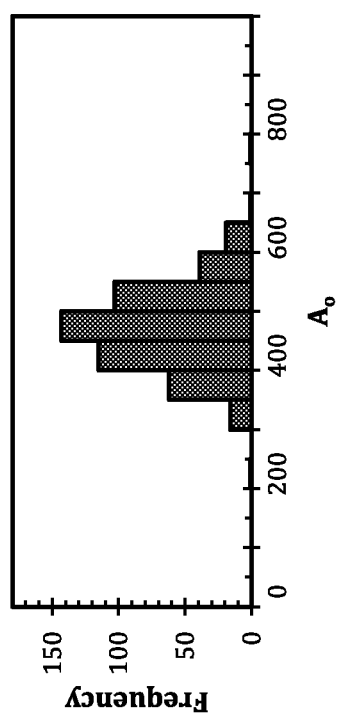
Figure 15A:
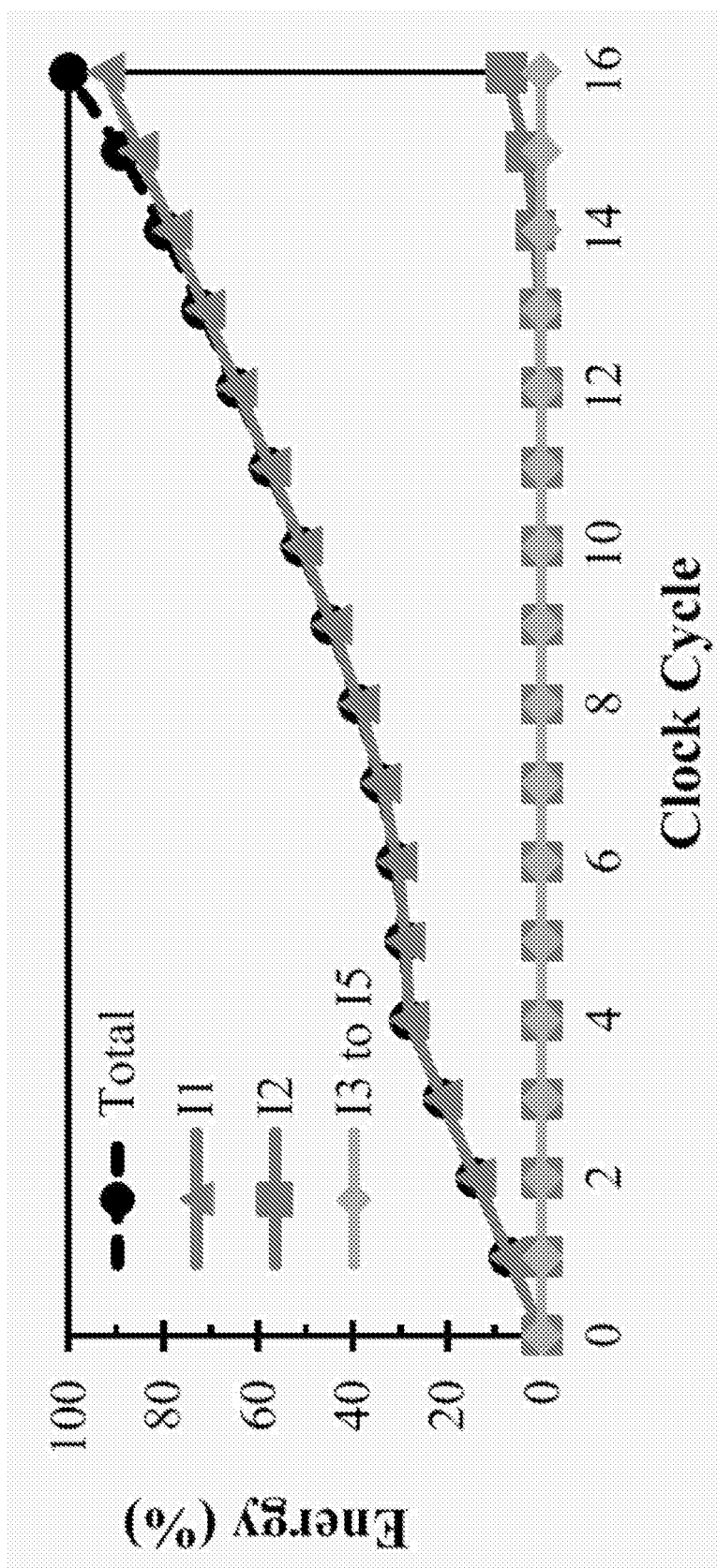
Figure 15B:
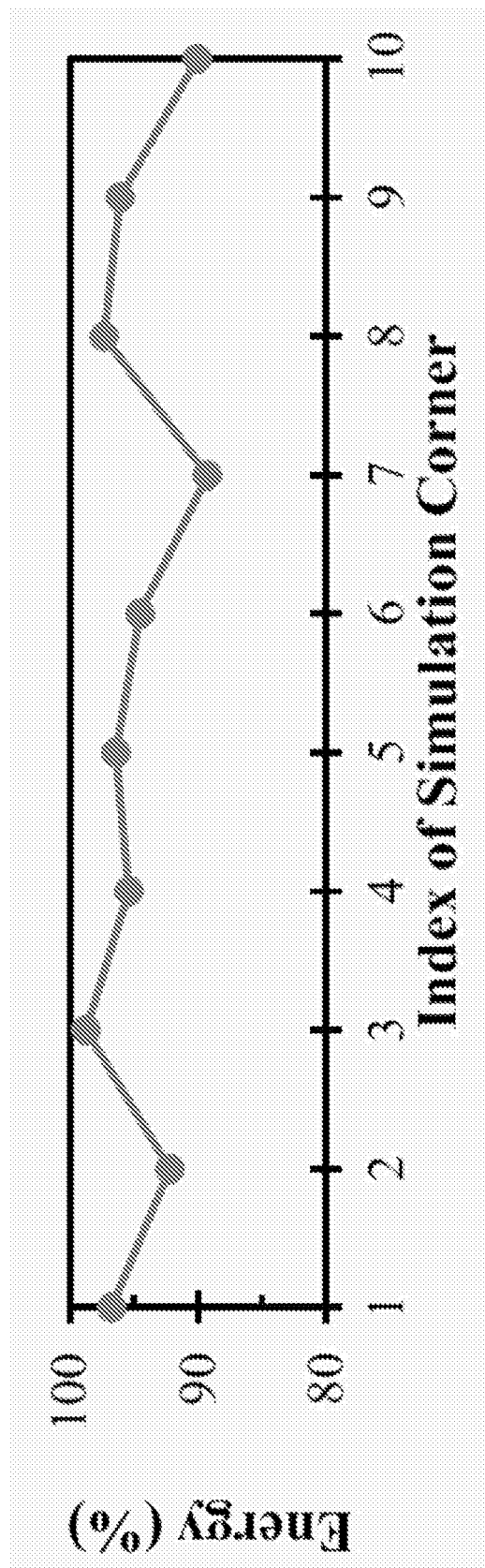
Figure 16:
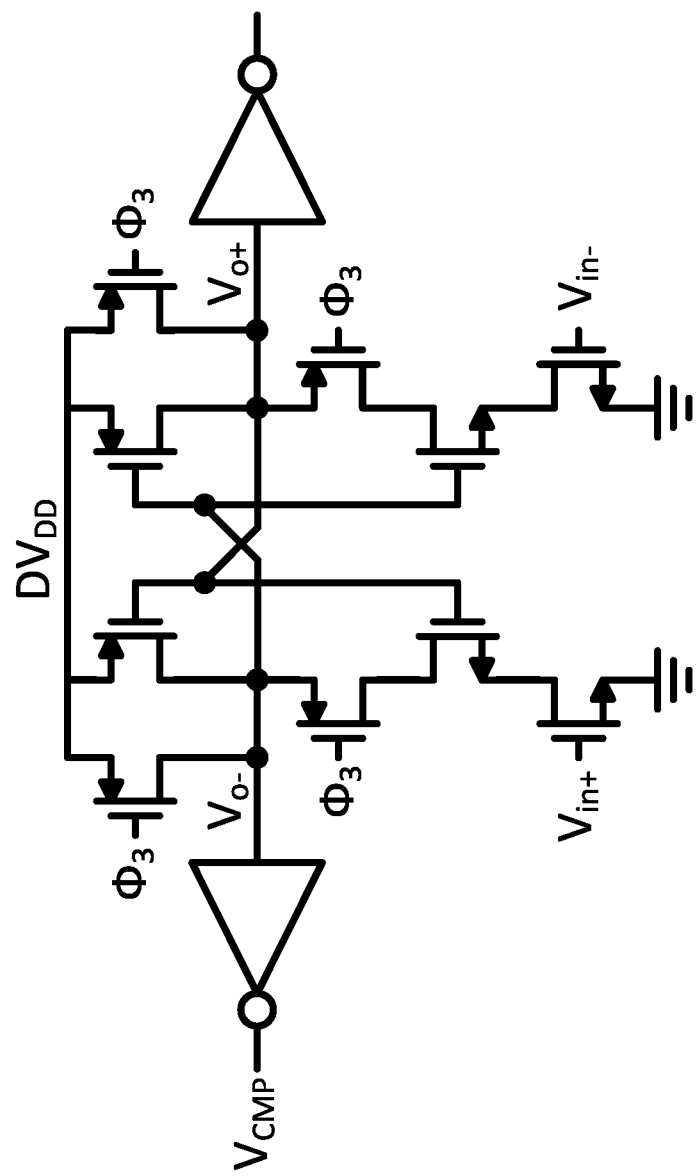
Figure 17:
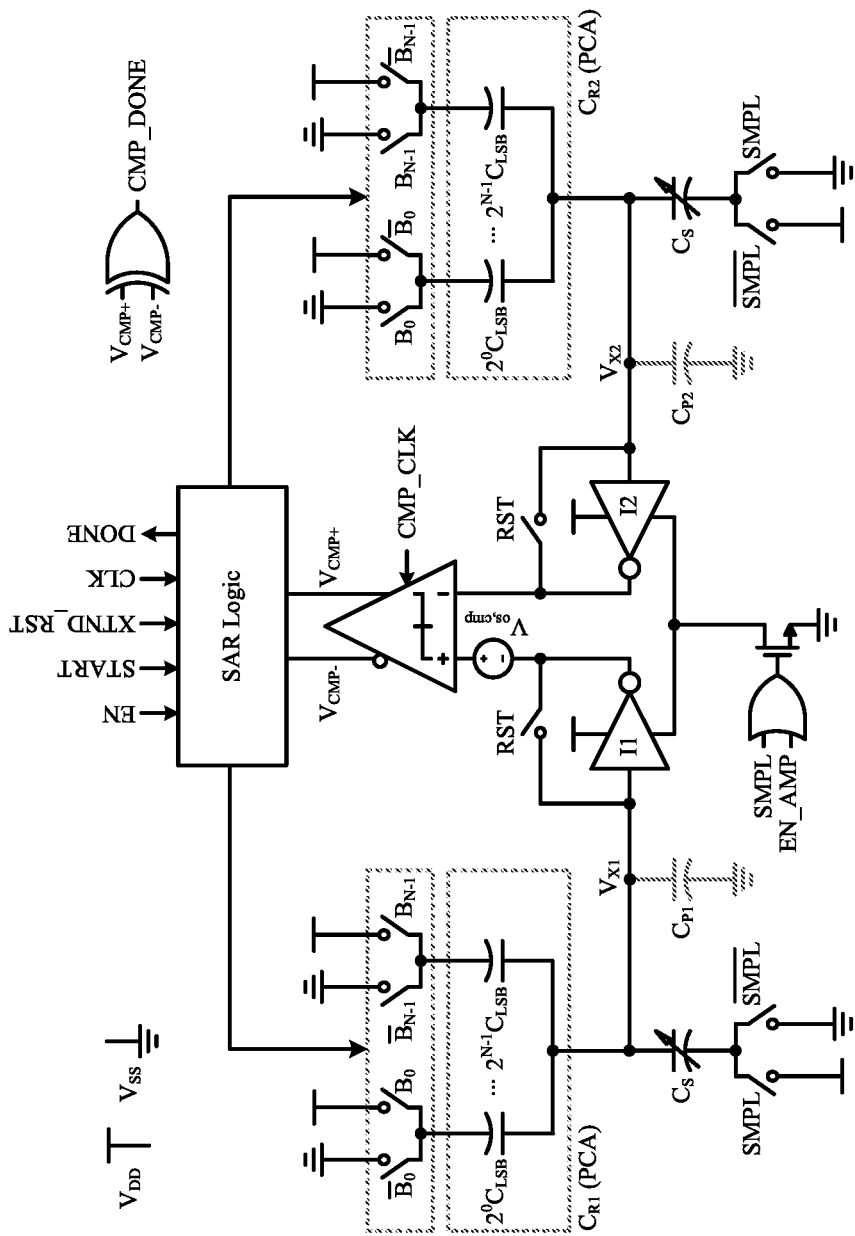
Figure 18:
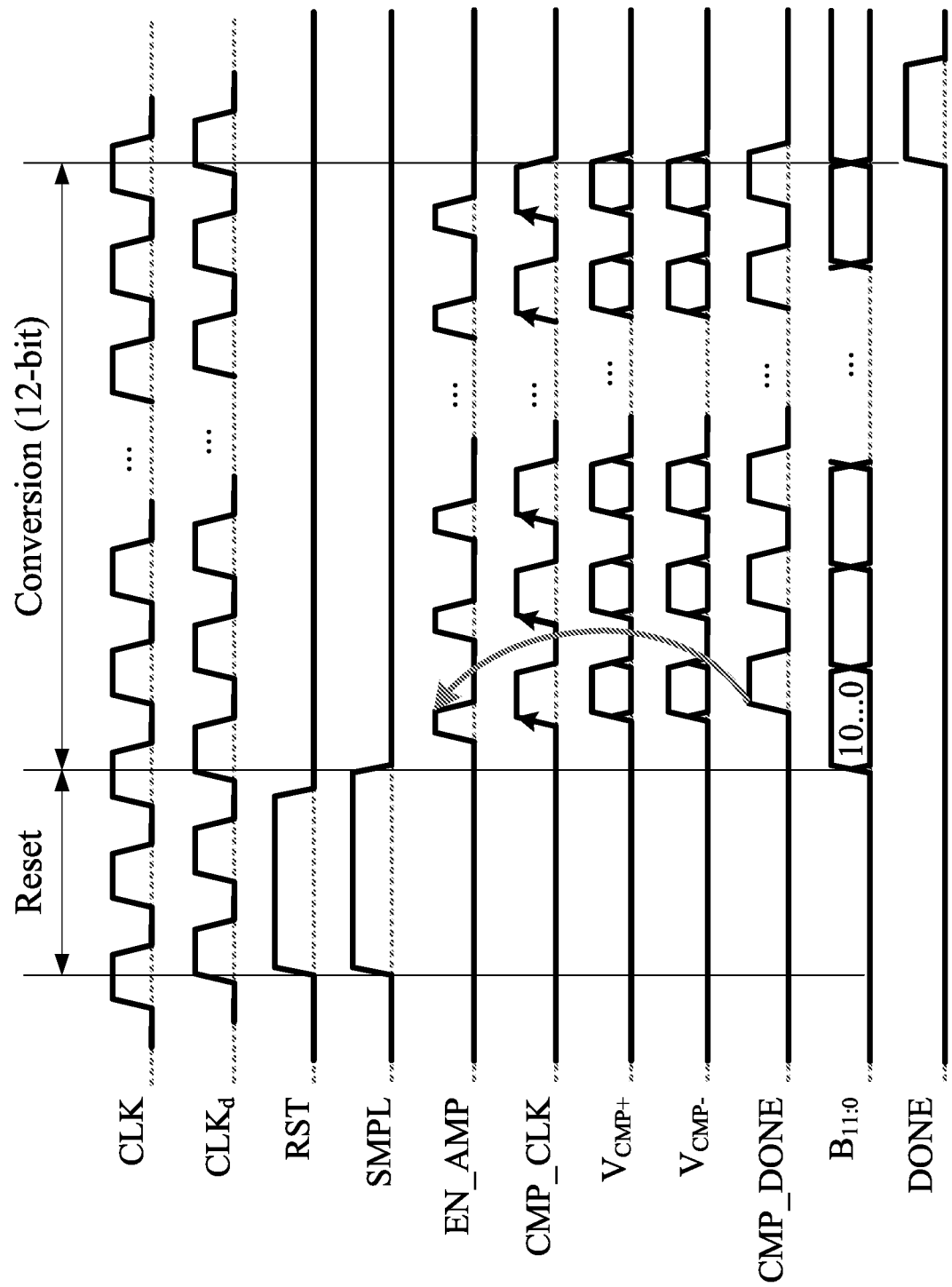
Figure 19:
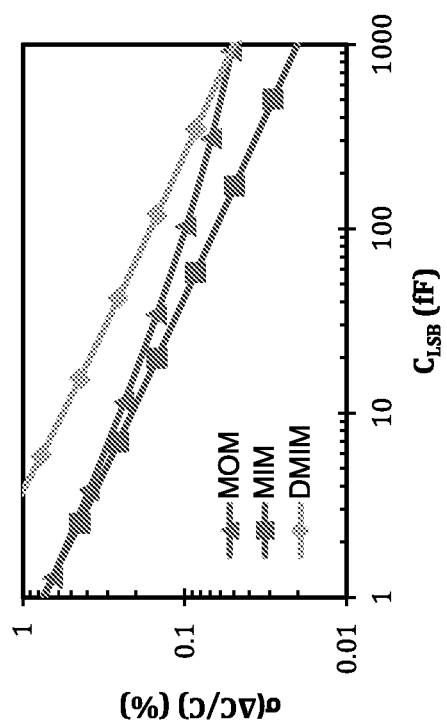
Figure 20:
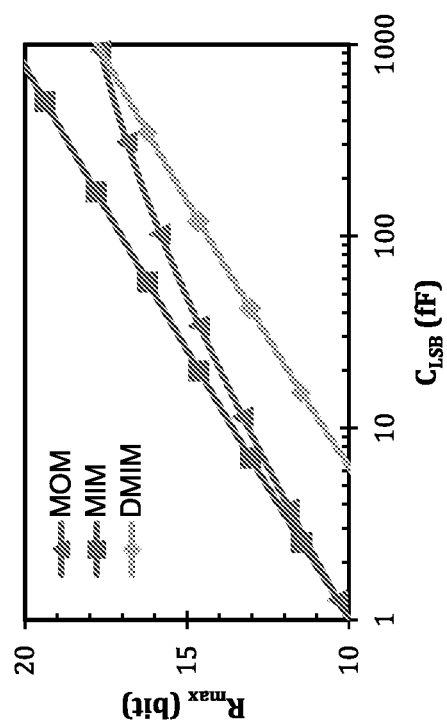
Figure 21:
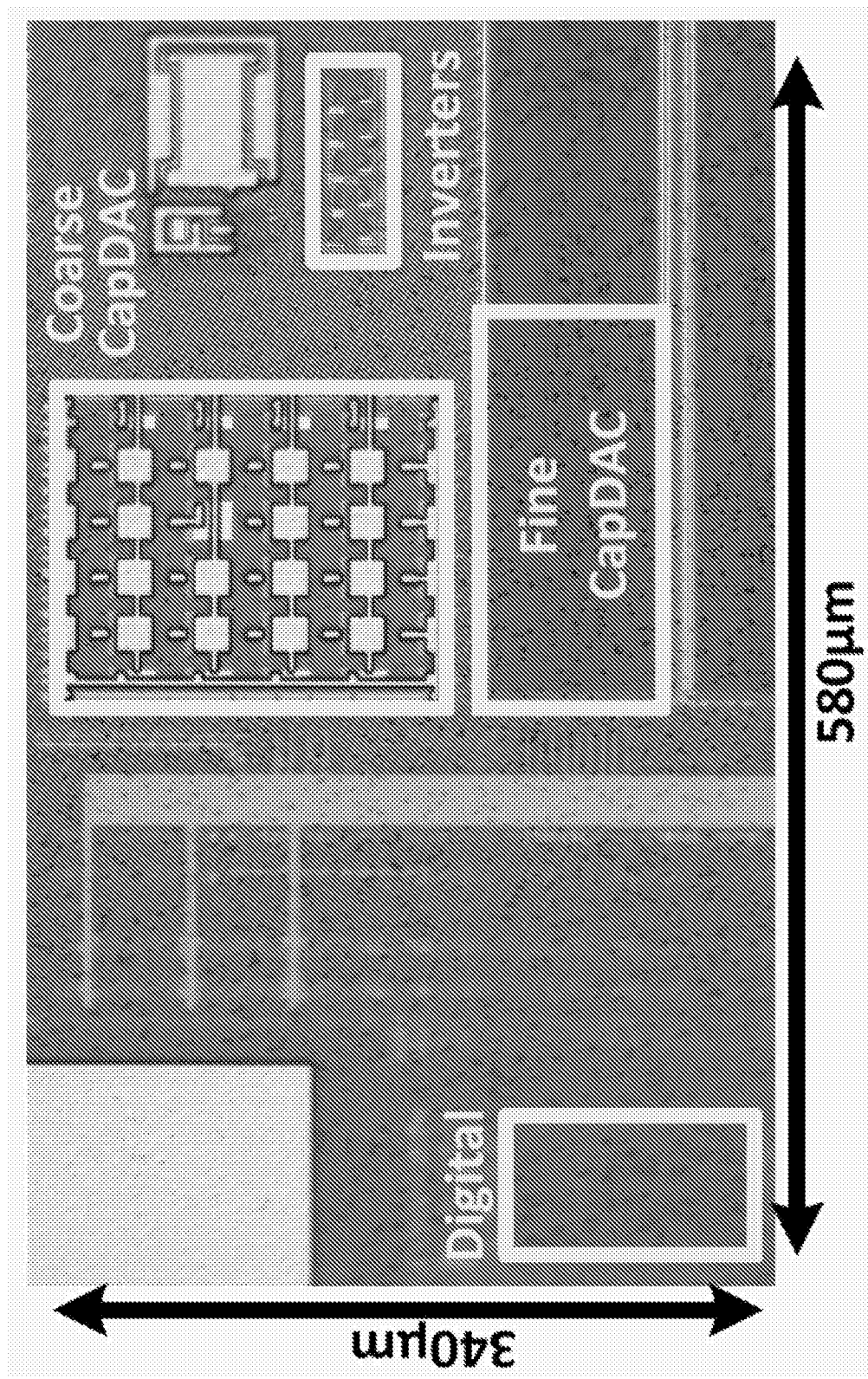
Figure 22:
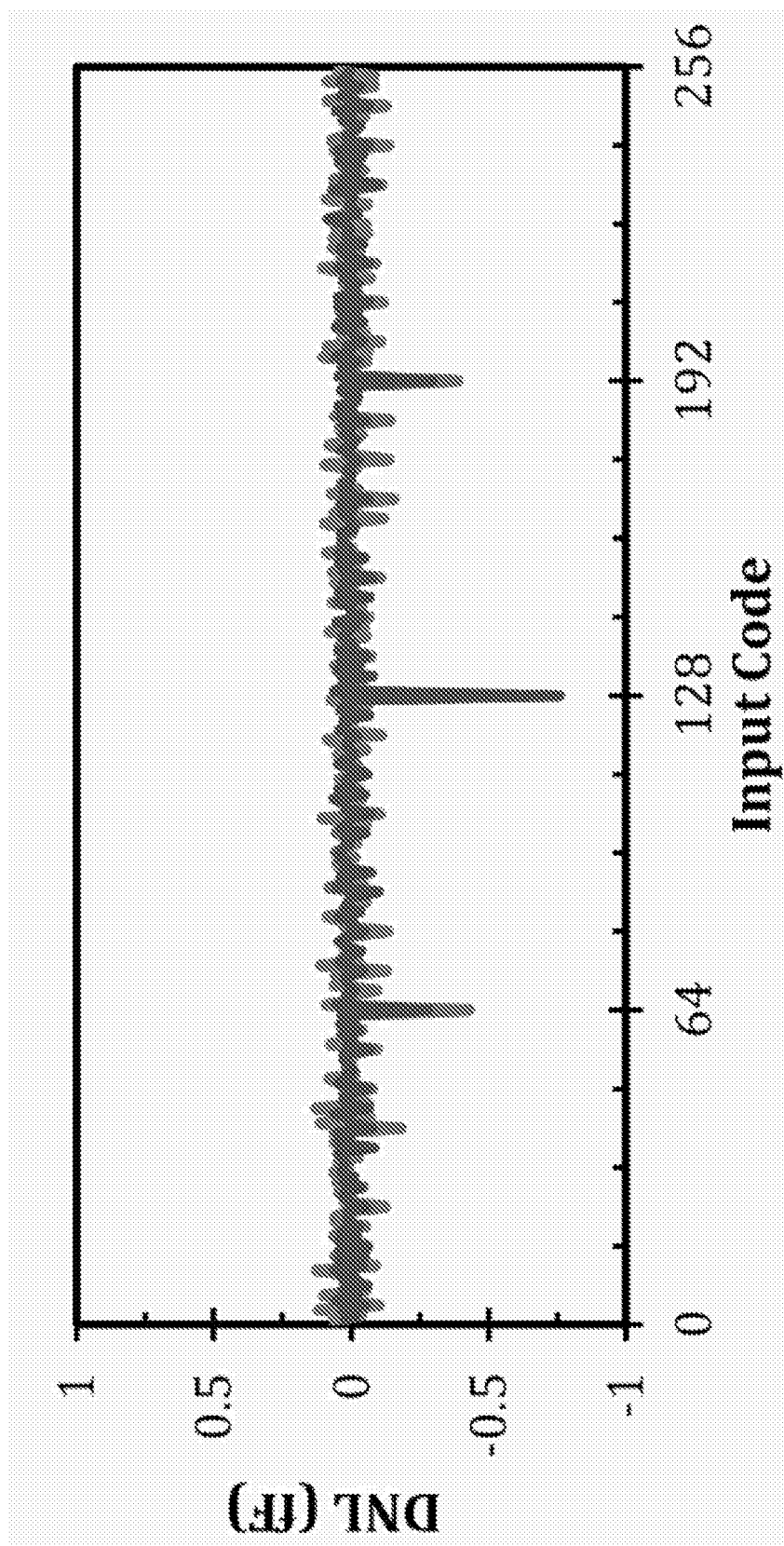
Figure 23:
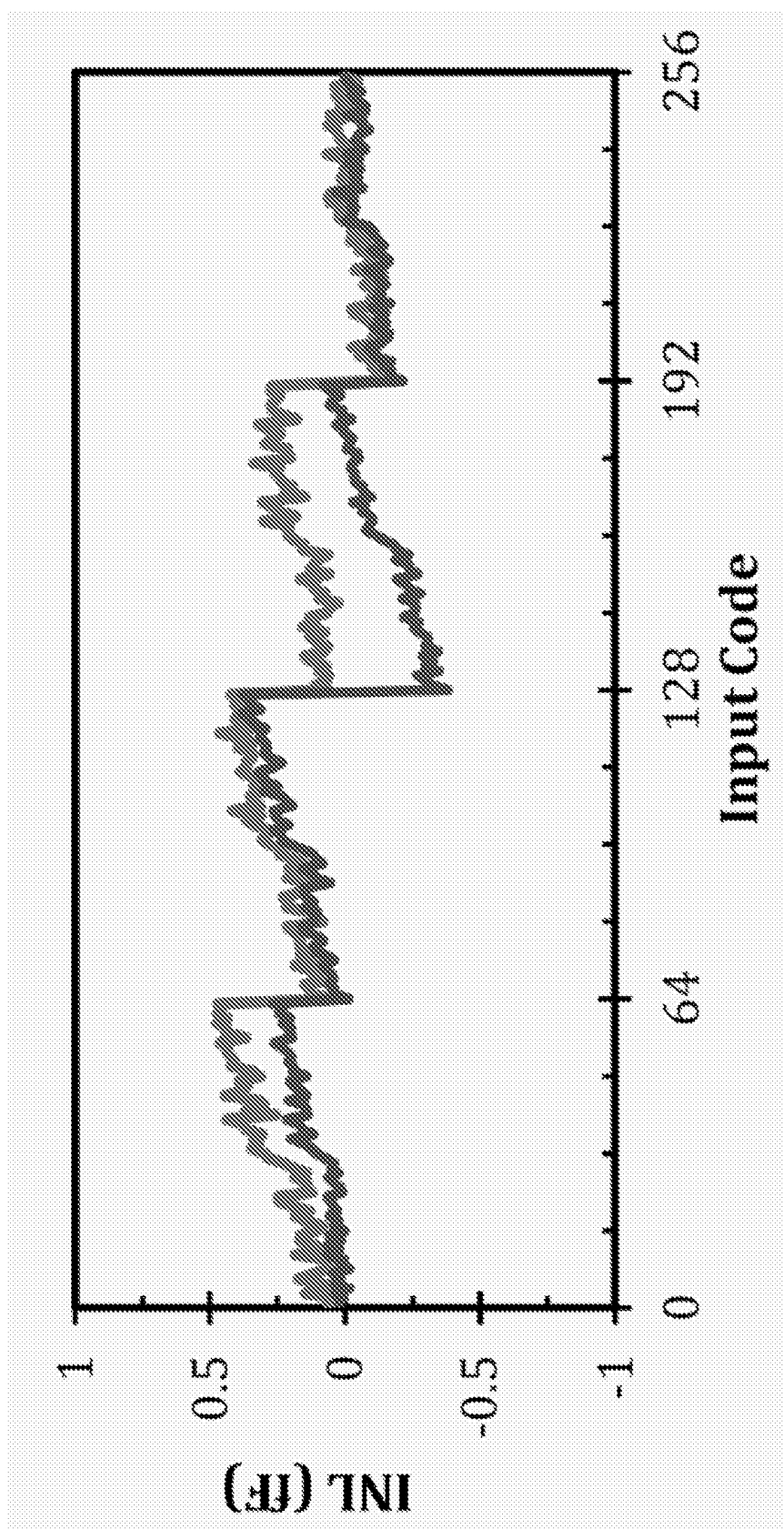
Figure 24:
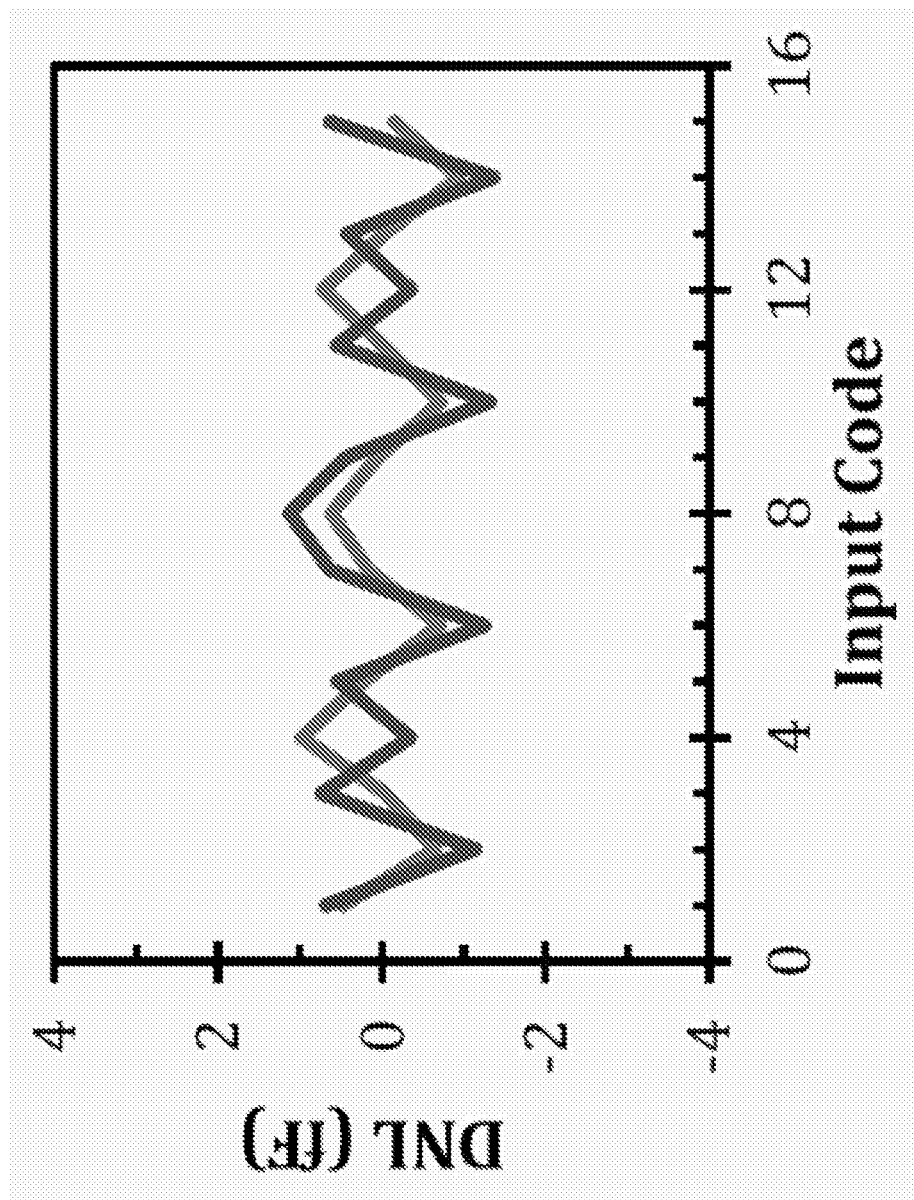
Figure 25:
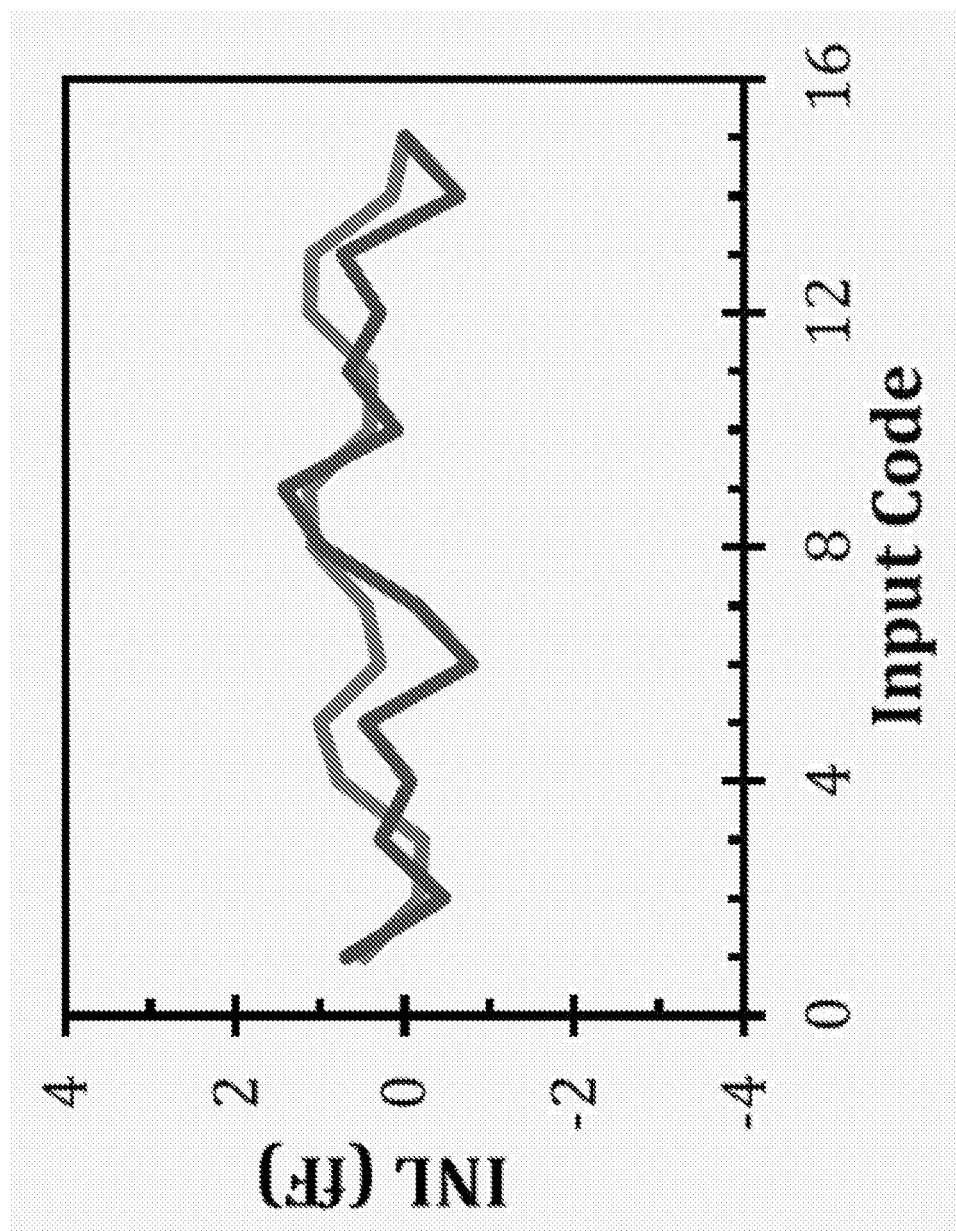
Figure 26:
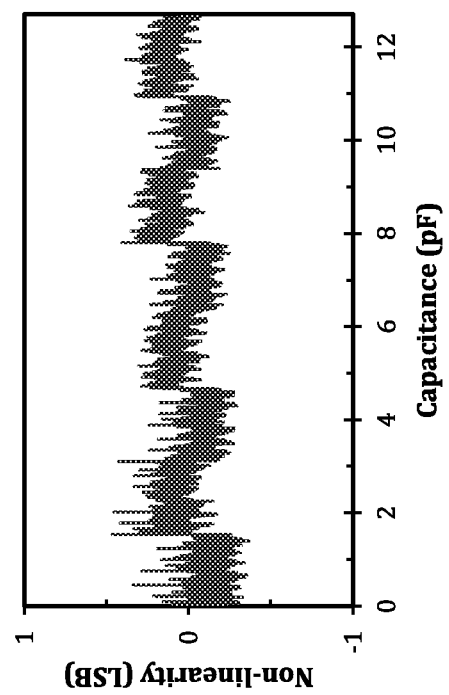
Figure 27:
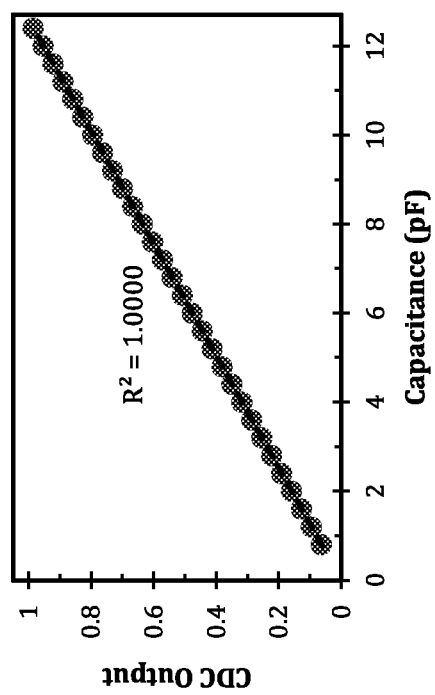
Figure 28:
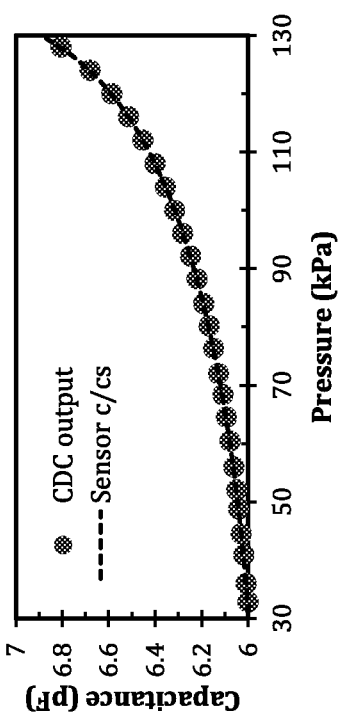
Figure 29:
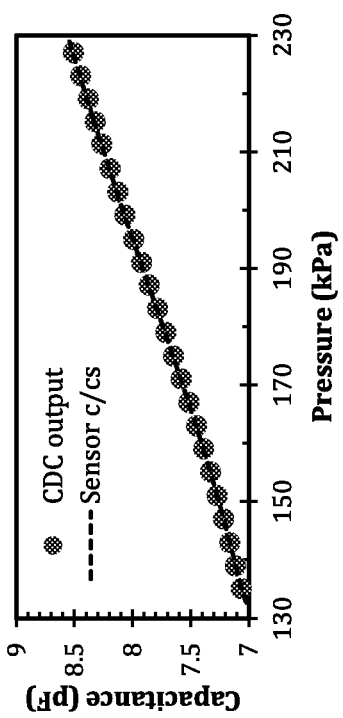
Figure 30:
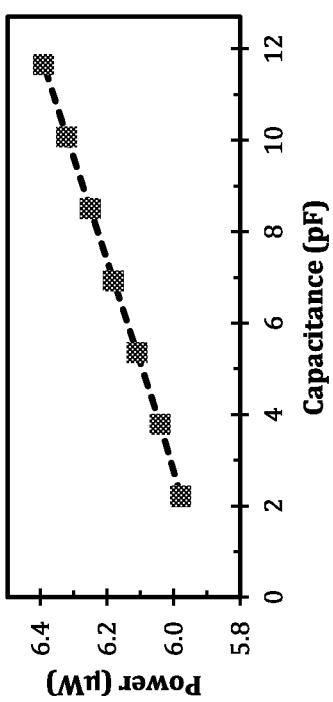
Figure 31:
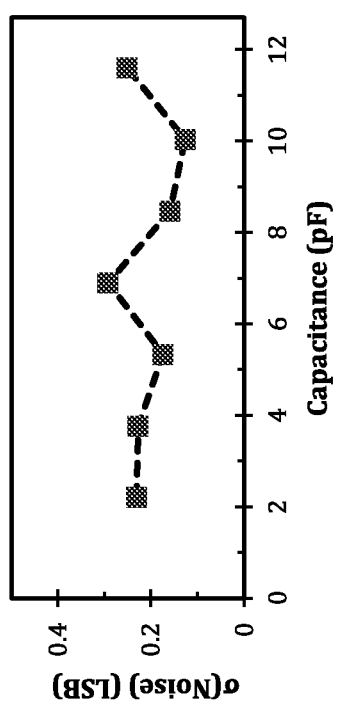
Figure 32:
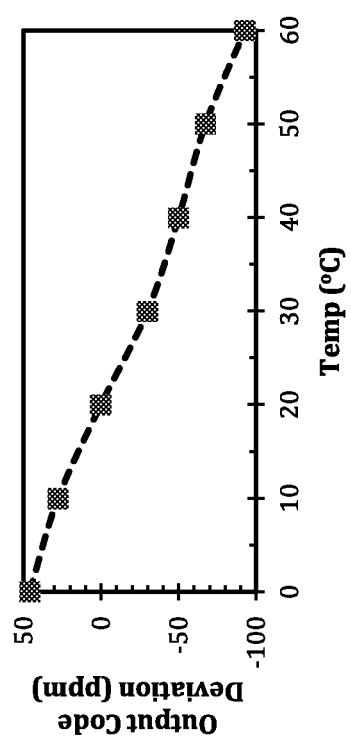
Figure 33:
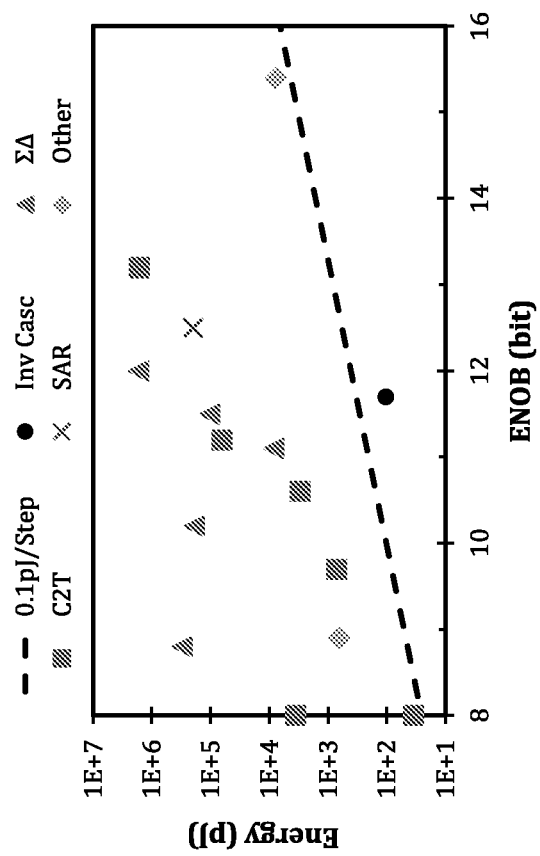
Figure 34:
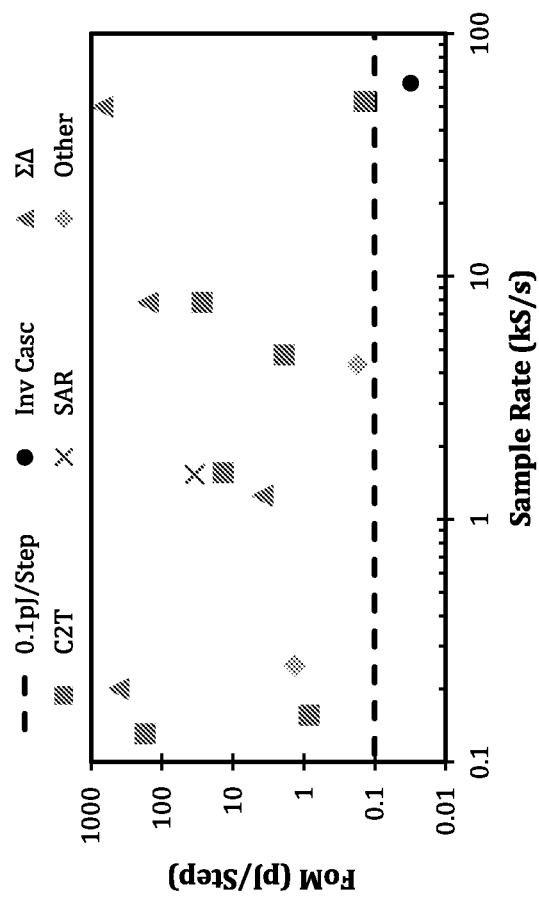
Figure 35:
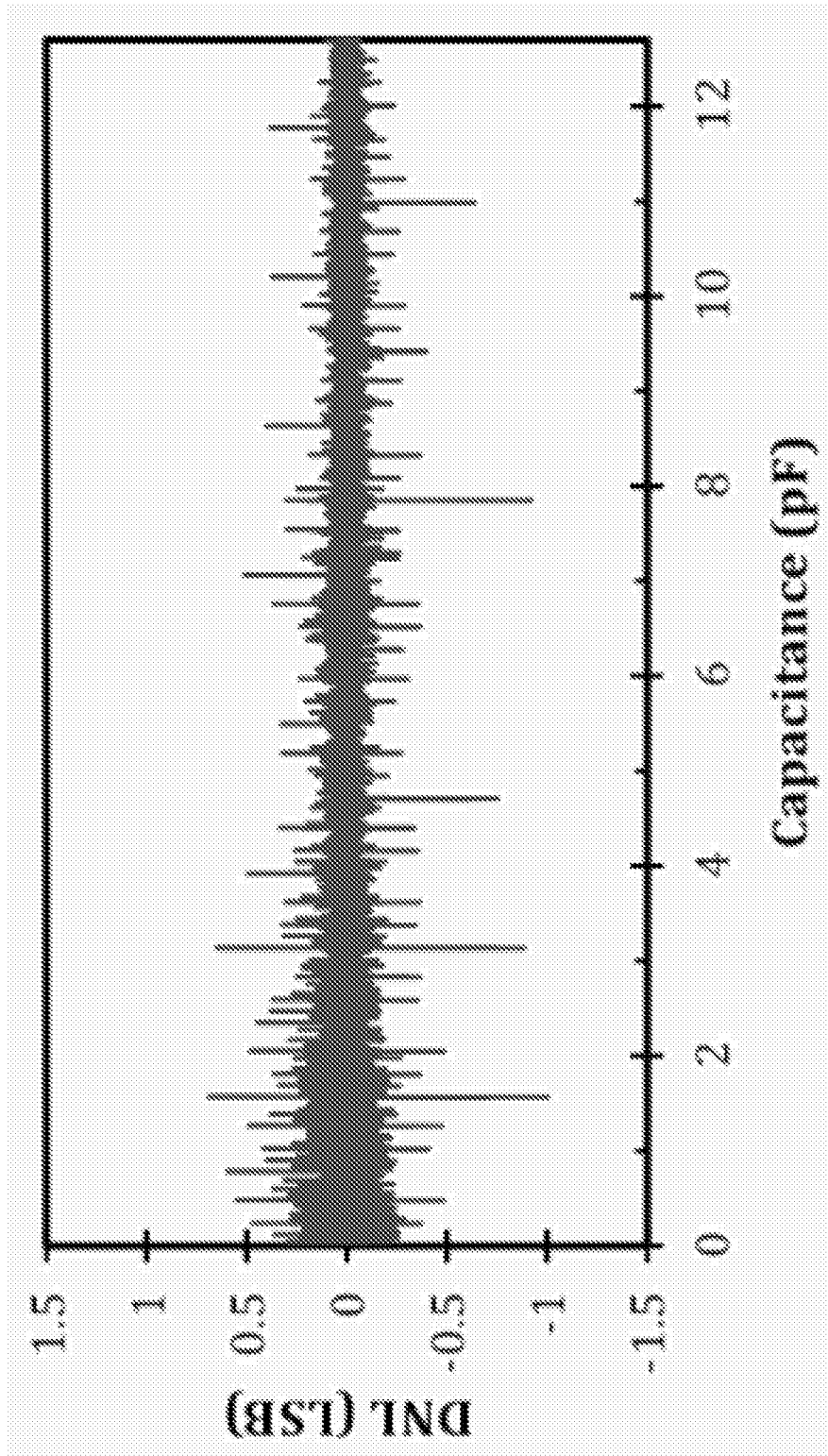
Figure 36:
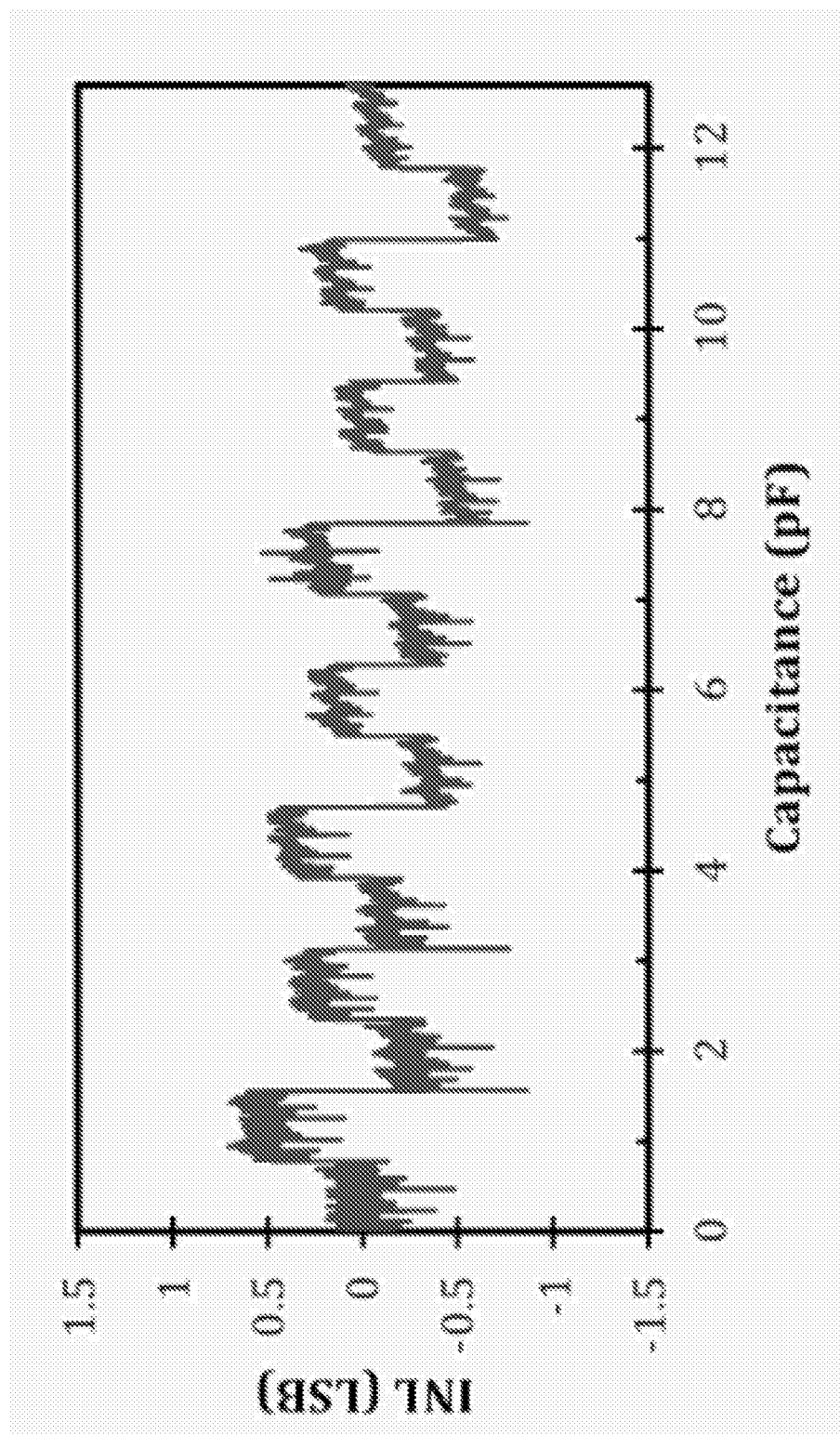
Figure 37:
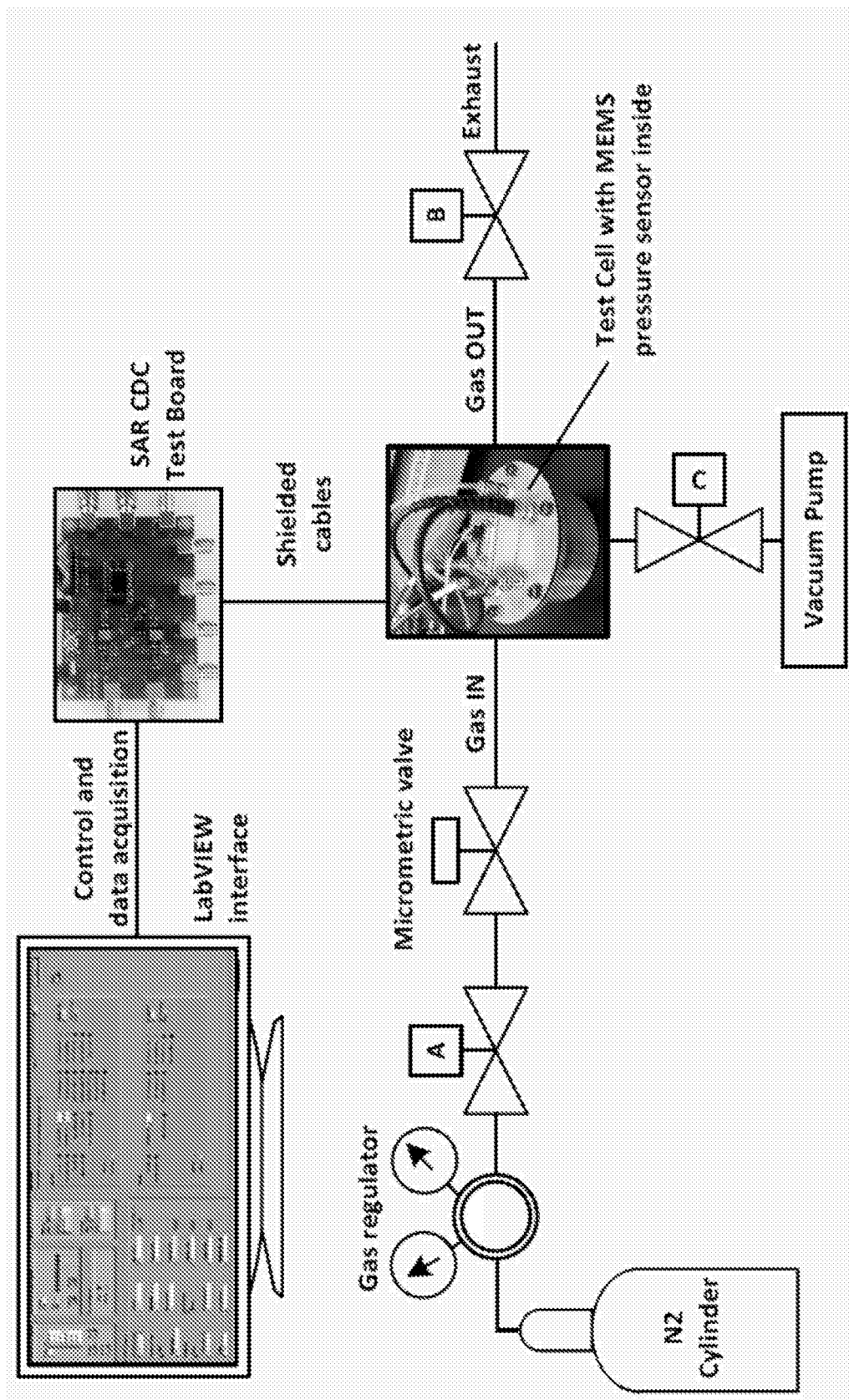
Figures 38, 39:
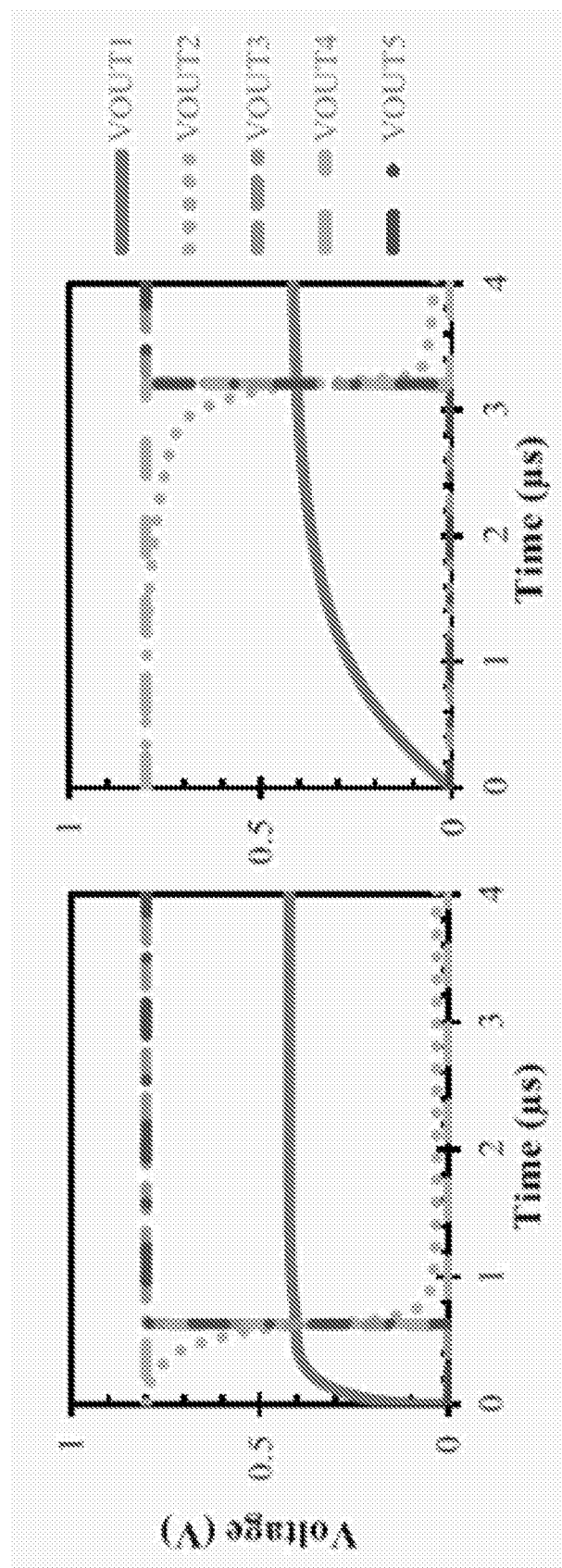
Figure 40:
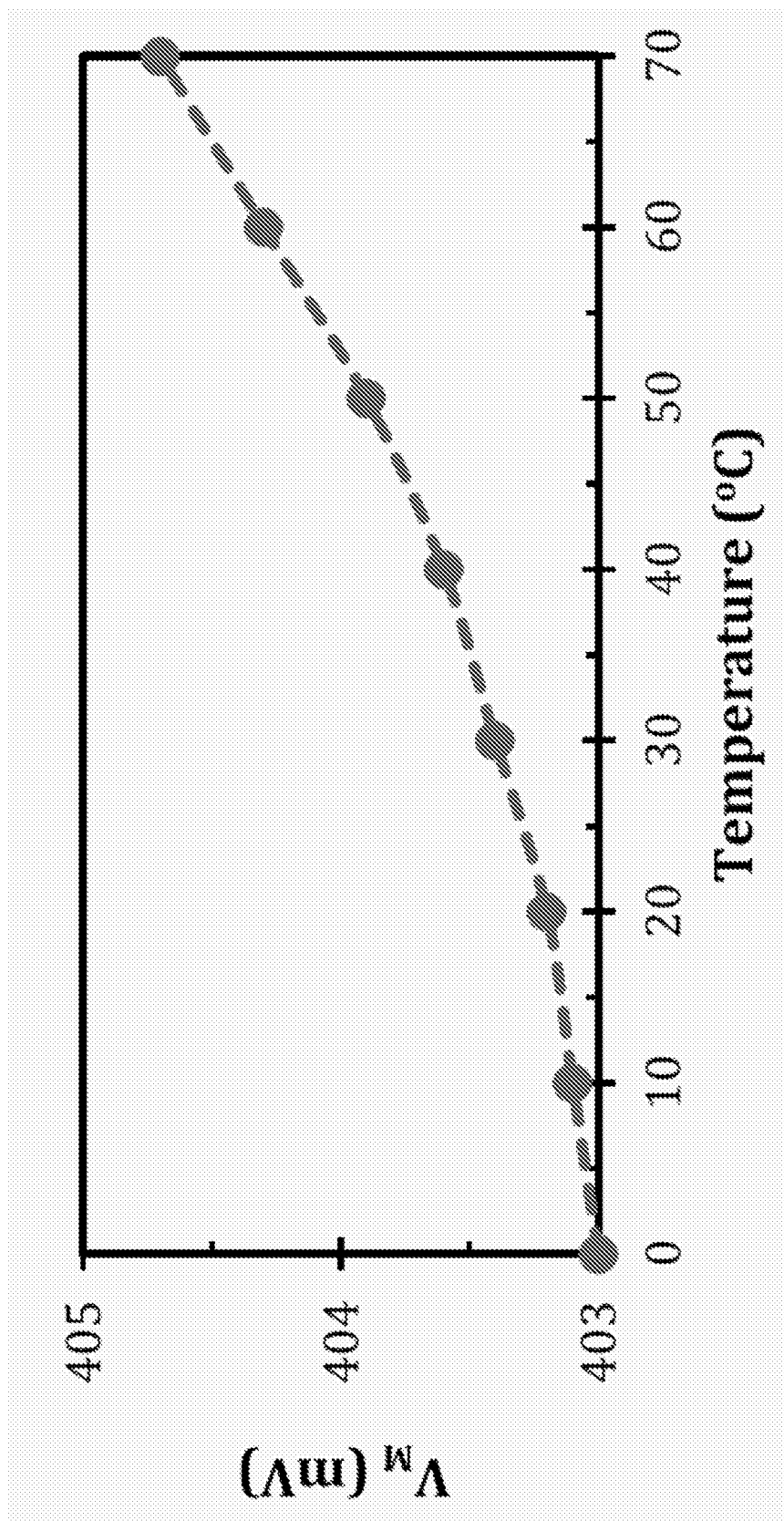
Figure 41:
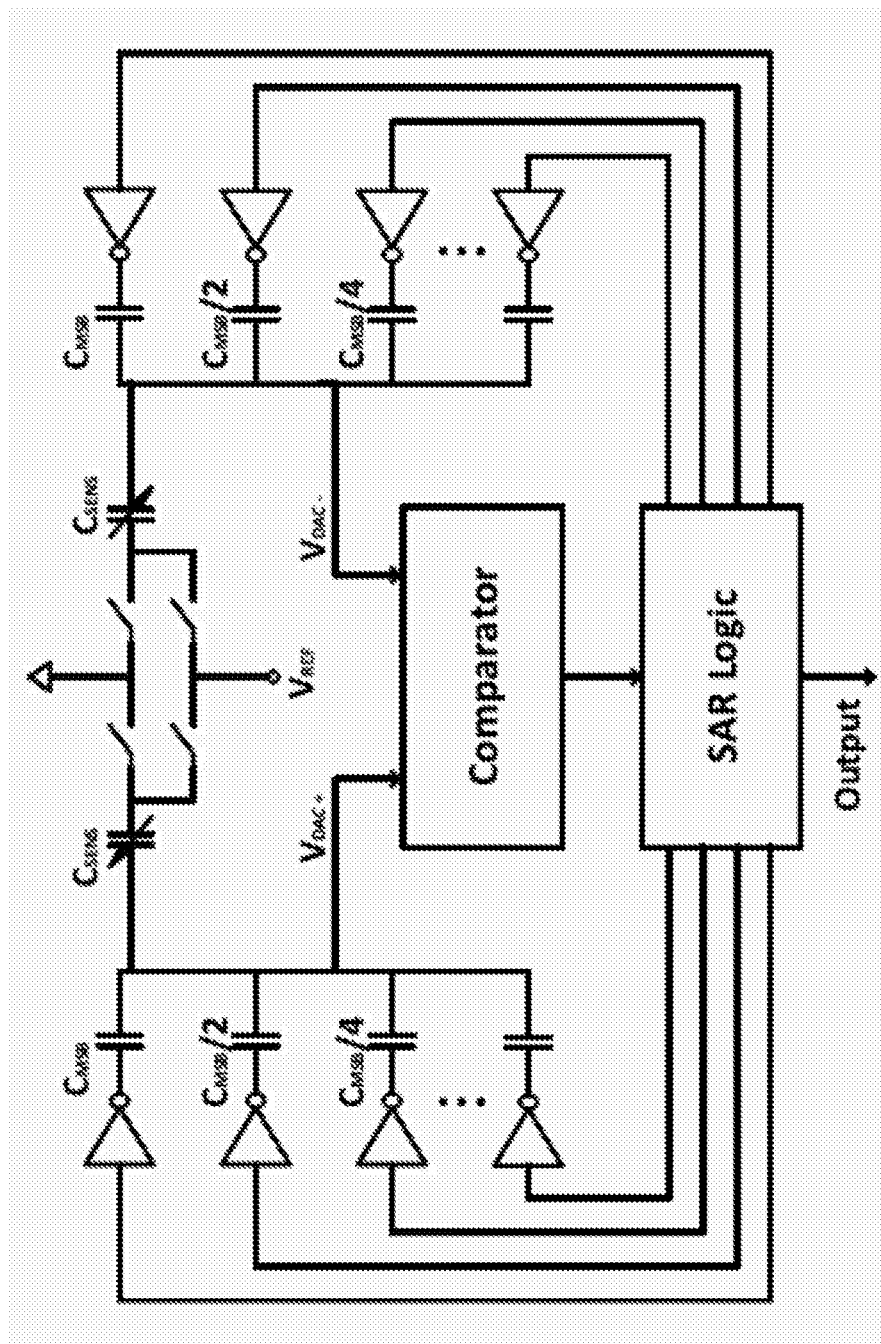
Figure 42:
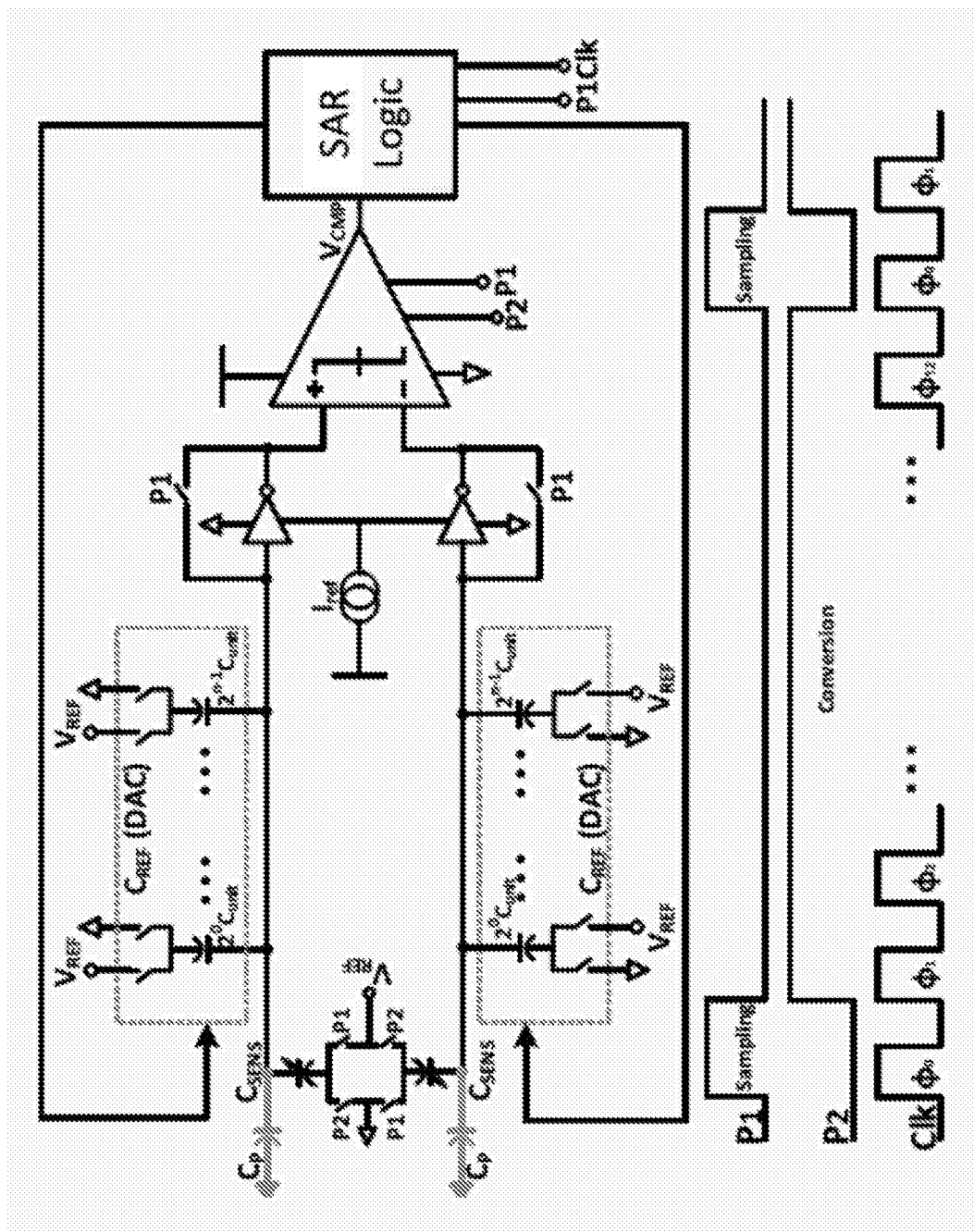
Figures 43A, 43B:
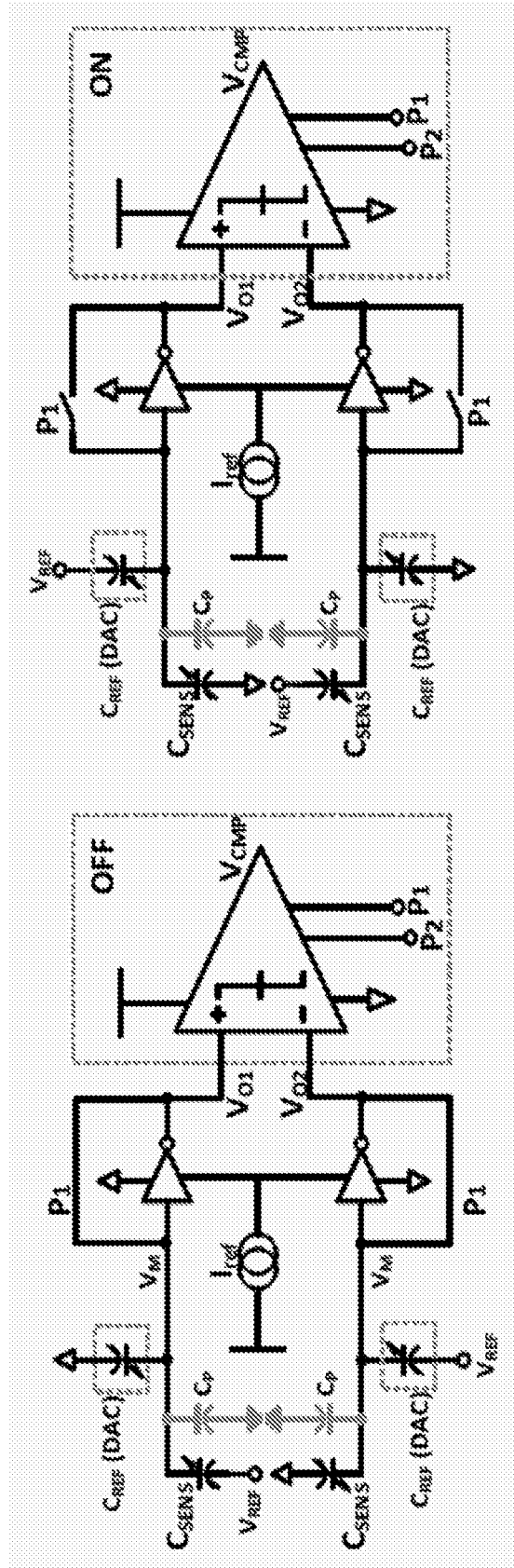
Figure 44A:
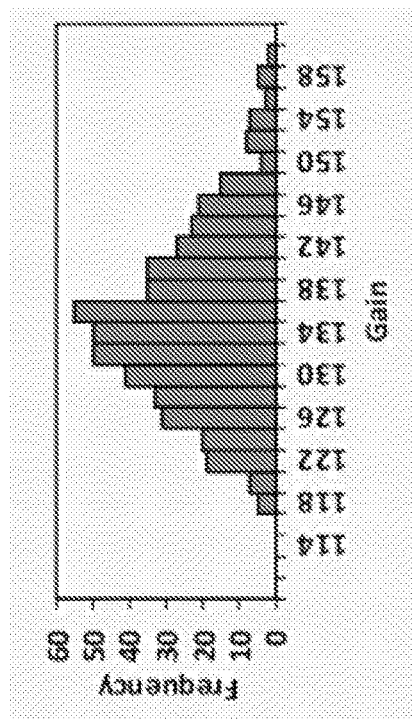
Figure 44B:
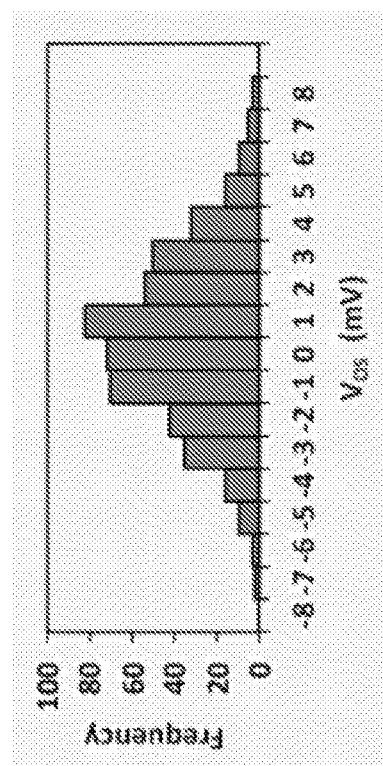
Figure 45:
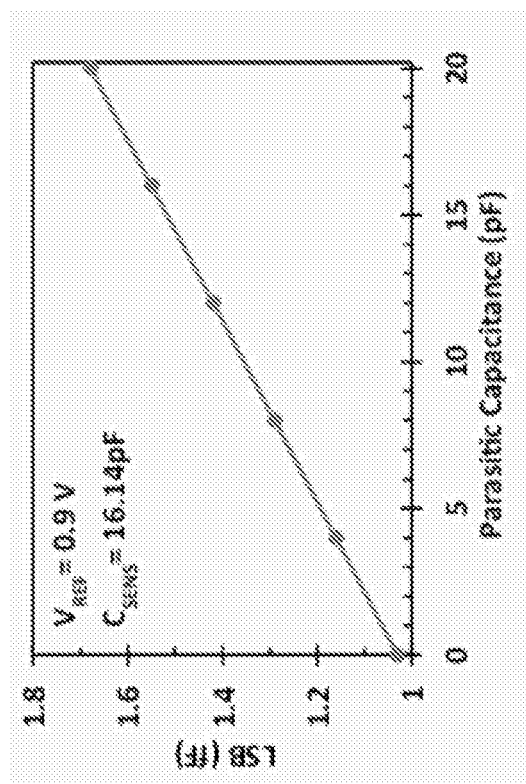
Figure 46:
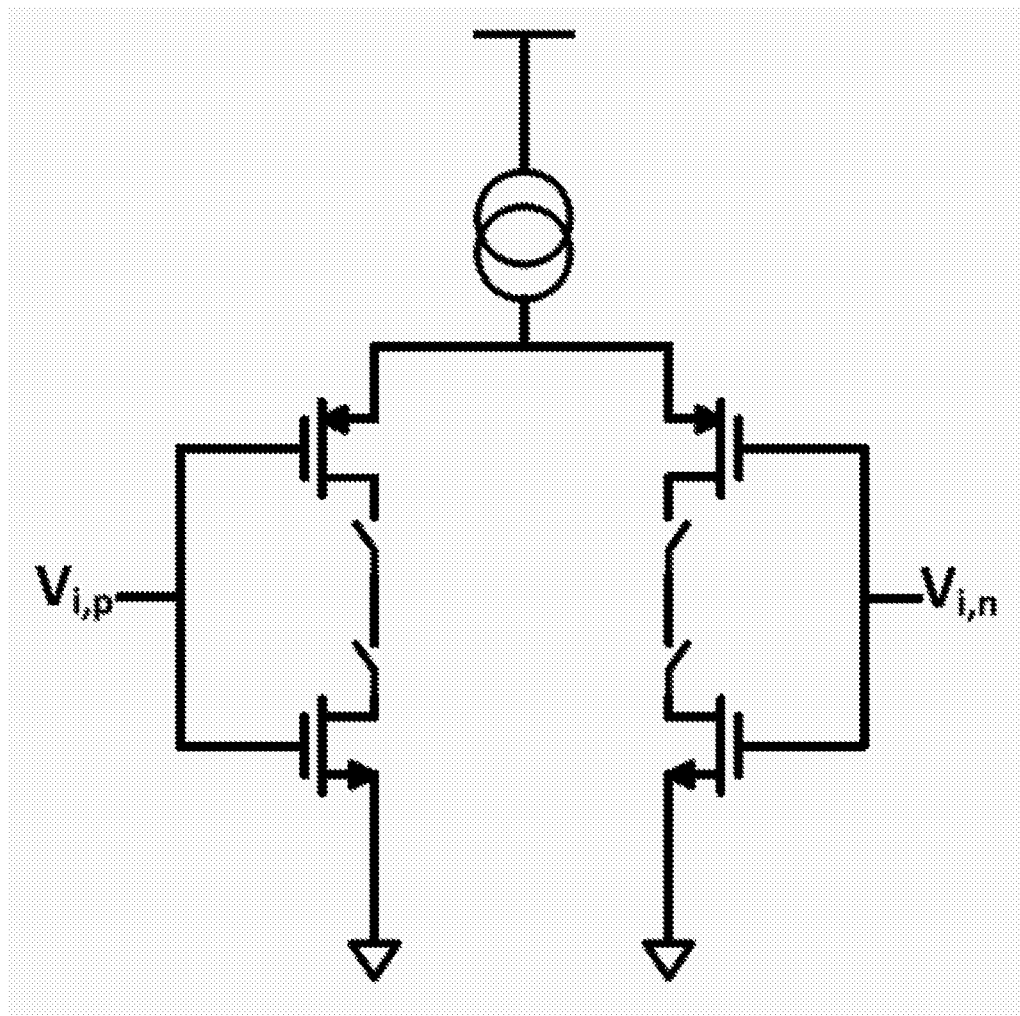
Figures 47A, 47B:
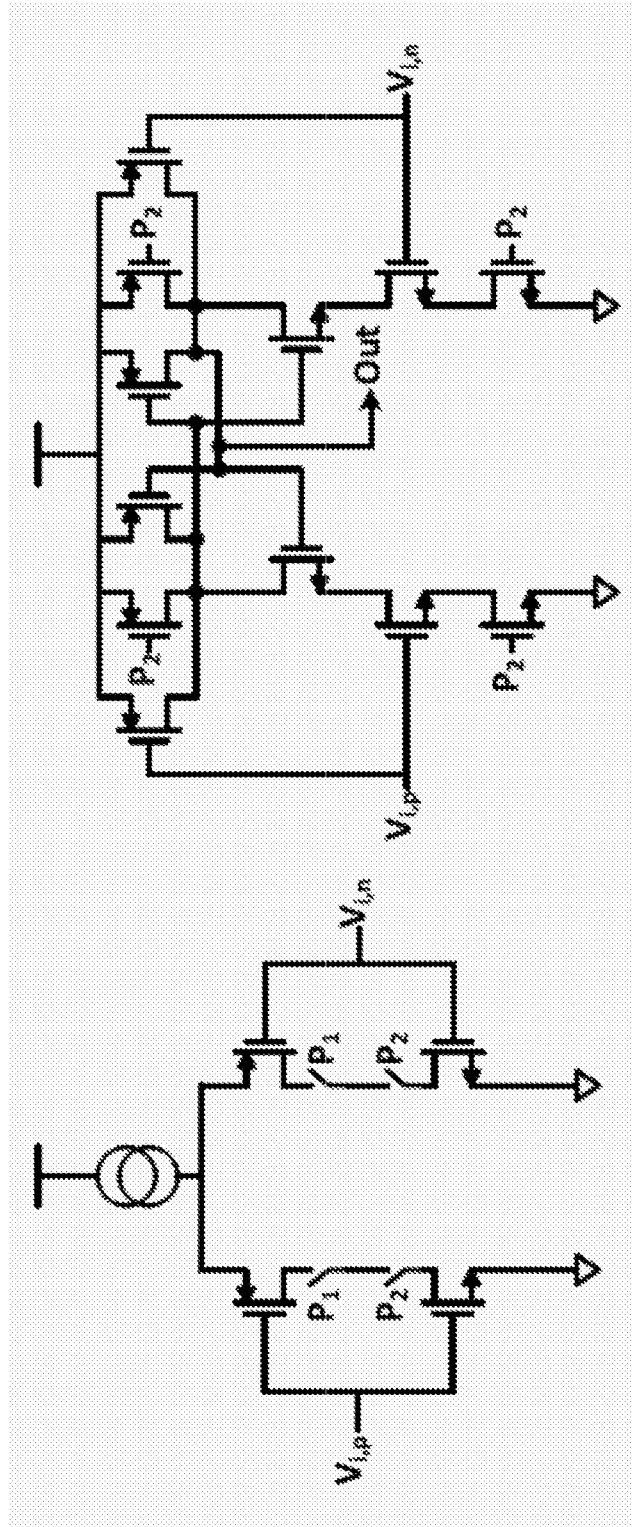
Figure 48:
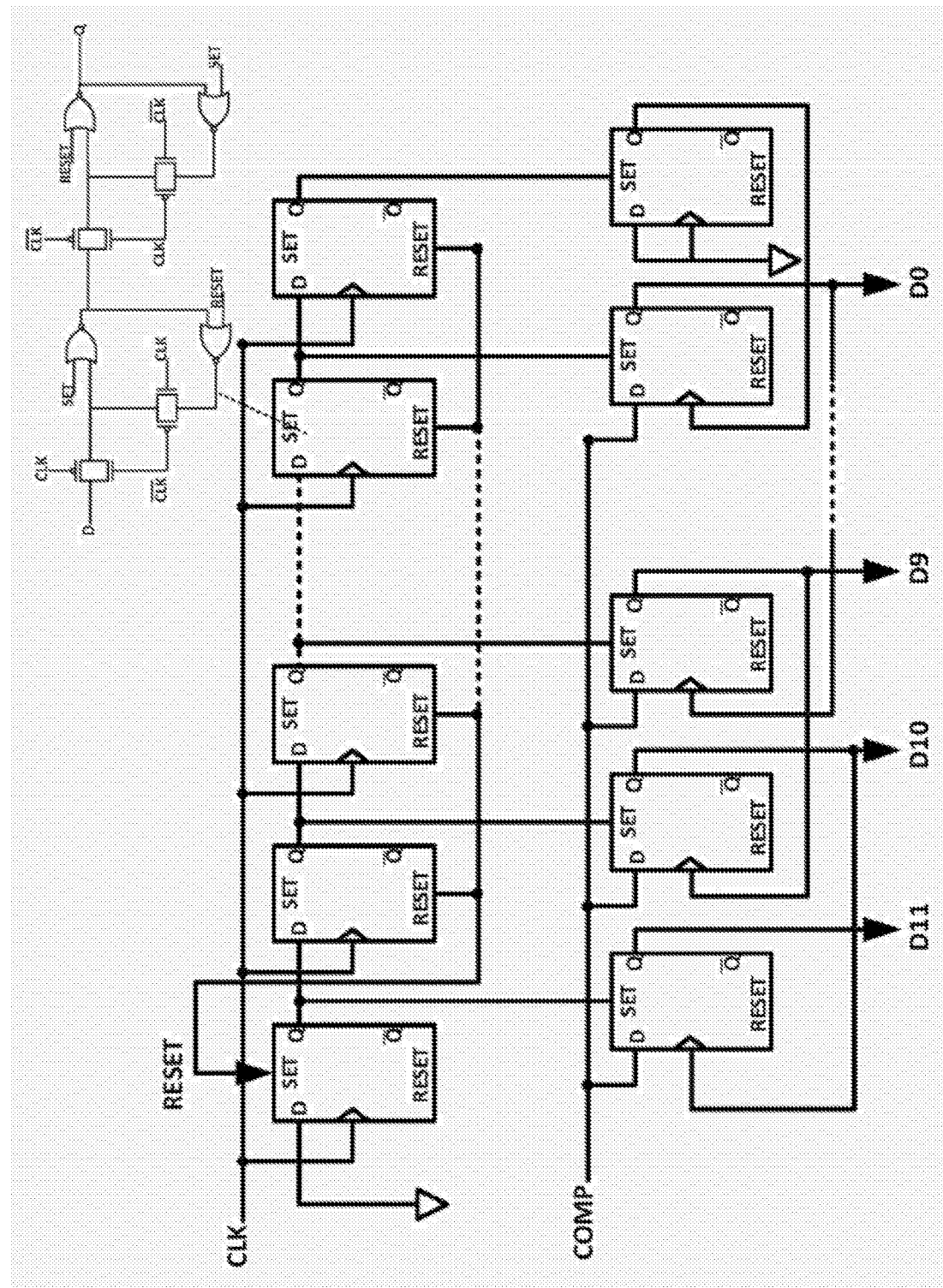
Figure 49:
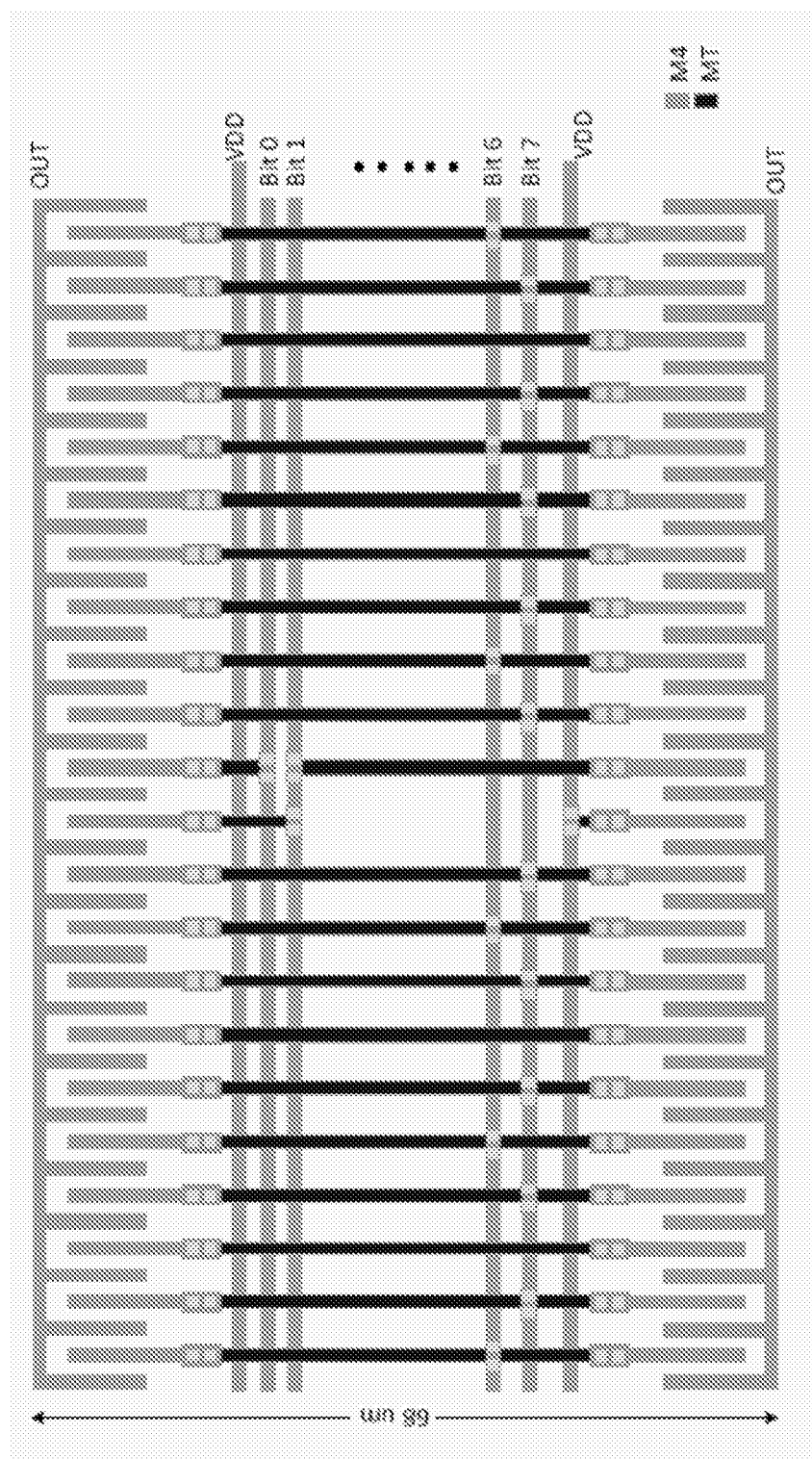
Figure 50:
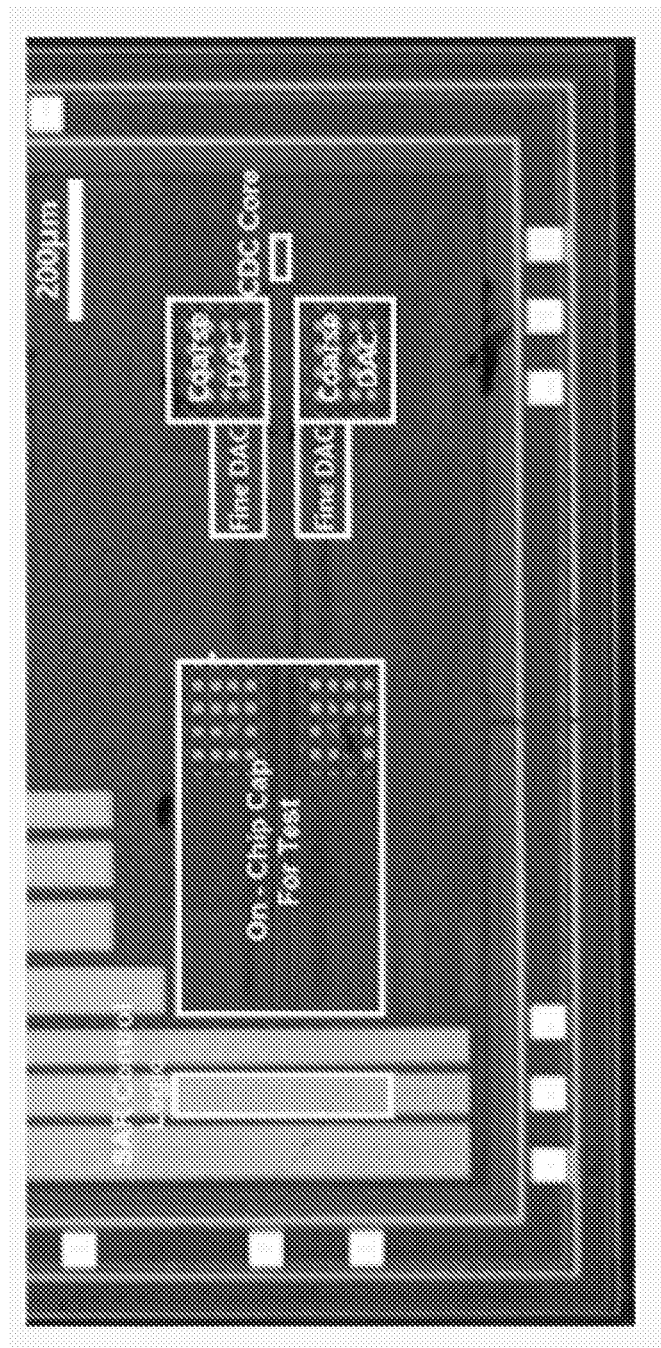
Figure 51A:
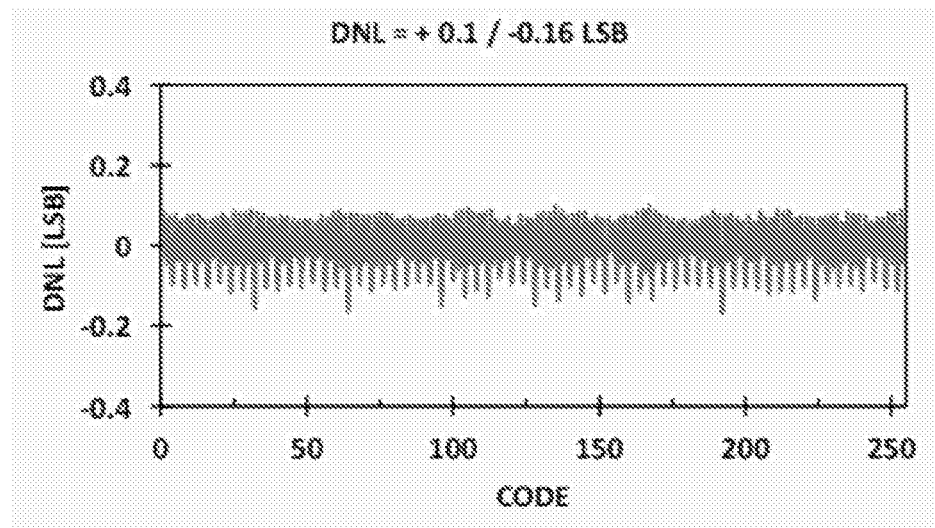
Figure 51B:
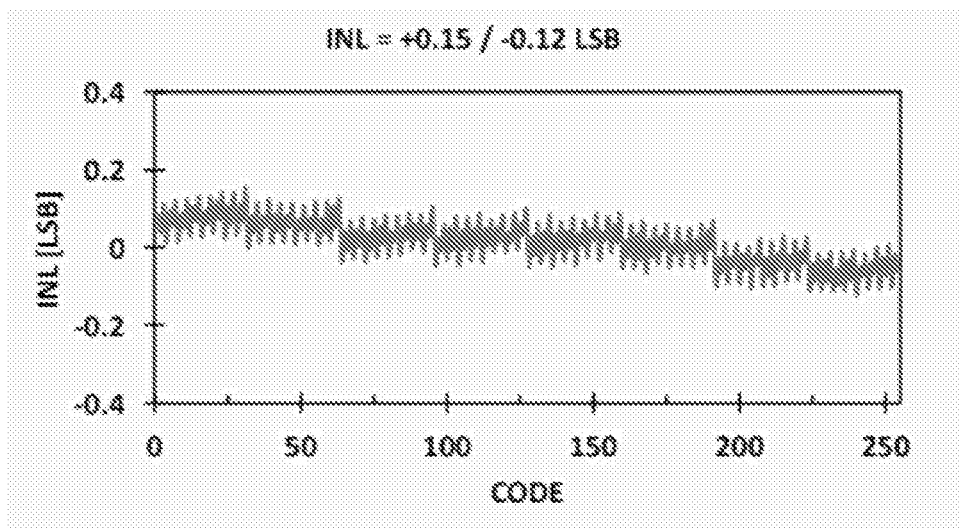
Figure 52A:
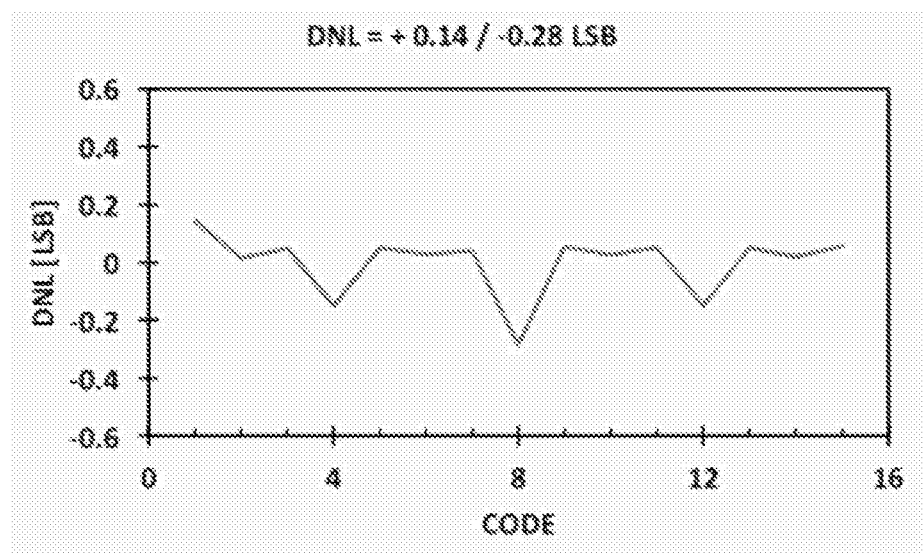
Figure 52B:
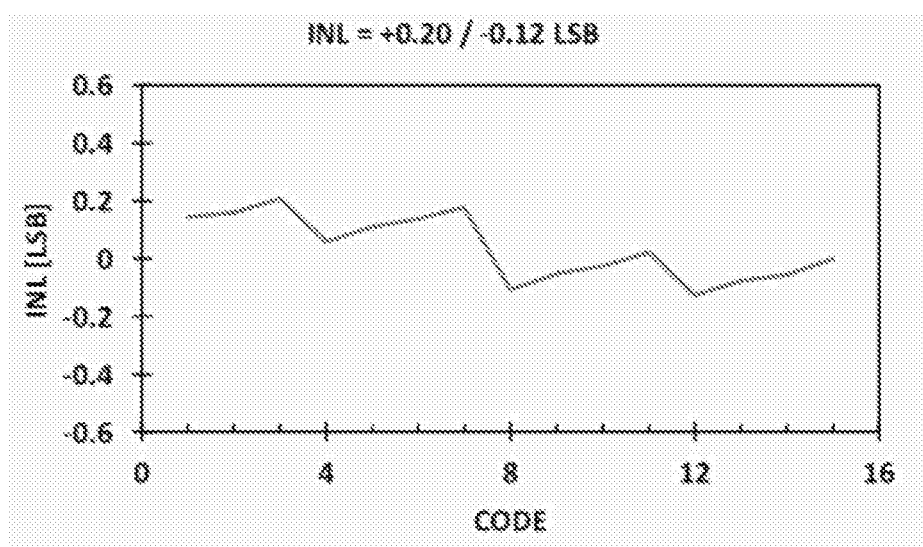
Figure 53:
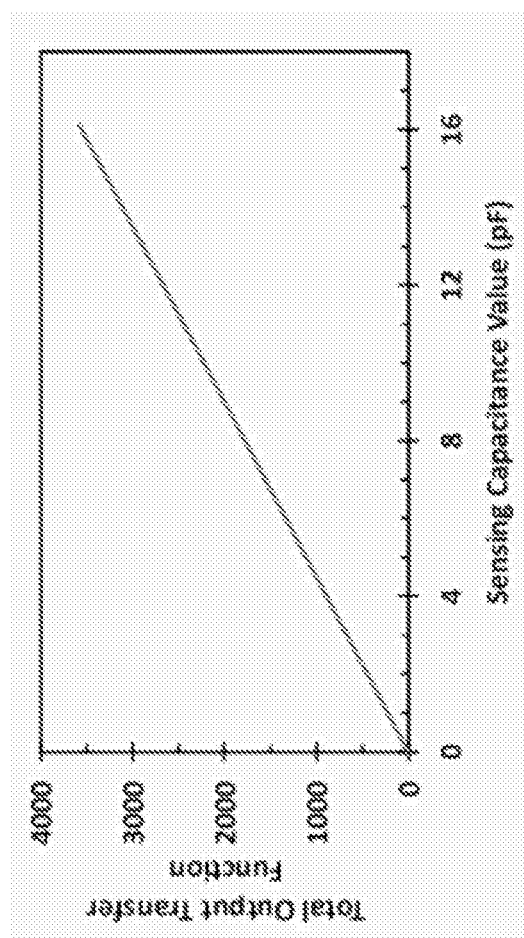
Figure 54:
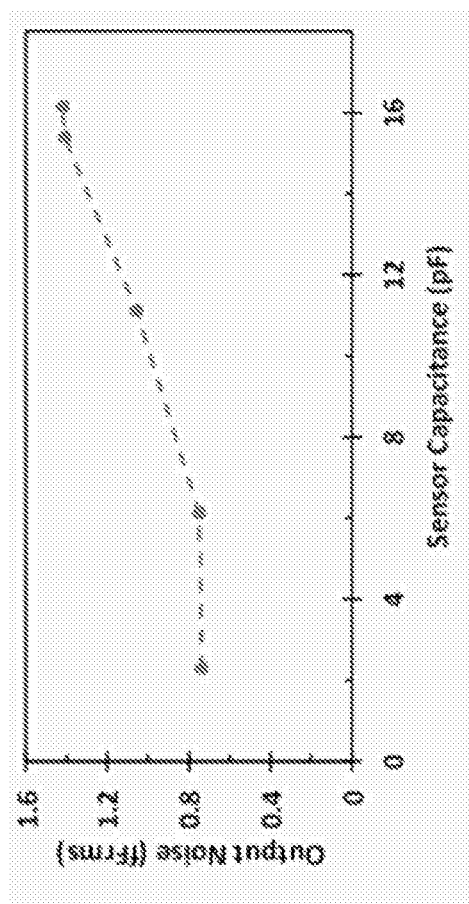
Figure 55:
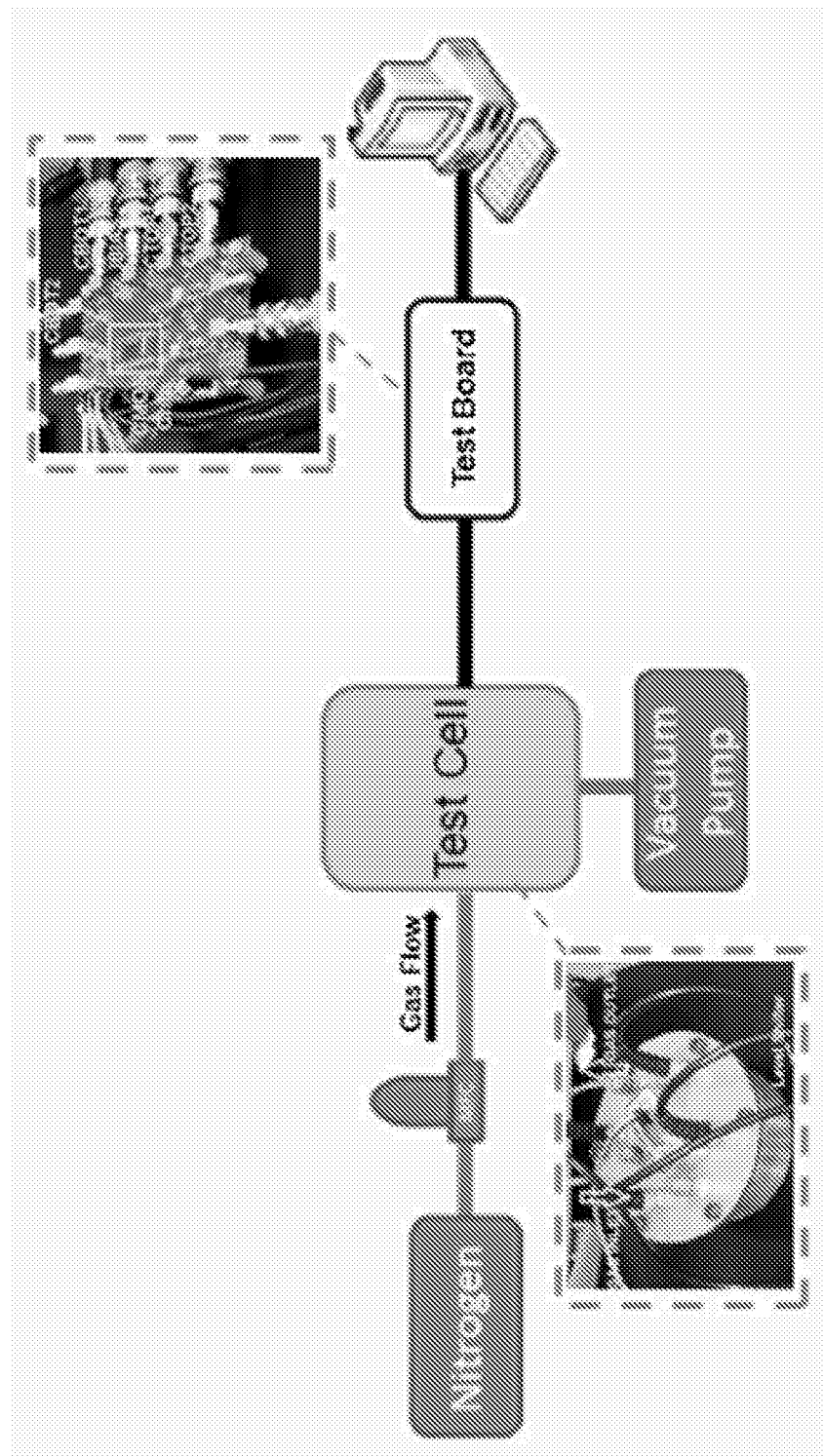
Figure 56A:
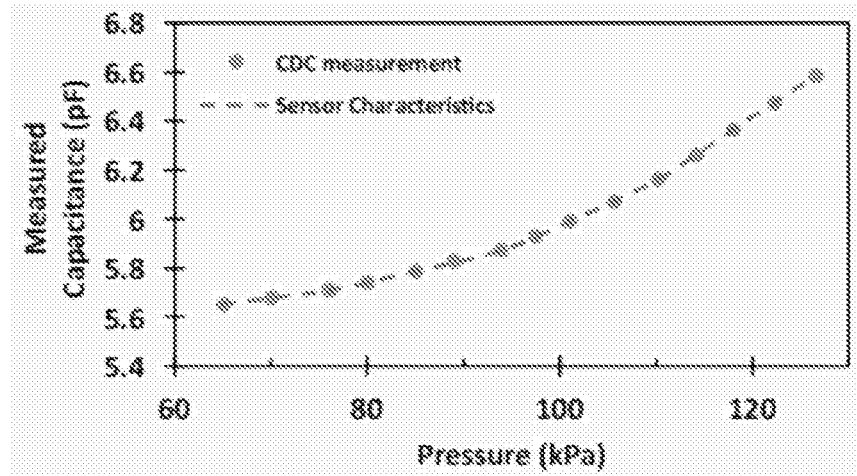
Figure 56B:
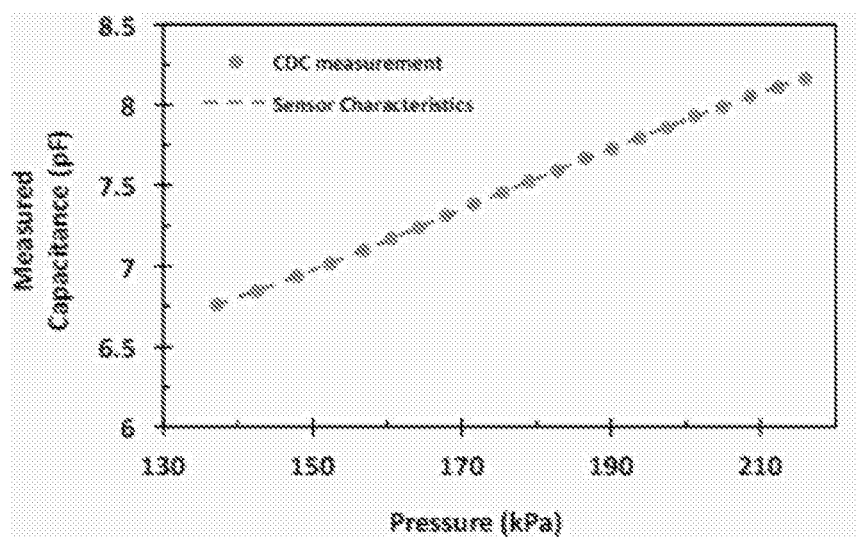
Figure 57:
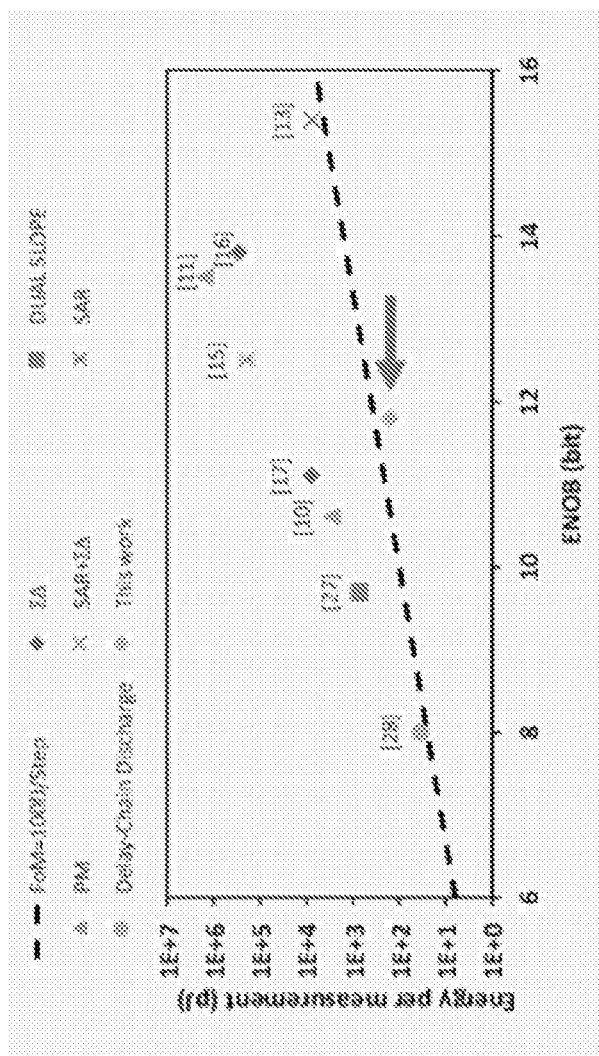

Having thus described certain example embodiments of the present disclosure in general terms, reference will now be made to the accompanying drawings, which are not necessarily drawn to scale, and wherein:

FIG. 1 illustrates a circuit schematic of op-amp-less SAR CDC;

FIG. 2 illustrates the operation and timing of a SAR CDC circuit;

FIG. 3 provides a graph plotting the maximum achievable resolution as a function of the ratio between $V_{DD}$ and $V_{os,rms}$ for an op-amp-less SAR CDC;

FIG. 4 illustrates a schematic of a two-point calibration circuit to cancel gain and offset errors;

FIG. 5 illustrates a circuit schematic of an op-amp-based SAR CDC;

FIG. 6 provides a graph plotting the maximum allowed feedback capacitance ($C_{F,max}$) as a fraction of $C_{FS}$ vs the interface resolution for $V_{DD}$=1V for a multi-stage op-amp-based SAR CDC;

FIG. 7 provides a graph plotting the minimum required gain vs resolution for a single-stage op-amp-based SAR CDC;

FIG. 8 illustrates a simplified inverter-based SAR CDC, in accordance with example embodiments described herein;

FIG. 9 illustrates possible transistor level implementations for inverter-based circuits in an inverter-based SAR CDC, in accordance with example embodiments described herein;

FIG. 10 illustrates a schematic diagram of a coarse-fine CDC using an inverter-based SAR CDC as the coarse stage, in accordance with example embodiments described herein;

FIG. 11 illustrates a 12—bit inverter-based SAR CDC, in accordance with example embodiments described herein;

FIG. 12 illustrates the operation and timing of a 12—bit inverter-based SAR CDC, in accordance with example embodiments described herein;

FIG. 13 illustrates a Monte Carlo simulation of the threshold voltage mismatch for a 12—bit inverter-based SAR CDC, in accordance with example embodiments described herein;

FIG. 14 provides a Monte Carlo simulation of the inverter gain for a 12—bit inverter-based SAR CDC, in accordance with example embodiments described herein;

FIG. 15A provides a graph illustrating the percent of energy consumed in I1, I2, and the rest of the stages in the inverter chain of a 12—bit inverter-based SAR CDC as calculated from transient simulation results, in accordance with example embodiments described herein;

FIG. 15B provides a graph illustrating the percent of energy consumed in I1 at different simulation corners, in accordance with example embodiments described herein;

FIG. 16 provides a schematic illustration of a latch comparator, in accordance with example embodiments described herein;

FIG. 17 illustrates a schematic of a differential inverter-based SAR CDC circuit, in accordance with example embodiments described herein;

FIG. 18 illustrates a timing diagram of an example SAR CDC, in accordance with example embodiments described herein;

FIG. 19 provides a graph illustrating the standard deviation of unit capacitor mismatch for several types of capacitors vs capacitance of a unit capacitor, in accordance with example embodiments described herein;

FIG. 20 provides a graph illustrating the maximum achievable mismatch-limited resolution vs capacitance of a unit capacitor, in accordance with example embodiments described herein;

FIG. 21 comprises a die photo of a fabricated inverter-based SAR CDC, in accordance with example embodiments described herein;

FIG. 22 provides a graph illustrating the measured DNL of two fine CapDACs vs fine CapDAC input code, in accordance with example embodiments described herein;

FIG. 23 provides a graph illustrating the measured INL of two fine CapDACs vs fine CapDAC input code, in accordance with example embodiments described herein;

FIG. 24 provides a graph illustrating the measured DNL of two coarse CapDACs vs coarse CapDAC input code, in accordance with example embodiments described herein;

FIG. 25 provides a graph illustrating the measured INL of two coarse CapDACs vs coarse CapDAC input code, in accordance with example embodiments described herein;

FIG. 26 provides a graph illustrating the non-linearity error of inverter-based SAR CDC conversion output vs emulated sensor capacitance using reference voltage sweep, in accordance with example embodiments described herein;

FIG. 27 provides a graph illustrating the measured conversion output of an inverter-based SAR CDC (normalized) vs dummy sensor capacitance, in accordance with example embodiments described herein;

FIG. 28 provides a graph illustrating the measured inverter-based SAR CDC output vs pressure of the test cell, where the MEMS pressure sensor is operated in barometric pressure mode, in accordance with example embodiments described herein;

FIG. 29 provides a graph illustrating the measured inverter-based SAR CDC output vs pressure of the test cell, where the MEMS pressure sensor is operated in high pressure mode, in accordance with example embodiments described herein;

FIG. 30 provides a graph illustrating the measured total power consumption for the inverter-based SAR CDC vs sensor capacitance, in accordance with example embodiments described herein;

FIG. 31 provides a graph illustrating the measured rms noise of the inverter-based SAR CDC conversion output vs sensor capacitance, in accordance with example embodiments described herein;

FIG. 32 provides a graph illustrating the deviation of inverter-based SAR CDC output code vs temperature, in accordance with example embodiments described herein;

FIG. 33 provides a graph illustrating the energy consumed per conversion cycle vs effective number of bits (ENOB) for state-of-the-art CDCs, in accordance with example embodiments described herein;

FIG. 34 provides a graph illustrating the energy efficiency FoM vs conversion sample rate for state-of-the-art CDCs, in accordance with example embodiments described herein;

FIGS. 35 and 36 provide graphs illustrating the measured DNL and INL of the SAR CDC vs equivalent sensor capacitance, in accordance with example embodiments described herein;

FIG. 37 illustrates a schematic diagram of an example pressure sensing test setup, in accordance with example embodiments described herein;

FIG. 38 provides a graph illustrating the worst case delay transient simulation results for inverter-based amplifier non-linear settling in which VOUT 1 to VOUT 5 are the outputs of the five stages in the chain, in accordance with example embodiments described herein;

FIG. 39 provides a graph illustrating the worst case delay transient simulation for ideal linear settling in which VOUT 1 to VOUT 5 are the outputs of the five stages in the chain, in accordance with example embodiments described herein;

FIG. 40 provides a graph illustrating a simulation result showing the variation of the inverter switching threshold ($V_M$) vs temperature, in accordance with example embodiments described herein;

FIG. 41 illustrates a proposed differential SAR CDC, in accordance with example embodiments described herein;

FIG. 42 illustrates a circuit-level depiction of the proposed differential SAR CDC circuit with an associated timing diagram, in accordance with example embodiments described herein;

FIGS. 43A and 43B illustrate schematic diagrams of the sampling phase of the proposed differential SAR CDC and the conversion phase of the proposed differential SAR CDC, respectively, in accordance with example embodiments described herein;

FIGS. 44A and 44B provide graphs illustrating Monte Carlo simulations involving the proposed differential SAR CDC for the DC gain and offset voltage, respectively, in accordance with example embodiments described herein;

FIG. 45 provides a graph illustrating a minimum achievable absolute resolution vs CP at full scale input capacitance for the proposed differential SAR CDC, in accordance with example embodiments described herein;

FIG. 46 illustrates an inverter-based operational transconductance amplifier (OTA) for the proposed differential SAR CDC, in accordance with example embodiments described herein;

FIG. 47A illustrates a preamplifier for use with a latch comparator, in accordance with example embodiments described herein;

FIG. 47B illustrates an example latch comparator, in accordance with example embodiments described herein;

FIG. 48 illustrates an example SAR architecture for the proposed differential SAR CDC, in accordance with example embodiments described herein;

FIG. 49 illustrates a partial layout of the fine capacitor array for the proposed differential SAR CDC, in accordance with example embodiments described herein;

FIG. 50 depicts a chip micrograph of an example of the proposed differential SAR CDC, in accordance with example embodiments described herein;

FIGS. 51A and 51B provide graphs illustrating the DNL and INL of fine DACs for the proposed differential SAR CDC, in accordance with example embodiments described herein;

FIGS. 52A and 52B provide graphs illustrating the DNL and INL of coarse DACs for the proposed differential SAR CDC, in accordance with example embodiments described herein;

FIG. 53 provides a graph illustrating a measured transfer function of an example of the proposed differential SAR CDC, in accordance with example embodiments described herein;

FIG. 54 provides a graph illustrating a measured noise output as a function of capacitance for the proposed differential SAR CDC, in accordance with example embodiments described herein;

FIG. 55 depicts an example test setup for pressure-sensing applications involving the proposed differential SAR CDC, in accordance with example embodiments described herein;

FIGS. 56A and 56B provides graphs illustrating the measured CDC output overlaid on capacitive sensor characteristics for low pressure mode and high pressure mode, respectively, in accordance with example embodiments described herein; and FIG. 57 provides a graph illustrating a comparison of the energy per measurement versus ENOB of published CDCs, in accordance with example embodiments described herein.

DETAILED DESCRIPTION

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The description below is organized as follows. First, an analysis is provided of the limitations of op-amp-less SAR CDCs, including a discussion of the requirements and trade-offs of op-amp-based SAR CDCs. Subsequently, a description of the operation of example embodiments of the contemplated inverter-based SAR CDC is provided. Thereafter, a discussion is provided of the maximum achievable resolution due to mismatch and the implementation of a hybrid course-fine capacitive digital-to-analog converter (Cap-DAC). Finally, measurement results are presented demonstrating improved effectiveness of the example inverter-based SAR CDCs described herein.

Successive Approximation CDC

A. Circuit Operation

The schematic of op-amp-less SAR CDC is shown in FIG. 1, where $C_S$ is the unknown sensor capacitor, $C_R$ is a reference capacitor implemented as an N—bit binary weighted CapDAC, and $C_P$ models the parasitic capacitance. $C_S$, $C_{DAC}$, and $C_P$ are typically in the picofarad range. The circuit operation is divided into two phases, namely, the reset phase and the conversion phase. During the reset phase, $V_X$ is connected to $V_{CM}$, while the bottom plate of $C_S$ is connected to $V_{DD}$ and the bottom plates of all elements of $C_R$ are connected to $V_{SS}$. The charge stored in this phase is given by $$Q_1 = C_S(V_{CM} - V_{DD}) + C_{DAC}V_{CM} + C_P V_{CM}. \quad (1)$$

Next, in the conversion phase, $V_X$ is floating, the bottom plate of $C_S$ is connected to $V_{SS}$, and the bottom plates of $C_{DAC}$ elements are either connected to $V_{DD}$ or $V_{SS}$ depending on the N—bit SAR logic output ($B_{N-1:0}$), where the equivalent capacitance of the elements connected to $V_{DD}$ and $V_{SS}$ are denoted as $C_{DAC,ON}$ and $C_{DAC,OFF}$, respectively. The charge stored in this phase is given by $$Q_2 = C_S V_X + C_{DAC,ON}(V_X - V_{DD}) + C_{DAC,OFF} V_X + C_P V_X. \quad (2)$$

Since charge is conserved from equations (1) and (2), the differential voltage at the comparator input terminals (ΔV) can be written as $$\Delta V = \frac{C_S - C_{DAC,ON}}{C_{IN}} \cdot V_{DD} + V_{os,cmp}, \quad (3)$$

where $V_{os,cmp}$ is the comparator offset voltage, and $C_{IN}$ is the total input capacitance connected to $V_X$ (i.e., $C_{IN} = C_S + C_{DAC} + C_P$). Equation (3) can be rewritten as $$\Delta V = \frac{(C_S + C_{err}) - C_{DAC,ON}}{C_{IN}} \cdot V_{DD}, \quad (4)$$

where $C_{err}$ is the capacitance error due to offset voltage and is given by $$C_{err} = \frac{V_{os,cmp}}{V_{DD}} \cdot C_{IN}. \quad (5)$$

Based on the comparator output ($V_{CMP}$), the logic in the feedback loop uses a SAR algorithm to change the digital input of $C_{DAC}$ until ΔV is minimized, i.e., $C_{DAC,ON}$ is matched to ($C_S + C_{err}$) within the resolution of the smallest unit capacitor in the CapDAC ($C_{LSB}$) (i.e., the least significant bit (LSB)).

B. Offset Error Limitation

As given by equation (5), the comparator offset voltage manifests itself as a capacitance conversion error which is a function of $C_S$, $C_P$, and $V_{DD}$ (i.e., it leads to an error that depends on the sensor capacitor and the parasitics). This is unlike the case of a SAR ADC where the capacitance is constant and the input signal is an analog voltage. In order to limit the conversion error due to the comparator offset to one LSB, the peak-to-peak value of $C_{err}$ needs to be less than $C_{LSB}$. Thus, noting that $V_{os,cmp}$ is a statistical variable, for a three-sigma yield of 99.73% the condition satisfying this requirement is $$C_{LSB} > \frac{6 V_{os,rms}}{V_{DD}} \cdot C_{IN}, \quad (6)$$

where $V_{os,rms}$ is the rms offset voltage.

Generally, $C_S$ is an off-chip capacitive sensor; thus, node $V_X$ is associated with a large parasitic capacitance due to the pads and the bondwire, in addition to the parasitic capacitance of the CapDAC elements. Assuming that the interface is required to handle a parasitic capacitance as large as the full-scale sensor capacitor ($C_{FS}$), the maximum input capacitance is $C_{IN,max} \approx 3 C_{FS}$. Thus, substituting in equation (6), the offset-limited achievable resolution (R) in bits can be written as $$R = \log_2 \frac{C_{FS}}{C_{LSB}} < \log_2 \frac{V_{DD}}{V_{os,rms}} - 4.17, \quad (7)$$

where the maximum achievable resolution ($R_{max}$) is a function of the ratio between $V_{DD}$ and $V_{os,rms}$ regardless of the full-scale capacitance. $R_{max}$ is plotted in FIG. 3, where it can be noticed that the achievable resolution is very poor especially for low supply voltage (e.g., only ≈4.8—bit resolution is achievable for $V_{os,rms} = 2$ mV and $V_{DD} = 1$V).

An alternative way to handle the conversion error given by equation (5) is to divide it into three components, where the component proportional to $C_S$ is treated as a gain error and the component proportional to $C_{DAC}$ is treated as an offset error. In order to cancel these gain and offset errors, a two-point auto-calibration scheme can be used. The schematic of the calibration circuit is shown in FIG. 4, where on-chip switches are used to enable performance of the following three measurements: ($C_S + C_O$), ($C_R + C_O$), and $C_O$, where $C_R$ and $C_O$ are on-chip reference capacitors. The ideal ratiometric output ($\mu_{ideal}$) is then given by $$\mu_{ideal} = \frac{(C_S + C_O) - C_O}{(C_R + C_O) - C_O} = \frac{C_S}{C_R}. \quad (8)$$

when is considered, the ratiometric output (μ) is approximately given by $$\mu \approx \frac{C_S}{C_R}\left(1 + \frac{V_{os,cmp}}{V_{DD}}\left(\frac{C_{P1} - C_{P3}}{C_S} - \frac{C_{P2} - C_{P3}}{C_R}\right)\right), \quad (9)$$

where $C_{P1}$, $C_{P2}$, and $C_{P3}$ are the parasitic capacitors associated with the three aforementioned measurements, respectively.

Equation (9) reveals that the gain and offset errors due to $C_S$ and $C_{DAC}$ will be canceled; however, the third error component due to $C_P$ will not be canceled, because the parasitic capacitance associated with each measurement is different. Moreover, $C_P$ constitutes parasitic capacitances of the switches, IO pad, and ESD circuitry, which are not stable. In addition, the off-chip parasitic capacitance can drift due to humidity, mechanical stress, and temperature. Hence, by using two-point calibration, the condition on maximum tolerable error is reduced by a factor of three, which translates to an increase of 1.6-bit in the offset-limited resolution. However, the achievable resolution is still limited to the low-resolution range. Moreover, the price paid for the calibration is tripling the conversion time (i.e., a three-fold degradation in energy efficiency).

Digital offset compensation techniques can be used to reduce the offset of a low-power dynamic comparator; however, It should be noted that even if comparator offset calibration techniques are employed, the residual offset voltage can still be as large as several millivolts. In order to overcome this offset error limitation, it is necessary to use an analog offset cancellation technique. Since a large input capacitance already exists, input offset storage can be used where the offset voltage is stored on the input capacitance during the reset phase (i.e., auto-zeroing). An example op-amp-based solution is discussed in the following subsection.

SAR CDC Using Inverter-Based Amplifier

The circuit schematic of an example 12—bit inverter-based SAR CDC is shown in FIG. 11, where the op-amp acts as a charge amplifier stage between the switched capacitor network and the comparator. The operation and timing of the circuit is as shown in FIG. 12. For an infinite gain op-amp, the op-amp offset voltage is stored in the input and feedback capacitors during the reset phase and canceled from the output during the conversion phase. For a finite gain op-amp, a residual offset error will remain. Assuming the op-amp has finite gain, the differential voltage at the comparator input terminals ($\Delta V$) in the conversion phase is given by $$\Delta V \approx \frac{(C_S - C_{DAC,ON})V_{DD} + C_F V_{os,cmp} + \frac{C_{IN}}{A_o}(V_{os,op} + V_{os,cmp})}{C_F + \frac{C_{IN}}{A_o}}, \quad (10)$$

where $A_o$ is the op-amp open-loop gain and $V_{os,op}$ is the op-amp offset voltage. Equation (10) can be rewritten as $$\Delta V = \frac{(C_S + C_{err}) - C_{DAC,ON}}{C_F + \frac{C_{IN}}{A_o}} \cdot V_{DD}, \quad (11)$$

where $C_{err}$ is given by $$C_{err} = \frac{V_{os,cmp}}{V_{DD}} \cdot C_F + \frac{V_{os,op} + V_{os,cmp}}{V_{DD}} \cdot \frac{C_{IN}}{A_o}. \quad (12)$$

The amplifier can be implemented as a high-gain multi-stage internally-compensated op-amp or as a single-stage load-compensated op-amp. Each implementation leads to different design considerations as will be discussed in the following subsections.

1) Using a Multi-Stage Op-amp: The intrinsic gain of the transistor continues to degrade as the technology feature-size is scaled down. Thus, in order to achieve high-gain, a multi-stage amplifier is required. However, in order to ensure closed-loop stability, multistage amplifiers typically require internal compensation using Miller or nested-Miller techniques, which degrades the amplifier energy efficiency. Assuming a multi-stage high-gain amplifier with $A_o \gg C_{IN}/C_F$, the conversion error in equation (12) is approximately given by $$C_{err} \approx \frac{V_{os,cmp}}{V_{DD}} \cdot C_F, \quad (13)$$

The conversion error is an offset error that is independent of $C_S$ and $C_P$ and can be eliminated by calibration. However, noting that the offset voltage can vary due to temperature and aging, the peak-to-peak value of this component can be limited to one LSB without the need for calibration. The condition satisfying this requirement for a three-sigma yield is given by $$C_F < \frac{V_{DD}}{6V_{os,rms}} \cdot C_{LSB}. \quad (14)$$

Thus, a small absolute resolution ($C_{LSB}$) necessitates a small feedback capacitance ($C_F$). A typical internally compensated op-amp has fixed gain-bandwidth product (i.e., fixed unity-gain frequency $\omega_u$), thus a small $C_F$ will result in a large closed-loop gain and a small closed-loop bandwidth during the conversion phase. Using equation (14), the maximum allowed feedback capacitance ($C_{F,max}$) as a fraction of $C_{FS}$ is plotted in FIG. 6 vs the interface resolution for $V_{DD}=1V$, where it can be noticed that $C_{F,max}$ is a small fraction of $C_{FS}$.

The readout circuit will be slow during the conversion phase due to the large closed-loop gain, which degrades the interface circuit energy efficiency. In addition, because $C_{IN}$ can be very large, in order to ensure closed-loop stability while in unity-gain feedback during the reset phase, the internal compensation capacitor ($C_C$) must be large. In addition to the area penalty, increasing $C_C$ incurs an increase in power consumption to maintain a given gain-bandwidth product. Moreover, large current must be consumed in the output stage of the amplifier to split the poles and maintain an adequate phase margin. Thus, the energy efficiency of the readout circuit is further degraded.

2) Using a Single-Stage Op-amp: Op-amp-less SAR CDCs suffer from poor offset-limited resolution. On the other hand, an op-amp-based implementation that uses a high-gain multi-stage op-amp solves the offset error limitation at the expense of energy efficiency. An implementation that uses relatively low-gain single-stage op-amp can overcome the offset error limitation without sacrificing the interface energy efficiency.

For an internally compensated op-amp with a fixed $\omega_u$, using the maximum allowed feedback capacitance during the conversion phase is desirable as this trades-off the closed-loop gain for the closed-loop bandwidth. However, for a load-compensated op-amp the speed limitation is during the reset phase where the op-amp is loaded by $C_{IN}$. On the other hand, during the conversion phase, the op-amp is only loaded with the small parasitic capacitance at $V_{OUT}$. Thus, during the conversion phase, the amplifier can be operated in open-loop with the capacitive feedback eliminated. Substituting $C_F=0$ in equation (10), the comparator differential input can be written as $$\Delta V \approx \frac{(C_S + C_{err}) - C_{DAC,ON}}{C_{IN}/A_o} \cdot V_{DD}, \qquad (15)$$

and the capacitance conversion error ($C_{err}$) reduces to $$C_{err} = \frac{V_{os,op} + V_{os,cmp}}{V_{DD}} \cdot \frac{C_{IN}}{A_o}, \qquad (16)$$

where the conversion error depends on $C_S$ and $C_P$ (i.e., the conversion error is a signal-dependent and parasitic-dependent error).

Equation (16) shows that the conversion error is still dependent on the sensor and parasitic capacitance. However, by properly selecting the inverter gain, the required conditions on $C_{err}$ can be satisfied. To limit the peak-to-peak value of $C_{err}$ to one LSB, the condition on the amplifier open-loop gain for a three-sigma yield is given by $$A_o > \frac{18 V_{os,rms}}{V_{DD}} \cdot 2^R, \qquad (17)$$

where $V_{os,rms} = \sqrt{V_{os,op,rms}^2 + V_{os,cmp,rms}^2}$ and $C_{IN} = C_{IN,max} \approx 3 C_{FS}$. Using equation (17), the minimum required gain ($A_{o,min}$) is plotted vs R in FIG. 7. When $V_{DD}=1$V, $V_{os,rms}=2$ mV, and R=12—bit, the minimum open-loop gain is less than 44 dB, which can be achieved using a single-stage amplifier without sacrificing interface energy efficiency.

Inverter-Based SAR CDC

As described above, an op-amp-based SAR CDC that uses a single-stage op-amp can be insensitive to the offset-induced errors without sacrificing the energy efficiency. To further improve the energy efficiency of the interface, however, example embodiments contemplated herein utilize an inverter-based circuit as the op-amp. In an inverter-based amplifier, both the PMOS and NMOS transistors contribute to the transconductance of the amplifier. Thus, for the same bias current, the transconductance, and consequently the energy efficiency, of the inverter-based amplifier is doubled.

One example implementation of an inverter-based SAR CDC is shown in FIG. 8, where the inverter serves as an amplifier and a comparator. In addition, the inverter threshold voltage ($V_M$) establishes the circuit common mode voltage ($V_{CM}$). Alternatively, an external common mode/reference voltage may be used instead of the inverter threshold voltage.

In some embodiments, the capacitor $C_{OS}$ stores the offset voltage due to the mismatch between the inverters (auto-zero) when the feedback switch across the first and second inverters is closed. In other embodiments, the inverter is designed so that the offset voltage does not affect the operation and both the capacitor ($C_{OS}$) and the second inverter feedback switch are omitted. It should be understood that the number of inverters used can vary depending on circuit requirements and inverter characteristics. In some embodiments, a latch stage may be used at the end of the chain to provide fast and strong zero or one for the SAR logic without consuming static power. Embodiments of the inverter-based SAR CDC contemplated herein can be built using any configuration of inverter-based circuits, including, but not limited to, single ended input single ended output (as shown in FIG. 8), differential input single ended output, and differential input differential output.

For normal operation, $V_{R1}$ and $V_{R2}$ (see FIG. 8) may be equal. Alternatively, $V_{R1}$ and $V_{R2}$ can be controlled by a digital-to-analog converter (DAC) in order to provide wider dynamic range or finer absolute resolution.

The transistor level implementation of the inverter-based circuits used in the SAR CDC can take different forms. Some possible implementations are shown in FIG. 9, which illustrates, from left to right, a simple inverter, a current-starved inverter, a cascode inverter, and a fully differential cascode inverter. The inverter-based amplifier can also be clocked or selectively enabled.

Additionally or alternatively, to achieve a compromise between absolute resolution and silicon area, an example inverter-based SAR CDC can itself be a coarse stage that is then followed by another fine stage CDC. As shown in FIG. 10, the residual error between $C_S$ and $C_{DAC}$ can be extracted from the inverter-based SAR CDC and further converted by a fine conversion stage. The fine conversion stage can then be implemented using different conversion architectures (e.g., an integrating converter or a sigma-delta converter).

Having described, generally, example architectures for measuring sensor response and converting that response to digital code, two examples are provided below. The first example illustrates a design utilizing a single-ended sensor mechanism, while the second example illustrates a design utilizing a differential sensor mechanism.

Example of a Single-Ended Cascode Inverter-Based SAR CDC Implementation

The schematic of an example 12—bit inverter-based SAR CDC is shown in FIG. 11, in which five stages of inverter amplifiers are used followed by a clocked latch comparator. The first inverter (I1) acts as a charge amplifier, and the remaining inverters (I2 to I5) act as open-loop pre-amplifiers for the latch comparator. An inverter-based amplifier is inherently energy-efficient because both the PMOS and NMOS transistors contribute to the transconductance; thus, for the same bias current, the transconductance of the amplifier, and consequently the energy efficiency, is doubled.

During the reset phase, only I1 is enabled, while I2 to I5 are disabled. $\Phi_1$ is HIGH (i.e., the feedback switch is closed) and both $V_X$ and $V_{OUT}$ are equal to the switching threshold voltage of the first inverter stage I1 ($V_{M1}$), not to be confused with the transistor threshold voltage. The inverter threshold voltage ($V_M$) is the trip-point voltage at the middle of the inverter transfer characteristics. This inverter built-in voltage $V_M$ replaces the common mode voltage ($V_{CM}$) that is used in the circuits of FIG. 1 and FIG. 5 (i.e., the circuit is operated with the supply voltage only, and without the need for an additional reference voltage), thus reducing power consumption and complexity of support circuits. FIG. 12 illustrates the operation and timing of the example 12—bit inverter-based SAR CDC of FIG. 11. The switching threshold of I1 ($V_{M1}$) is stored on the input capacitance; thus, the offset voltage of the first inverter stage is canceled (i.e., auto-zeroing).

During the conversion phase, the remaining inverter stages (I2 to I5) are enabled, the feedback switch is open, and the stored charge is redistributed according to the CapDAC digital input. Applying charge conservation, the output of I1 is $$V_{OUT} = V_{M1} + \frac{C_S - C_{DAC,ON}}{C_{IN}/A_o} \cdot V_{DD}, \quad (18)$$

where $A_o$ is the open-loop gain of the inverter-based amplifier. The delta input of I2 is the deviation of $V_{OUT}$ from the switching threshold of I2 ($V_{M2}$); thus, it is given by $$\Delta V = \frac{(C_S + C_{err}) - C_{DAC,ON}}{C_{IN}/A_o} \cdot V_{DD}, \quad (19)$$

where the capacitance conversion error ($C_{err}$) is given by $$C_{err} \approx \frac{V_{os}}{V_{DD}} \cdot \frac{C_{IN}}{A_o}, \quad (20)$$

where in this case the offset voltage ($V_{OS}$) is equal to ($V_{m1} - V_{m2}$) (i.e., the offset voltage is the mismatch between the threshold voltages of I1 and I2). The mismatch in the switching thresholds of subsequent inverter stages is not important, as the signal will already be amplified by I1 and I2. In contrast to equation (5), the conversion error given by equation (20) is a function of the gain of the inverter; thus, the inverter gain is the design knob that can be used to achieve the required resolution.

Equation (20) shows that the conversion error is still dependent on the sensor and parasitic capacitance. However, by properly selecting the inverter gain, the required conditions on $C_{err}$ can be satisfied. To limit the peak-to-peak value of $C_{err}$ to one LSB, the condition on the amplifier open-loop gain for a three-sigma yield is given by $$A_o > \frac{18 V_{os,rms}}{V_{DD}} \cdot 2^R. \quad (21)$$

Monte Carlo simulation of the threshold voltage mismatch is shown in FIG. 13, where the rms offset voltage ($V_{os,rms}$) is ≈2 mV. For R=12—bit, $V_{DD}$=0.8V, and $V_{os,rms}$=2 mV, the minimum required gain is ≈185. In order to satisfy this requirement, the inverter gain is increased by implementing each inverter in the chain as a cascode stage, such as one of the cascode inverters shown in FIG. 9. A Monte Carlo simulation of the inverter gain is shown in FIG. 14, where the nominal gain is ≈471 and the standard deviation is ≈70; thus, the minimum gain requirement is achieved with a decent margin under process variations.

During the reset phase, I1 is biased at its threshold voltage ($V_{M1}$) and the maximum drain current is drawn. In some embodiments, in order to save power only I1 is enabled during the reset phase, while I2 to I5 are disabled. During the conversion phase, I2 to I5 are then enabled as shown in FIG. 7. The addition of multiple gain stages (I2 to I5) has negligible impact on power consumption because during the conversion $V_{OUT}=V_{M1}+\Delta V$, where $\Delta V$ is given by equation (18); thus, either the pull-up PMOS or the pull-down NMOS transistors in I2 and subsequent stages will be biased in the subthreshold region and thus dissipating negligible current. This is further illustrated in FIG. 15, which shows the percent of energy consumed in I1, I2, and the rest of the stages in the inverter chain as calculated from transient simulation results. The first four clock cycles are dedicated to the reset phase to allow for settling when loaded by the large $C_{IN}$, followed by twelve clock cycles in the conversion phase (i.e., a total of 16 cycles for a single conversion). During the reset phase, energy consumed in I1 increases at its maximum rate, while I2 to I5 are disabled. Next, in the conversion phase, I1 energy gradually increases at an accelerating rate as Vis successively approximated towards $V_{M1}$ by the SAR algorithm, while I2 energy starts to increase towards the end of the conversion cycle as $V_{OUT}$ comes in the vicinity of $V_{M2}$. The energy consumed in I1 is more than 90% of the total energy, while the energy consumed by I3 to I5 is less than 0.2%; thus, using multiple gain stages does not incur an increase in power consumption.

It should be noted that an offset cancellation capacitor can be used between the first two inverter stages (I1 and I2). However, this will cause degradation in the energy efficiency for two reasons. First, I2 has to be enabled during the reset phase, where it will be biased at its threshold voltage ($V_{M2}$) and will dissipate its maximum current. Second, the capacitive loading of I1 will be increased. In addition, the offset voltage will not be completely eliminated due to various types of errors, thus the problem of the residual offset will still have to be addressed.

The output of the last inverter in the chain is fed to a latch comparator, such as that shown in FIG. 16. The latch comparator serves two purposes. First, it provides a stable digital input to the SAR logic. Second, it shifts the level of the capacitance comparison result from the analog supply voltage to the digital supply voltage, in case different voltages are used in the analog and digital domains. The second input of the latch comparator can be connected to $V_M$ which acts as the common-mode voltage ($V_{CM}$). However, in order to provide a larger differential overdrive input voltage to the comparator, the second input is tied to the output of the preceding inverter in the chain. The two outputs of the comparator are connected to identical buffers in order to avoid input offset due to capacitive load mismatch.

B. Noise Analysis

For the purpose of noise analysis, the inverter-based amplifier is modeled as a single transconductance stage, with a transcoductance of $G_m$ and an output-pole $$\omega_P = \frac{1}{R_{OUT} C_{OUT}}.$$

To simplify the analysis, it is assumed that $C_{IN} \gg C_{OUT}$, $A_O = G_m R_{OUT} \gg 1$, and $R_{OUT} \gg R_{ON}$, where $R_{ON}$ is the switch ON resistance. Several noise sources contribute to the total noise, namely, (1) the feedback reset switch, (2) the switches associated with CS, (3) the switches associated with the CapDAC, and (4) the amplifier. First, noise power from the reset switch ON resistance is sampled and stored in $C_{IN}$ when the switch is opened. Using nodal analysis to solve for $v_x(S)$ yields $$v_x(s) \approx \frac{i_n R_{ON}}{G_m R_{OUT}} \cdot \frac{1 - \frac{s}{s_z}}{\left(1 - \frac{s}{s_{p1}}\right)\left(1 - \frac{s}{s_{p2}}\right)} \quad (22)$$

where $$i_n^2(f) = \frac{4kT}{R_{ON}}, \; s_z \approx -\frac{1}{R_{OUT}C_{OUT}}, \; s_{p1} \approx -\frac{G_m}{C_{IN}}, \text{ and } s_{p2} \approx \frac{1}{R_{ON}C_{OUT}},$$

k is the Boltzmann constant, and T is the temperature in Kelvin. The input-referred mean-square (MS) noise voltage due to the feedback switch ON resistance is then given by $$v_{n1,rms}^2 \approx \frac{kTC_{OUT}}{C_{IN}^2}. \quad (23)$$

Second, the noise due to $C_S$ switches is divided into two components, where the first component is the sampled noise when the reset switch is opened and the second component is the voltage noise generated during the conversion phase. By assuming that $C_{IN} \gg C_S$, it can be shown that a pessimistic estimate of the MS noise voltage is given by $$v_{n2,rms}^2 \approx \frac{kTC_S^3}{C_{IN}^4} + \frac{kTR_{ON}\omega_p C_S^2}{C_{IN}^2}. \quad (24)$$

Third, the MS noise voltage due to the CapDAC switches is similarly given by $$v_{n3,rms}^2 \approx \frac{kTC_{FS}^3}{C_{IN}^4} \sum_{i=1}^N \left(\frac{1}{2^{3i}}\right) + \frac{kTR_{ON}\omega_p C_{FS}^2}{C_{IN}^2} \cdot \sum_{i=1}^N \left(\frac{1}{2^{2i}}\right), \quad (25)$$

where the two summations converge to $\frac{1}{7}$ and $\frac{1}{3}$, respectively, for $N \to \infty$. Fourth, the amplifier noise is sampled and stored in $C_{IN}$ when the reset switch is opened. An additional noise component is generated during the conversion phase. The MS output noise voltage due to these two components is given by $$v_{n4,rms}^2 \approx kT\gamma \cdot \left(\frac{1}{C_{IN}} + \frac{\omega_p}{G_m}\right), \quad (26)$$

where $\gamma$ is a noise parameter equal to $\frac{2}{3}$ for a long channel device. The previous analytical expressions were verified using Cadence Spectre transient noise simulations. The noise can be transferred to the capacitance-domain noting that $$\Delta V = \frac{\Delta C}{C_{IN}} \cdot V_{DD};$$

thus, the total MS capacitance noise is given by $$c_{nt,rms}^2 \approx \left(\frac{C_{IN}}{V_{DD}}\right)^2 \sum_{i=1}^4 v_{ni,rms}^2 \quad (27)$$

The maximum noise occurs at $C_S = C_{FS}$ and $C_{IN} = C_{IN,max} \approx 3C_{FS}$. Thus, the maximum MS noise is given by $$c_{nt,rms,max}^2 \approx \frac{kTC_{FS}}{V_{DD}^2}\left[3\gamma + \omega_p C_{FS}\left(\frac{4}{3}R_{ON} + \frac{9\gamma}{G_m}\right)\right] \quad (28)$$

For an energy efficient design, the noise is dominated by the amplifier rather than the switch ON resistance $$\left(\text{i.e., } \frac{4}{3}R_{ON} \ll \frac{9\gamma}{G_m}\right).$$

Thus, $C_{nt,rms,max}^2$ is approximately given by $$c_{nt,rms,max}^2 \approx \frac{3kT\gamma C_{FS}}{V_{DD}^2}\left[1 + \frac{3\omega_p C_{FS}}{G_m}\right]. \quad (29)$$

Substituting in equation (29) with the parameters of the implemented prototype ($V_{DD}$=0.8V, $C_{FS}$=12.66 pF, $C_{LSB}$=3.75 fF, $\omega_p$=1Mr/s, and $G_m$=150 µS) yields $c_{nt,rms,max}$=0.45 fFrms. The total noise from Spectre transient noise simulation results is 0.47 fFrms, which is quite close to the analytical value given the approximations put forward. The rms quantization noise is equal to $$C_{LSB,rms} = \frac{C_{LSB}}{\sqrt{12}} = 1.1 fFrms;$$

thus, the thermal noise is less than the quantization noise (i.e., the design is quantization noise-limited). This result was experimentally verified as will be shown below in the Measurement Results section. In order to avoid performance loss due to supply noise, the inverter-chain needs to be powered by a low-noise LDO. The sensitivity to supply noise can be mitigated by using a differential architecture.

C. Design Trade-Offs and Details

The inverter-based amplifier determines the noise, power consumption, and speed of the proposed CDC. The design of the amplifier is affected by several trade-offs. Minimum channel length (L) offers best energy efficiency and highest speed; however, it is not possible to achieve the gain requirement with minimum L, even while using cascode. In addition, the flicker noise of the NMOS transistor is excessive for small L. Increasing the width (W) improves the performance at the expense of increased power consumption and parasitics. Lower supply voltage gives better energy efficiency, however, it results in sharp degradation in speed. Although the physical signals of interest are typically slowly varying (e.g., intraocular pressure), operating the readout circuit at a very low speed (i.e., long conversion time) has several drawbacks. First, the circuit operation relies on the charge stored at $V_X$; thus, the circuit operation can be affected by leakage currents due to the OFF current of the switches and/or the parasitic leakage resistance of the capacitive sensor. Second, slow conversion time can result in conversion errors if the capacitive sensor ($C_S$) changes during conversion. Third, the circuit will be more prone to the effects of low-frequency noise, drifts, and variations. In addition, lower supply voltage will make the circuit more sensitive to offsets and noise. For a compromise between energy efficiency and speed, in some embodiments the inverters are biased at $V_{DD} \approx 0.8$V, such that each transistor is biased near its threshold voltage, where the transistors are sized such that $V_M \sim V_{DD}/2$ and the transistor threshold voltage ($V_{TH}$) is around 0.4V. In order to address these design trade-offs, transistor sizing and $V_{DD}$ were determined using Cadence ADE GXL global optimization with the following criteria: (1) achieving the gain requirement, (2) circuit noise less than the quantization noise, (3) clock period of 1 s, and (4) maximum energy efficiency (minimum FoM). The optimization results confirmed the selection of $V_{DD}$=0.8V.

Conceptually, only one inverter stage (I1) can be used, where the two inputs of the dynamic comparator are connected to the input and output of I1. However, the voltage change at the input and output of I1 is quite small (a few millivolts or less); thus, it can be disturbed by the kickback noise of the dynamic comparator which can be as large as 10 s of millivolts. Therefore, in order to protect these sensitive nodes, at least three inverter stages are required. A total of five inverter stages may be used in some embodiments to provide more gain and reduce the probability of metastability, where the additional stages (I2 to I5) have minor impact on energy consumption and speed. As illustrated in FIG. 15A, during the reset phase (first four clock cycles), the energy consumed in I1 increases at its maximum rate, while I2 to I5 are disabled. Next, in the conversion phase, I1 energy gradually increases at an accelerating rate, as $V_X$ is successively approximated towards $V_{M1}$. By virtue of near-threshold biasing, either the pull-up or the pull-down transistors in I2 and the subsequent stages will be biased in the subthreshold region and thus dissipate negligible current. The energy consumed in I1 is ≥90% of the total energy consumed in the inverter-chain at different simulation corners as shown in FIG. 15B.

FIG. 38 shows the worst case delay in the inverter chain when the output of I1 changes from zero to $$V_{M1} + \frac{LSB}{2},$$

where it is clear that the effect of I2 to I5 on speed is negligible because they are biased by a larger overdrive voltage. FIGS. 38 and 39 compare the non-linear settling behavior of the inverter with the linear settling of an ideal transconductance stage that has the same gain and bandwidth, where it can be seen that the inverter-based amplifier offers ~5 times improvement in speed. The output of I5 is strong enough to drive digital logic. However, a higher digital supply voltage is used (1.2V) in order to decrease the ON resistance of the switches; thus, a dynamic latch comparator (shown in FIG. 16) is still used to act as a level-shifter (as seen in FIG. 11).

The comparator decision depends only on the sign of ΔVV as given by (I1); thus, it is independent of the absolute value of $V_M$. Therefore, as long as $V_M$ remains constant throughout the conversion cycle, the temperature dependence of $V_M$ will not affect the conversion result. FIG. 40 shows that for the temperature range from 0° C. to 70° C. the temperature sensitivity of $V_M$ is only 24.5 µV/° C.; thus, even if the temperature changes by few degrees Celsius during the conversion cycle, the conversion result will not be affected. The robustness of the proposed interface against temperature variations was experimentally verified as will be shown below in the Measurement Results section.

Capacitive Digital-To-Analog Converter

A. Mismatch-Limited Resolution

As described previously, the resolution of an op-amp-less SAR CDC is limited by the quantization noise (i.e., the mismatch of the CapDAC). The CapDAC unit capacitor ($C_{LSB}$) sets the absolute resolution of the readout circuit, while the number of bits of the CapDAC sets the dynamic range. For instance, for a 0.18 µm CMOS technology used to implement an example embodiment, three types of capacitors may be available: a parallel plate metal-insulator-metal (MIM) capacitor, a dual MIM (DMIM) capacitor which is built by vertically stacking two MIM capacitors using a special dedicated metal layer; and a metal-oxide-metal (MOM) capacitor that utilizes the fringing horizontal electric field between standard interconnect metal layers.

A binary-weighted array implementation is considered, as it is more energy-efficient than an array that uses an attenuation capacitor, when linearity is taken into consideration. In order to achieve fine absolute resolution and wide dynamic range, t$C_{LSB}$ needs to be minimized while the number of bits needs to be maximized. However, these two requirements are conflicting, because the smaller the unit capacitor the worse the matching and consequently the smaller the number of bits. Using the mismatch models provided by the foundry, the standard deviation of unit capacitor mismatch for each type of aforementioned capacitors is shown in FIG. 19 vs $C_{LSB}$. For a binary weighted CapDAC, the worst case differential non-linearity (DNL) occurs at the mid-scale transition, where all the unit capacitors in the array are switched. Thus, assuming a three-sigma worst case DNL specification equal to half LSB, the maximum achievable mismatch-limited resolution is given by $$R_{max} = \log_2\left(\frac{1}{18\sigma^2(\Delta C/C)} + 1\right), \tag{30}$$

which is plotted in FIG. 20.

Several conclusions can be drawn from FIGS. 19 and 20. First, DMIM shows the worst mismatch behavior, which is expected because it has the highest capacitance density (i.e., the smallest area for a given capacitance). Second, for a fine absolute resolution ($C_{LSB}$<5 fF), both MOM and MIM show similar mismatch characteristics. Third, in order to achieve a 12—bit resolution, the finest possible absolute resolution is ≈3.7 fF. For the employed technology, the capacitance density of an MIM capacitor is about 15 times that of an MOM capacitor (i.e., for the same capacitance, the area occupied by an MOM capacitor is 15 times larger). Thus, implementing the CapDAC using MIM capacitors may seem more attractive. However, the strict layout design rules of MIM capacitors impose a limit on the smallest MIM capacitor to be 31 fF. On the other hand, an MOM capacitor can be custom-crafted as a layout parasitic element. Thus, MOM capacitors can be arbitrarily small, where the observed design rules are simply the metal width and spacing of the interconnect layer.

B. CapDAC Implementation

In order to achieve a compromise between absolute resolution and silicon area, an example inverter-based SAR CDC utilizes a course-fine implementation for the 12—bit CapDAC. One such example implementation contemplated herein utilizes an 8—bit MOM fine CapDAC in combination with a 4—bit MIM coarse CapDAC. The fine CapDAC unit capacitor has $C_{unit,fine}=C_{LSB}$=3.75 fF and full-scale capacitance of 0.96 pF. The coarse CapDAC has C unit, coarse=0.78 fF, which is smaller than the fine CapDAC full-scale to ensure continuous capacitance range under process variations. The overall full-scale capacitance ($C_{FS}$) of the interface is 12.66 pF and the effective resolution is ≈11.7—bit. The total silicon area occupied by the fine and coarse CapDACs is only 17% of the area of a 12—bit binary weighted MOM implementation. In addition to the 83% area-saving, the coarse-fine implementation reduces the array parasitics and decreases the routing complexity. A common centroid layout and dummy structures are used for both CapDACs to minimize systematic mismatch.

In order to reconstruct the binary digital output from the coarse and fine parts one calibration point is required. The coarse output is multiplied by a scaling factor and then added to the fine output to yield the final conversion result. This operation can be implemented with a simple digital circuit or can be integrated in the post-processing routine that maps the capacitance of the sensor to the physical quantity being measured (e.g., pressure). The scaling factor can be determined by detecting when the coarse output is incremented (or decremented) by one, and storing the fine output of the preceding (or current) conversion cycle. This process is done only once and can be triggered by the capacitive sensor itself (which is typically slowly varying). For the implemented prototype, the MOM capacitor is implemented in Metal4 layer to reduce the parasitics. Since MOM and MIM capacitors have different temperature coefficients, the scaling factor will have a peak-to-peak variation of 0.29% in the temperature range from 0° C. to 70° C. If the MOM capacitor is implemented in Metall layer, the peak-to-peak variation will be reduced to 0.02%.

It should be noted that the worst-case absolute DNL of a 12—bit array with a unit capacitor $C_{unit,fine}$ is the same as the worst-case absolute DNL of a 4—bit array with a unit capacitor $C_{unit,coarse}=2^8 \cdot C_{unit,fine}$ (i.e., if the number of bits is reduced by k—bit and the unit capacitor is multiplied by a factor of $2^k$, the mid-scale transition worst-case absolute DNL remains unchanged. Hence, the matching considerations discussed in the previous subsection are properly observed in the proposed coarse-fine implementation. For the chosen $C_{unit,coarse}$, the standard deviation of mismatch is 0.023% as shown in FIGS. 19 and 20. This translates to $\sigma_{DNL}=0.49$ fF for the 4—bit coarse CapDAC; thus, $3\sigma_{DNL}$ is less than half-LSB of the fine CapDAC. Therefore, by observing the mismatch-limited resolution discussed in the previous subsection, only one calibration point is required for the whole coarse-fine capacitance range. The linearity of the coarse and fine CapDACs was experimentally verified, as will be described in the next section.

Measurement Results

A. Die Micrograph

FIG. 21 shows a die photo of an example of a single-ended inverter-based SAR CDC fabricated in a 0.18 μm CMOS technology. The area of a rectangle enclosing the design is 0.2 mm$^2$, while the total silicon area occupied by the design is only 0.055 mm$^2$, where ≈82% of the area is occupied by the CapDACs. A digital serial peripheral interface (SPI) is implemented on-chip to facilitate reading/writing of control signals and reading conversion result. A LabVIEW interface is designed for test equipment control, measurement automation, and data acquisition.

B. CapDAC Characterization

The fine and coarse CapDACs were characterized using direct capacitance measurement. The input code was swept and the capacitance was measured using an LCR meter (Agilent E4980A). The average measured values for $C_{unit,fine}$ and $C_{unit,course}$ were 3.73 fF and 781 fF, respectively. FIGS. 22 and 23 show the measured DNL and INL of the fine CapDAC, respectively, where they have respective absolute maximums of 0.2 LSB and 0.1 LSB which translates to 0.75 fF and 0.38 fF, respectively. Similarly, the measured DNL and INL of the coarse CapDAC are shown in FIGS. 24 and 25, where they have an absolute maximum of 0.36 LSB and 0.38 LSB, respectively, which translates to 1.36 fF and 1.42 fF, respectively (where the LSB is $C_{unit,fine}$). The maximum linearity error of the coarse CapDAC is less than half-LSB; thus, only one calibration point is sufficient for the complete coarse-fine capacitance range.

C. CDC Characterization

In order to test the functionality and performance of CDCs, designers typically resort to three techniques. First, they apply a varying reference voltage to emulate a varying sensor capacitance (i.e., testing the CDC as an ADC). Second, they use discrete capacitors or an on-chip capacitor array as a dummy sensor. Third, they use a real capacitive sensor where the capacitance of the sensor changes with a physical parameter (e.g., pressure, displacement, or humidity). Example embodiments disclosed herein were tested using all three aforementioned techniques.

The DNL and INL of the CDC were measured using a standard histogram (code density) test. An Agilent B2962A low-noise source was used to generate a low-noise ramp waveform with>14—bit linearity. The ramp waveform was applied in place of the reference voltage of the capacitive sensor ($C_S$). Setting $C_S=C_{FS}$ and sweeping the sensor capacitance from zero to $V_{DD}$ emulate sweeping the sensor capacitance from zero to $C_{FS}$. FIGS. 35 and 36 show the results of the CDC DNL/INL measurement performed at once for the complete coarse-fine capacitance range. The coarse-fine scaling factor was determined off-chip for flexibility. The DNL was limited to 0.67 LSB and –0.98 LSB, while the INL was limited between 0.71 LSB and –0.86 LSB. The transitions of the coarse output are clearly visible in the INL plot.

To further evaluate the linearity of the interface, a four-point linearity measurement was used. Two sets of capacitors were characterized, where the four-point measurement of each set showed better than 12—bit linearity. In order to verify the functionality of the interface over its full dynamic range, a dummy capacitive sensor was integrated on-chip. The measured SAR CDC output vs dummy sensor capacitance is shown in FIG. 27, which illustrates that it has excellent linearity ($R^2=1.0000$).

The operation of an example inverter-based SAR CDC was further verified using a MEMS capacitive pressure sensor. A schematic of the pressure sensing test setup is shown in FIG. 37 and described in H. Omran et al. in "7.9 pJ/Step Energy-Efficient Multi-Slope 13-bit Capacitance-to-Digital Converter," Circuits and Systems II: Express Briefs, IEEE Transactions on, vol. 61, no. 8, pp. 589-593, August 2014. The MEMS sensor was placed inside a hermetic test cell that is equipped with gas ports and electrical ports. The test cell was evacuated using a vacuum pump and then compressed Nitrogen was allowed to flow in through a micrometric valve to gradually increase the pressure. The sensor was first characterized using an Agilent E4980A LCR meter. FIGS. 28 and 29 illustrate the subsequently measured SAR CDC output vs pressure of the test cell, where the CDC output follows the non-linear sensor characteristics.

Measured total power consumption for the inverter-based SAR CDC is shown in FIG. 30. Power consumption increases with increasing the sensor capacitance ($C_S$). More than 50% of the power is consumed in the inverter chain. The power breakdown is shown in Table I, which illustrates that more than 50% of the power is consumed in the inverter chain. The power consumed in both the CapDAC and $C_S$ is only 19% of the total power. Thus, using non-conventional switching schemes for the CapDAC will have minor impact on the overall power consumption, especially when noting that this usually adds more complexity to the logic.

TABLE I measured power break-down and total power consumption.

| | Power Consumption (μW) | Percentage |
|---|---|---|
| Inverter Chain | 3.34 | 52% |
| CapDAC and $C_S$ | 1.25 | 19% |
| Digital | 1.85 | 29% |
| Total | 6.44 | 100% |

FIG. 31 shows the measured SAR CDC output code standard deviation (rms noise) at different sensor capacitances. The measurement of the rms noise is limited by the quantization step of the CDC where the conversion output varies by a single LSB when a fixed sensor capacitor is measured. This verifies that the resolution of the readout circuit is limited by the CapDAC quantization noise rather than by the thermal noise. The rms quantization noise is 1.1 fFrms and the estimated thermal noise from simulations is 0.47 fFrms; thus, the the total rms noise is $\sqrt{1.1^2+.47^2}$, which is equal to 1.2 fFrms for the example interface described herein.

Example embodiments described herein have inherently low temperature sensitivity because they do not depend on analog references. The sensor capacitor is directly compared to the reference capacitors in the CapDAC, where the conversion output is only a function of the capacitance comparison result, rather than a reference clock, current, or voltage. In order to demonstrate the low temperature sensitivity of example inverter-based SAR CDCs, the conversion output variation can be characterized vs temperature using a temperature test chamber. FIG. 32 shows that the peak-to-peak output code deviation in the temperature range from 0° C. to 60° C. is only 139 ppm (i.e., 0.47 LSB). This translates to a temperature sensitivity of 2.3 ppm/° C., which is three orders of magnitude better than the design by W. Jung et al. in "A 0.7 pF-to-10 nF fully digital capacitance-to-digital converter using iterative delay-chain discharge," in Solid-State Circuits Conference—(ISSCC), 2015 IEEE International, February 2015, pp. 1-3. Even after the design by W. Jung et al. undergoes calibration, the design of example embodiments disclosed herein still provide 6.7 times better temperature sensitivity without the need for calibration.

D. Comparison and Discussion

Table II shows a summary of the performance of the proposed interface and a comparison with state-of-the-art CDCs with resolution ≥7—bit. In order to compare the energy efficiency of different CDC circuits, the energy efficiency figure-of-merit (FoM) can be calculated as $$FoM = \frac{P \times T_{conv}}{2^R}, \tag{31}$$

where P is the power consumption, $T_{conv}$ is the conversion time, and R is the effective resolution in bits, which is calculated as $$R = \frac{SNR - 1.76}{6.02}, \tag{32}$$

where the signal-to-noise ratio (SNR) is given by $$SNR = 20\log\left(\frac{\text{Capacitance Range}/2\sqrt{2}}{\text{Absolute Resolution}}\right), \tag{33}$$

where the absolute resolution is the rms capacitance resolution. It should be noted that SNR and not SNDR is used for CDC FoM calculation (i.e., linearity errors are not taken into account). The energy efficiency FoM is a function of the CDC conversion time; thus, the capacitance range considered in Table I corresponds to the range that is covered by the reported conversion time for each CDC.

TABLE II performance summary and comparison.
Table II
PERFORMANCE SUMMARY AND COMPARISON.

| | AD7153 [42] | JSSC 2013 [6] | TCAS-II 2015 [39] | JSSC 2015 [22] | ISSCC 2015 [18] | ISSCC 2015 [19] | S&A:A 2016 [23] | ISSCC 2014 [13] | VLSI 2014 [21] | This Work |
|---|---|---|---|---|---|---|---|---|---|---|
| Architecture | ΣΔ | ΣΔ | C/T | C/T | C/T | C/T | SAR | C/V + SAR | SAR + ΣΔ | SAR |
| Output format | Digtal code | Bits Stream[a] | Digital code | Digital code | PM[b] | Digital code | Digital code | Digital code | Digital code | Digital code |
| Technology (μm) | N/R | 160 | 90 | 180 | 160 | 40 | 180 | 180 | 180 | 180 |
| Area (mm²) | N/R | 0.28[a] | 0.3 | 0.1 | 0.05[b,c] | N/R[d] | 0.1 | 0.49 | 0.46 | 0.2[h] |
| Supply Voltage (V) | 3.3 | 1.2 | 0.6 & 1 | 0.6 & 1.2 | 1 | 0.45 & 1 | 0.9 & 1 | 0.9 & 1.2 | 1.4 | 0.8 & 1.2 |
| Power (μW) | 330 | 10.3[a] | 5.5 | 0.11 | 14b | 1.84 | 3.84 | 0.16 | 33.7 | 6.44 |
| Conv. Time (μs) | 5000 | 800 | 640 | 6400 | 210[e] | 19[e] | 42.5 | 4000 | 230 | 16 |
| Cap. Range[f] (pF) | 4 | 0.52 | 4 | 4 | 8 | 10.6[g] | 16.14 | 10 | 24 | 12.66 |
| Abs. Resolution (f Frms) | 0.28 | 0.07 | 4.5 | 8.7 | 1.4 | 12.3 | 1.3 | 6 | 0.16 | 1.2 |
| Resolution (bit) | 12 | 11.1 | 8 | 7 | 10.6 | 8 | 11.8 | 8.9 | 15.4 | 11.6 |
| FoM (fJ/step) | 403e3 | 3.8e3[a] | 13.8e3 | 5.3e3 | 1.87e3[b] | 141 | 46 | 1.3e3 | 179 | 33 |

*C/T: Capacitance-to-time, PM: Period modulation, N/R: Not reported.
[a]Power consumption and area of digital decimation filter are not included.
[b]Power consumption and area of time-to-digital converter are not included.
[c]Off-chip reference capacitor is employed.
[d]Area of on-chip reference capacitor is not reported.
[e]Multiple measurement cycles are required to cancel the effect of parasitics/references. Conversion time and FoM are reported for a single cycle only.
[f]Only the capacitance range that is covered by the reported conversion time is considered.
[g]The capacitance range can be extended but with degraded energy efficiency.
[h]The are of a rectangle enclosing the design is 0.2 mm², while the silicone area occupied by the design blocks is 0.055 mm².

Example inverter-based SAR CDCs contemplated herein can achieve a FoM that is more than two orders of magnitude better than the best reported ΣΔ CDC FoM described in Z. Tan et al. "A 1.2-V 8.3-nJ CMOS Humidity Sensor for RFID Applications," Solid-State Circuits, IEEE Journal of, vol. 48, no. 10, pp. 2469-2477, 2013, and more than three orders of magnitude better than previous SAR CDC implementation. When compared to the CDC FoM described in W. Jung, S. Jeong, S. Oh, D. Sylvester, and D. Blaauw, "A 0.7 pF-to-10 nF fully digital capacitance-to-digital converter using iterative delay-chain discharge," in Solid-State Circuits Conference—(ISSCC), 2015 IEEE International, February 2015, pp. 1-3 (which had the best reported CDC FoM), some example inverter-based SAR CDCs contemplated herein can provide a 4.5 times better FoM, faster conversion time, in addition to being insensitive to analog references, parasitics, and temperature without the need for calibration. Compared to S. Oh, W. Jung, K. Yang, D. Blaauw, and D. Sylvester, "15.4b incremental sigma-delta capacitance-to-digital converter with zoom-in 9b asynchronous SAR," in VLSI Circuits Digest of Technical Papers, 2014 Symposium on, June 2014, pp. 1-2, which employs a hybrid SAR+ΣΔ technique, example inverter-based SAR CDCs contemplated herein can produce a 5:6× better FoM, a 14.5 times faster conversion time, and utilize an 8.3 times smaller area. Noting that a reference capacitor, which was not included in the reported area, is required in some competing designs, the proposed CDC occupies a very small silicon area when compared to other CDCs, as shown in Table II.

Example inverter-based SAR CDCs contemplated herein were further benchmarked against state-of-the-art CDCs using FIG. 33, which shows conversion energy vs ENOB. The example embodiments described herein are the first reported CDC to cross the 0.1 pJ/Step energy efficiency boundary. When compared to CDCs with comparable resolution (10~14—bit), the achieved FoM is more than one order of magnitude better than the state-of-the art.

Energy efficiency can be improved by biasing transistors in the sub-threshold region; however, the circuit speed is sacrificed. Therefore, for a fair comparison, the energy efficiency should be compared for a given performance point. Thus, the energy efficiency FoM of state-of-the-art CDCs is plotted vs conversion sample rate in FIG. 34. Example inverter-based SAR CDCs contemplated herein achieve both the highest sample rates and the best energy efficiency. Compared to the nearest design in the FoM vs sample rate chart (that described by W. Jung, S. Jeong, S. Oh, D. Sylvester, and D. Blaauw in "A 0.7 pF-to-10 nF fully digital capacitance-to-digital converter using iterative delay-chain discharge," in Solid-State Circuits Conference—(ISSCC), 2015 IEEE International, February 2015, pp. 1-3 (hereinafter Jung)), example inverter-based SAR CDCs contemplated herein have an 11.2 times better absolute resolution and higher ENOB (11.7—bit compared to 8—bit). In addition, the design in Jung requires four measurement cycles in order to cancel the sensitivity to analog references, temperature, and parasitics; thus, the effective sample rate of example embodiments described herein is 4.8 times higher.

Conventional SAR CDCs have poor resolution that is limited by comparator offset error. Accordingly, the inverter-based SAR CDC implementations described here address this problem while maintaining excellent energy efficiency. The inverter-based amplifier doubles the transconductance for the same current, has fast non-linear settling, and uses near-threshold biasing to achieve excellent energy efficiency and fast operation. Direct capacitance domain comparison is employed, which results in a very low temperature sensitivity of 2.3 ppm/° C. A hybrid CapDAC using MIM and MOM capacitors is implemented allowing covering wide dynamic range in a compact area. An energy efficiency FoM of 33 fJ=Step is achieved, which is the best CDC FoM reported to date.

Example of a Differential Inverter-Based SAR CDC Implementation

The previously described inverter based design suffers from two limitations. First, the design uses a single-ended amplifier, which can be sensitive to common-mode noise and errors. Second, the inverter amplifier has relatively large static power consumption; thus, the energy efficiency will be degraded at low sample rates.

In order to address this, example embodiments contemplated herein comprise a differential SAR CDC that uses a fully differential inverter-based amplifier to provide robustness against common mode noise and errors while achieving improved energy efficiency. Quasi-dynamic operation is realized by using a programmable reset phase and by selectively enabling the amplifier in the conversion phase; thus, the energy efficiency is maintained for a scalable sample rate.

The schematic of an example SAR CDC of this nature is shown in FIG. 17, where $C_S$ is the sensor capacitor, is a $C_{DAC}$CapDAC, and $C_P$ models the parasitic capacitance. The operation phases and the timing are shown in FIG. 18. During the reset phase, the inverter amplifiers (I1 and I2) are in unity-gain feedback so that the switching threshold of each inverter ($V_M$) is stored in the input capacitance. The built-in switching threshold of the inverter acts as a common-mode voltage; thus, the circuit can be operated with the supply voltage ($V_{DD}$) only, and without the need for an additional reference voltage. During the conversion phase, charge is redistributed depending on the SAR logic output, resulting in a voltage change that is proportional to the difference between $C_S$ and the selected CapDAC capacitance. The delta voltage at each inverter input ($V_X-V_M$) is amplified, and then the outputs are fed to a dynamic latch comparator. The differential input of the comparator is given by $$\Delta V = ((C_S + C_{err}) - C_{R1,ON})\left(\frac{A_1}{C_{IN1}} + \frac{A_2}{C_{IN2}}\right)V_{DD},$$

where $C_{ERR}$ is the conversion error, $A_1$ and $A_2$ are the gains of I1 and I2 respectively, and $C_{IN1}$ and $C_{IN2}$ are the total capacitances at $V_{X1}$ and $V_{X2}$, respectively.

The error is given by $$C_{err} \approx \frac{V_{os,op} + V_{os,cmp}}{V_{DD}} \cdot \frac{1}{\frac{A_1}{C_{IN1}} + \frac{A_2}{C_{IN2}}},$$

The SAR logic performs binary search until the selected CapDAC capacitance matches $C_S$ with a resolution equal to the CapDAC LSB. A wider capacitance range or a finer resolution can be obtained by connecting a different reference voltage to the bottom-plates of $C_S$ or the CapDAC. The error due to the mismatch in the inverters switching threshold ($V_{M1}-V_{M2}$) and the comparator offset voltage is reduced by the open-loop gain of the inverters. Any mismatch in the inverters open-loop gain or the parasitic capacitance will not affect the conversion output because it will not change the sign of the comparator differential input, and consequently will not change the comparator output as long as $C_{ERR} < C_{LSB}$. In addition, the comparator decision is independent of the absolute value of $V_M$.

The inverter amplifier is inherently energy-efficient because for the same bias current both the PMOS and NMOS transistors contribute to the transconductance. Moreover, in some example embodiments, a supply voltage of 0.8V may be used such that each transistor is biased near its threshold voltage ($V_T$), where $V_M \approx V_{DD}/2 \approx V_T$, which produces an improved compromise between energy efficiency and speed. The near-threshold biasing minimizes the static current dissipated by the inverter amplifier.

Quasi-Dynamic Operation

In order to maintain the energy efficiency of the readout circuit independent of the sample rate, the power consumption needs to scale proportional to the clock frequency (i.e., the energy consumed per conversion cycle needs to be kept constant). This requirement is satisfied in dynamic circuit blocks that have no static power consumption (e.g., $C_S$, the CapDAC, the SAR logic, and the dynamic comparator). On the other hand, the inverter amplifier has static power consumption which translates to the consumption of higher energy per conversion cycle and degraded energy efficiency at low sample rates.

During the reset phase, the amplifier static power consumption is addressed by modifying the number of clock cycles during which the amplifier is enabled according to the clock frequency. This is achieved via the XTND_RST digital input, which selects the number of clock cycles in the reset phase. For a fast clock, the reset phase is programmed to have fewer number of clock cycles, while a larger number of cycles are used for a slow clock; thus, the time of the reset phase, and consequently the energy consumption, is maintained nearly constant independent of the sample rate. The timing in FIG. 18 is drawn for XTND_RST=2 (i.e., two clock cycles in the reset phase).

During the conversion phase, constant energy consumption is realized by selectively enabling the amplifier for a constant period of time independent of the sample rate. The amplifier is enabled using the EN_AMP signal ahead of the active edge of the comparator clock (rising edge of CMP_CLK). The outputs of the comparator are fed to an XOR gate to detect the completion of the comparator decision. Initially, the two output of the comparator ($V_{CMP+}$ and $V_{CMP-}$) are low; thus, CMP_DONE is low. Next, at the rising edge of CMP_CLK, the latch comparator is in positive feedback and the two signals $V_{CMP+}$ and $V_{CMP-}$ will take complementary values depending on the comparator input. Once the comparator decision is made, CMP_DONE is asserted and is used to reset the EN_AMP signal, as shown in FIG. 18; thus, the amplifier is disabled and wasteful static power consumption is avoided. A NOR gate may produce output glitches when the comparator outputs are both around the middle of the supply voltage before the decision is made. On the contrary, an XOR gate output will only be asserted when the two outputs are complementary and the decision is completed.

Therefore, by using a programmable number of clock cycles in the reset phase and selectively enabling the amplifier in the conversion phase, a quasi-dynamic operation is achieved. Hence, the energy consumption, and consequently the energy efficiency FoM, of the readout circuit is maintained as the sample rate is varied.

A specific implementation of an example differential SAR CDC is described as follows. This example comprises a parasitic-insensitive differential SAR CDC using an energy-efficient OTA to address the limitations of the conventional SAR CDC. The OTA, which is based on a current-starved inverter, amplifies the differential input voltage; thus, it relaxes the requirements of the dynamic comparator. The average power of the pre-amplifier and the comparator is reduced by turning them off when they are not in use. The capacitor DACs are designed by using a coarse-fine architecture to cover a wide range of capacitance in a small area. They save 89% of silicon area compared to the implementation that uses only small unit capacitors. The SAR logic is based on a sequencer and a code register that consume very low power. The proposed ultra-low-energy CDC achieves the best-reported energy efficiency to date.

After presenting the proposed CDC architecture and operation, a detailed description of the circuits that are used in the CDC is provided, followed by measurement results of one example of this implementation.

A. Proposed Architecture

As shown in FIG. 41, this example differential SAR CDC consists of a comparator, SAR control logic, and two DACs as reference capacitors. Two sensing capacitors ($C_{SENS}$) are used to provide a fully differential signal, and each reference capacitor is implemented by using a binary-weighted capacitor array that is controlled by SAR logic. At each conversion, both capacitive sensors are sampled and the charge is held onto the DAC. When the bit-cycling action starts, a differential voltage that is proportional to the difference between the sensor and the reference capacitance is directly converted to a digital output by a comparator. Based on the comparison result, SAR control logic updates the selected reference capacitance which updates the differential voltage. This process is repeated N-times for N-bit resolution until the voltages of the two DACs are equal, which means that the sensor and reference capacitance are matched. Differential circuits are immune to coupling and power-supply noise. Therefore, sampling differentially benefits from the comparator's common mode rejection.

The architecture of the proposed differential SAR CDC at a circuit level is shown in FIG. 42. It consists of two DACs that are implemented using a coarse-fine architecture, inverter-based OTA with a feedback loop, clocked comparator, and differential SAR control logic. The proposed CDC circuit requires standard non-overlapping clock phases (P1 and P2) as well as a SAR clock.

FIG. 43A shows the sampling phase of the CDC. During the sampling phase the feedback switch is closed; thus, the inverter-based OTA is configured as a unity-gain amplifier, so that it employs the switching-threshold voltage $V_M$ of the inverter to charge both binary-weighted DACs and the capacitive sensors. One binary-weighted DAC is switched to ground while the other is switched to $V_{REF}$ by using a set of inverters that drive the bottom plates of the binary-weighted DACs. In addition, the capacitive sensors are switched between ground and $V_{REF}$ to generate a fully differential charge that is proportional to the sensor capacitance. Thus, the charges that are sampled in both DACs and capacitive sensors are given by $$Q_{S1} = C_{SENS}(V_M - V_{REF}) + C_{REF}V_M, \qquad (34)$$

$$Q_{S2} = C_{SENS}V_M + C_{REF}(V_M - V_{REF}). \qquad (35)$$

The comparator with preamplifier is turned off during this phase to minimize power consumption.

During conversion phase (FIG. 43B), the feedback switch is open, and the comparator is enabled. Then, the capacitive sensors are switched to $V_{REF}$ or ground as well as the binary-weighted DACs. Therefore, the charges are given by $$Q_{V1} = C_{SENS}\left(V_M + \frac{\Delta Vo1}{A}\right) + C_{REF}\left(V_M + \frac{\Delta Vo1}{A} - V_{REF}\right), \quad (36)$$

$$Q_{V2} = C_{SENS}\left(V_M + \frac{\Delta Vo2}{A} - V_{REF}\right) + C_{REF}\left(V_M + \frac{\Delta Vo2}{A}\right), \quad (37)$$

where A is the finite gain of the inverter and ΔVo is the change in the output voltage. When the law of charge conservation is applied, the differential output voltage can be expressed as $$\Delta V_{OUT} = V_{01} - V_{02} = 2A\frac{\Delta C V_{REF}}{C_T}, \quad (38)$$

where $C_T$ is ($C_{SENS}+C_{REF}+C_P$) and ΔC is ($C_{SENS}-C_{REF}$). The successive-approximation algorithm modifies $C_{REF}$ until it matches $C_{SENS}$. According to equation (38), the differential output voltage is insensitive to $V_{REF}$ and $C_P$ variation, because they do not affect the sign of $\Delta V_{OUT}$. The sign of $\Delta V_{OUT}$, and consequently the comparator output, is determined by ΔC. When the offset voltage is considered in the analysis, the differential output voltage is given by $$\Delta V_{OUT} = 2A\frac{\Delta C_{REF}}{C_T} + V_{OS}, \quad (39)$$

where VOS is the offset voltage between the two halves of the differential signal path. The differential output voltage ($\Delta V_{OUT}$) is minimum when the capacitance difference is a single LSB. Therefore, $\Delta V_{OUT,min}$ at LSB should satisfy the following equation:

$$\Delta V_{OUT,min} = 2A\frac{LSBV_{REF}}{C_T} \geq V_{OS}. \quad (39)$$

Thus, the minimum achievable resolution is given by $$LSB = \frac{C_T V_{OS}}{2A V_{REF}}. \quad (40)$$

FIG. 44 shows a Monte Carlo simulation (500 runs) for the gain and offset voltage. The rms offset voltage is 2.6 mV, and the nominal gain is 134.6. In order to limit the conversion error, the LSB, gain, and full-scale range are therefore selected such that $\Delta V_{OUT,min} > V_{OS}$ at $V_{REF}$ of 0.9V. The measured LSB and dynamic range for the implemented prototype are 4.5 fF and 16.14 pF, respectively.

The capacitive sensing element includes two parasitic capacitors at the two electrodes of the sensing capacitor. The proposed CDC digitizes the sensing capacitor itself, excluding the two parasitic capacitances to ground, directly to digital word without the need for parasitic capacitance calibration (or cancellation). The parasitic capacitor at the bottom-plate of $C_{SENS}$ is either connected to ground or $V_{REF}$; thus, it does not affect the conversion output. The parasitic capacitance at the top-plate of $C_{SENS}$ (i.e. $C_P$) does not affect the output for the ideal case given by (5). When the offset error is considered, the parasitic capacitance will affect $\Delta V_{OUT,min}$ as given by (7), where a large parasitic capacitance will degrade the output voltage swing compared to the offset voltage. FIG. 45 shows the minimum absolute resolution (LSB) vs CP of the proposed circuit. For the LSB of the proposed CDC (4.5 fF), a large off-chip parasitic capacitance can be tolerated without affecting the conversion output.

Circuit Implementation

Inverter-Based OTA

The inverter-based OTA has high current efficiency, as both NMOS and PMOS transistors contribute to the transconductance while sharing the same supply current. High supply voltage and large overdrive voltage lead to fast settling time but high power consumption. For high energy efficiency, the inverter should be designed at the boundary between the weak and strong inversion regions to be energy efficient in terms of high gain and wide gain-bandwidth product. Therefore, the input pair transistors of the inverter-based OTA are realized to operate in the weak inversion region near the boundary. They are sized to set the switching threshold voltage in the middle of the inverter transfer characteristics. The switching threshold is realized near to the threshold voltage of the MOS transistor to enhance the gain and gain-bandwidth product, because the transconductance in the weak-inversion region is larger than that of strong-inversion for a given bias current. The tail current is used to control the power and speed, and it reduces PVT variations. FIG. 46 shows the inverter-based OTA. It is turned on during sampling and conversion phases.

The gain is set to limit the conversion error due to offset voltage. Rearranging the terms of (7) the condition on the gain is $$A \geq \frac{C_T V_{OS}}{2LSBV_{REF}}. \quad (41)$$

The bandwidth of the OTA is chosen to achieve a conversion time that is less than 50 μs. High-speed is not required for the target application; however, long conversion time will make the circuit sensitive to the variation of $V_{REF}$ and $C_{SENS}$ during conversion, and it will also be affected by flicker noise. The circuit is powered down after conversion is done; thus, the conversion rate can be fast or slow according to the required application.

During the sampling phase, the OTA sees the load capacitance which is composed of $C_{SENS}$, $C_{REF}$, and $C_P$. The proposed OTA is a single stage amplifier, compensated by the load capacitance; thus, it is stable even if $C_P$ is increased. If $C_P$ is increased, the sampling time that is required to charge the load capacitance will be increased. However, in the conversion phase, the OTA is loaded by only small parasitic capacitance at the amplifier output node.

Comparator

The comparator consists of a preamplifier and a latch comparator. The preamplifier of the comparator is shown in FIG. 47A. It is implemented in a manner identical to the inverter-based OTA. Both the inverter-based OTA and the comparator preamplifier have the same switching-threshold voltage. They work as open-loop preamplifiers during the conversion phase. Therefore, the output voltage from the first stage will be amplified and compared to the switching-threshold of the preamplifier. Then, the voltage swing of the first stage is enhanced by the preamplifier of the comparator. Two cascaded preamplifiers are used. They serve to improve the energy efficiency of the comparator, and they are active only during the conversion phase to minimize power consumption.

The latch comparator is shown in FIG. 47B, where it is constructed by cross coupling two 3-input NAND gates. It has low sensitivity to noise and physical layout. Thus, the comparator works as an analog comparator when the input analog common mode is high enough to make the input PMOS transistors in the cut-off region. The input voltage of the PMOS must be $$V_{IN} > V_{DD} - V_{th}. \tag{42}$$

where $V_{DD}$ is a supply voltage and, $V_{th}$ is a threshold voltage of the transistor. When P2 is low, both outputs of the comparator are reset to supply voltage by PMOS-reset transistors while the preamplifier is turned off. When P2 is high, the preamplifier is turned on, and the positive feedback of the comparator is created when one of the outputs discharges to below a PMOS threshold voltage, and the comparison will be made.

Successive Approximation Register & Binary Weighted DAC

Successive approximation register (SAR) determines the bits successively by using a binary search algorithm. It forces the voltages of both binary-weighted DACs to be equal at the switching threshold voltage of the inverter-based OTA. The SAR architecture is shown in FIG. 48. It requires 2(N+1) flip-flops, which are implemented by using transmission gates. The Flip Flop is designed and optimized on the transistor level to reduce static leakage power and delay of the digital gates with a fully customized layout.

A binary-weighted DAC is utilized to compare the digital output to the capacitive input. With an increase in resolution, the capacitance of the binary weighted DAC increases exponentially. This increase causes large power consumption, increased settling time, and significant mismatch issues. Moreover, it increases the die area and the complexity of routing. Therefore, the binary-weighted DAC is broken into a coarse-DAC and a fine-DAC with a unit capacitor for each binary-weighted DAC to reduce the area and the process variation of the capacitor. The size of the entire binary-weighted DAC is scaled down to reduce power consumption, but the conversion error and the matching of the capacitors set the lower limit. Therefore, the smallest unit capacitor LSB is selected based on these factors. The random mismatch sets the smallest unit capacitor at the mid-code as a worst case different non-linearity (DNL). This can be expresssed as, $$3\sigma_{DNL} = \tfrac{1}{2} \text{LSB}, \tag{43}$$

where $\sigma_{DNL}$ is the standard deviation of the DNL for differential implementation that is given by, $$\sigma_{DNL} = \frac{1}{2\sqrt{2}} \sqrt{2(2^N - 1)} \, \sigma_u\!\left(\frac{\Delta C}{C}\right), \tag{44}$$

where N is the number of bits and $\sigma_u(\Delta C/C)$ is the standard deviation of the capacitor mismatch. The standard deviation can be calculated for the given process. It is inversely proportional to the square root of the area. The factor of 1/2 $\sqrt{2}$ arises because two unit capacitors are switched each time in the differential implementation. Fine binary-weighted DAC is implemented by using fringing capacitance on the same metal layer that is shown in FIG. 49. The fine capacitor array is split into two mirrored halves with a channel in between for routing. Using fringing capacitance enables better matching for a small unit capacitor, and it is customized on metal 4 layer (M4) to be far from the substrate to reduce parasitic capacitance. For the given process, the three-sigma of the fringing capacitor mismatch is 0.96% for unit area 45.7 µm$^2$, which yields a measured unit capacitor of 4.5 fF. For 8-bit resolution, $3\sigma_{DNL}$ is 0.35 fF, which is less than ½ LSB. Thus, 8-bit fine DAC with absolute resolution 4.5 fF is achieved to implement the proposed DAC. The total fine DAC capacitance (composed of 255 units) is 1.148 pF.

For coarse binary-weighted DAC, the unit capacitor is implemented by using metal insulator metal (MIM) capacitor, and it is chosen such that $$\text{DNL}_{Coarse} < \tfrac{1}{2} \text{LSB}_{Fine}. \tag{45}$$

Moreover, the full scale of the fine DAC covers the step size of the coarse DAC to ensure continuous range. For the given process, the three-sigma of the MIM capacitor mismatch is 0.06% for unit area 480 µm$^2$, which yields a measured unit capacitor of 1 pF. For 4-bits resolution, $\text{DNL}_{Coarse}$ is 1.16 fF, which is less than ½ $\text{LSB}_{Fine}$. Therefore, a 4-bit, coarse DAC with unit capacitor 1 pF is implemented and combined with fine DAC. This results in a 16.14 pF capacitance range in a compact area. Both binary-weighted DACs are laid out using a common centroid approach to reduce mismatch effects.

Measurement Results

The CDC was fabricated using standard 180 nm CMOS technology. The chip micrograph is shown in FIG. 50. It has an on-chip dummy sensor for testing, and it is controlled by a 4-wire serial peripheral interface (SPI) bus to minimize the bonding pads and package pins. The chip has an active area of 0.1 mm$^2$, including binary-weighted DACs, analog, and digital blocks. A printed circuit board is designed and fabricated to test the fabricated chip. An external clock source is used for testing flexibility.

The measured differential nonlinearity (DNL) and integral nonlinearity (INL) for fine DACs are shown in FIG. 51. The maximum DNL is +0.1/−0.16 LSB, and the maximum INL is +0.15/−0.12 LSB. Similarly, FIG. 52 shows the measured DNL and INL for coarse DACs. They have a maximum DNL of +0.14/−0.28 LSB, and a maximum INL of +0.20/−0.12 LSB.

FIG. 53 shows the measured transfer function of the CDC. It shows the transfer function of the total number of codes when $C_{SENS}$ varies between 0 and 16.14 pF in 4.5 fF steps. This curve shows a linear relation between the output codes and input capacitances. Moreover, the resolution of the circuit is quantization noise limited, as the standard deviation of the measured CDC output is less than 1 LSB for a fixed input capacitance, as shown in FIG. 54. Thus, the effective number of bits is obtained from the measured transfer function of the total output codes: i.e., it is limited by the smallest unit capacitor.

Furthermore, the chip is tested by using an off-chip sensor to emulate the real pressure-sensing application. The test setup with a photograph of the test cell and PCB is shown in FIG. 55. FIGS. 56A and 56B show the measured off-chip capacitive-pressure sensor for low and high pressure modes, respectively. The measured CDC output matches the pressure sensor characteristics and shows the robustness of the circuit, although large parasitic capacitances exist due to the connectors and cabling.

The active power is the power consumption of the comparator when enabled, while the average power is the power consumption averaged during the entire sampling and conversion period. The comparator is enabled for conversion phase only; thus, its average power is less than active power. The CDC performance is listed in Table III.

TABLE III

CDC performance summary.

| | |
|---|---|
| Technology | CMOS 180 nm |
| Power Supply (Analog/Digital) | 0.9 V/1 V |
| Absolute Resolution | 4.5 fF |
| Capacitance Range | 16.14 pF |
| Noise (rms) | <1.4 fF |
| Current (Analog) | 2.66 µA |
| Current (Digital) | 297 nA |
| Current ($V_{REF}$) | 1.28 µA |
| Power (µW) | 3.84 |
| Resolution | 12 Bits |
| Measurement Time | 42.5 µs |
| DNL Fine | +0.1/−0.16 LSB |
| INL Fine | +0.15/−0.12 LSB |
| FoM | 45.8 fJ/Step |

This CDC consumes 3.84 µW at full-scale input capacitance, where the analog represents 62.2%, the digital represents 7.8%, and the reference voltage represents 30%. The figure-of-merit (FoM) is defined as, $$FoM = \frac{Power \times T_S}{2^{ENOB}}, \qquad (46)$$

where $T_S$ is the measurement time and ENOB is the effective number of bits, defined as $$ENOB = \frac{20 \log\left(\frac{Capacitance\ Range/2\sqrt{2}}{rmsCapacitanceResolution}\right) - 1.76}{6.02}. \qquad (47)$$

Table IV compares this CDC performance with other state-of-the-art CDCs. It achieves a competitive FoM of 45.8 fJ/conversion-step. Compared to the differential sigma-delta data converters, the proposed differential CDC has small area, wide capacitance range, ultra-low power consumption, and 81 times better FoM. FIG. 57 shows the energy per measurement for the proposed SAR CDC. The energy dissipation is only 163.2 pJ for 11.8 bits. The proposed CDC is the first reported CDC to cross the 100 fJ/conversion-step boundary.

Conclusions

In nanoscale CMOS technologies and under a low supply voltage, SAR data converters are attractive for low-power applications. The comparator is only the analog block of this data converter. This example SAR CDC using an amplifier and a comparator that are based on a current starved inverter that can benefit from scaling. It uses the switching threshold voltage of an inverter-based OTA to compare and amplify the differential input signal. The coarse-fine DAC provides wide capacitance range in a compact area, and the SAR logic is implemented to achieve low power dissipation. Accordingly, described herein is a designed and experimentally verified 3.84 µW 12-bit 42.5 µS differential SAR CDC demonstrating the efficacy of the above techniques. The FoM of this example CDC can be improved further with a more advanced CMOS process.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for capacitance-to-digital conversion, the apparatus comprising:
   first and second sensor capacitors configured to produce an input capacitance;
   first and second capacitive digital-to-analog converters (CapDACs) configured to produce a reference capacitance;

TABLE IV

CDC performance summary.

| Reference | ESSCIRC 2014 [27] | JSSC 2012 [11] | ISSCC 2015 [10] | VLSI 2014 [13] | S & A 2014 [15] | ISSCC 2015 [28] | ISSCC 2012 [16] | JSSC 2013 [17] | This Work |
|---|---|---|---|---|---|---|---|---|---|
| Architecture | Dual Slope | PM | PM | SAR + ΔΣ | SAR | Delay-Chain | ΔΣ | ΔΣ | SAR |
| Differential | No | No | No | No | No | No | Yes | Yes | Yes |
| Technology (µm) | 0.18 | 0.35 | 0.16 | 0.18 | 0.35 | 0.04 | 0.35 | 0.16 | 0.18 |
| Supply (V) | 0.6/1.2/3.6 | 3.3 | 1 | 1.4 | 3.3 | 1/0.45 | 3.3 | 1.2 | 0.9/1 |
| Area (mm²) | 0.105 | 0.53[a] | 0.05[a,b] | 0.456 | 0.07[c] | N/A[d] | 2.6[f] | 0.28[f] | 0.1 |
| Meas. Time (ms) | 6.4 | 7.6 | 0.21 | 0.23 | 0.65 | 0.01906 | 0.02 | 0.8 | 0.0425 |
| Input Range (pF) | 5.3-30.7 | 0-6.8 | 0-8 | 0-24 | 0-16 | 0.7-11.3 | 8.4-11.6 | 0.54-1.06 | 0-16.14 |
| Power (µW) | 0.11 | 211[a] | 14[a] | 33.7 | 303[c] | 1.84 | 14850[f] | 10.3[f] | 3.84 |
| ENOH (Bits) | 9.7 | 13.5 | 10.6 | 15.4 | 12.5 | 8 | 13.8 | 11.1 | 11.8 |
| FoM (fJ/Step) | 850 | 138418[a] | 1870[a] | 175 | 34000[c] | 141[e] | 20823[f] | 3754[f] | 45.8 |

[a]Power consumption and area of time-to-digital converter are not included.
[b]Off-chip reference capacitor is employed.
[c]Power consumption and area of SAR control logic are not included.
[d]Area of on-chip reference capacitor is not reported.
[e]Multiple measurement cycles are required to cancel the effect of parasitics/references. FoM is reported for a single cycle only.
[f]Power consumption and area of degital decimation filter are not included.

an inverter-based operational transconductance amplifier, OTA, circuits connected to the first and second sensor capacitors and to the first and second CapDACs and configured to amplify a difference between the input capacitance and the reference capacitance or a scaled or shifted version of the input capacitance and the reference capacitance;

a comparator connected to the inverter-based OTA; and successive approximation register (SAR) logic circuitry connected between the comparator and the first and second CapDACs, and configured to, with the first and second CapDACs, the inverter-based OTA, and the comparator, produce a digital signal representative of the input capacitance.

2. The apparatus of claim 1, wherein the comparator is a latch comparator configured to receive an amplified signal from the inverter-based OTA and output a strengthened signal to the SAR logic circuitry.

3. The apparatus of claim 1, wherein the inverter-based OTA comprises a simple inverter, a current-starved inverter, a cascode inverter, or a fully differential cascode inverter.

4. The apparatus of claim 1, wherein the inverter-based OTA comprises a single ended input single ended output circuit, a differential input single ended output circuit, or a differential input differential output circuit.

5. The apparatus of claim 1, wherein inverter-based OTA comprise a fully differential configuration that is insensitive to common mode noise and common mode errors.

6. The apparatus of claim 1, wherein the inverter-based OTA is selectively enabled to provide constant energy consumption and energy efficiency independent of the sample rate.

7. The apparatus of claim 1, wherein auto-calibration is used by measuring one or more reference capacitors to cancel or reduce conversion errors.

8. The apparatus of claim 1, wherein one or more reference voltages is digitally controlled to increase the capacitance range or improve the absolute resolution.

9. The apparatus of claim 1, wherein each of the first and second CapDACs comprises a coarse-fine design which allows a wide capacitance range and fine absolute resolution.

10. The apparatus of claim 1, wherein at least one unit capacitor of the first and second CapDACs comprises an integrated capacitor.

11. The apparatus of claim 10, wherein the integrated capacitor comprises a poly-insulator poly (PIP) capacitor, a metal-insulator-metal (MIM) capacitor, a dual MIM (DMIM) capacitor, or a metal-oxide-metal (MOM) capacitor.

12. The apparatus of claim 1, further comprising:
a fine conversion stage element configured to
perform capacitance-to-digital conversion; and
generate a residual error between the input capacitance and the reference capacitance.

13. The apparatus of claim 12, wherein the fine conversion stage element comprises a capacitance-to-digital converter.

14. The apparatus of claim 13, wherein the fine conversion stage element comprises an integrating converter or a sigma-delta converter.

15. A method for capacitance-to-digital conversion, the method comprising:
producing, by first and second sensor capacitors, an input capacitance;
producing, by first and second capacitive digital-to-analog converters (CapDACs), a reference capacitance;
amplifying, by an inverter-based operational transconductance amplifier, OTA, connected to the first and second sensor capacitors and to the first and second CapDACs, a difference between the input capacitance and the reference capacitance or a scaled or shifted version of the input capacitance and the reference capacitance;
comparing amplified signals from the inverter-based OTA and outputting a strengthened signal; and
producing, by successive approximation register (SAR) logic circuitry, which is connected between the comparator and the first and second CapDACs, and with the first and second CapDACs, the inverter-based OTA, and the comparator, a digital signal representative of the input capacitance.

16. The method of claim 15,
wherein the inverter-based OTA is a latch comparator.

17. The method of claim 15,
wherein the inverter-based OTA comprises a simple inverter, a current-starved inverter, a cascode inverter, or a fully differential cascode inverter, or
wherein the inverter-based OTA comprises a single ended input single ended output circuit, a differential input single ended output circuit, or a differential input differential output circuit, or
wherein the inverter-based OTA comprises a fully differential configuration that is insensitive to common mode noise and common mode errors, or
wherein the inverter-based OTA is selectively enabled to provide constant energy consumption and energy efficiency independent of the sample rate.

18. The method of claim 15, further comprising using auto-calibration by measuring one or more reference capacitors to cancel or reduce conversion errors.

19. The method of claim 15, further comprising digitally controlling one or more reference voltages to increase the capacitance range or improve the absolute resolution.

20. The method of claim 15, further comprising:
performing, by a fine conversion stage element, capacitance-to-digital conversion; and
generating, by the fine conversion stage element, a residual error between the input capacitance and the reference capacitance.

* * * * *